US012757355B2

(12) United States Patent
Oda et al.

(10) Patent No.: US 12,757,355 B2
(45) Date of Patent: Oct. 6, 2026

(54) MAIN BODY SHEET FOR VAPOR CHAMBER, VAPOR CHAMBER, AND ELECTRONIC APPARATUS

(71) Applicant: DAI NIPPON PRINTING CO., LTD., Tokyo-to (JP)

(72) Inventors: Kazunori Oda, Tokyo-to (JP); Takayuki Ota, Tokyo-to (JP); Shinichiro Takahashi, Tokyo-to (JP); Toshihiko Takeda, Tokyo-to (JP); Kohei Ozawa, Tokyo-to (JP); Hiroshi Koi, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

(21) Appl. No.: 18/277,426

(22) PCT Filed: Feb. 18, 2022

(86) PCT No.: PCT/JP2022/006732
§ 371 (c)(1),
(2) Date: Aug. 16, 2023

(87) PCT Pub. No.: WO2022/176985
PCT Pub. Date: Aug. 25, 2022

(65) Prior Publication Data

US 2024/0130081 A1 Apr. 18, 2024

(30) Foreign Application Priority Data

Feb. 18, 2021 (JP) ................................ 2021-024532
Feb. 18, 2021 (JP) ................................ 2021-024553

(51) Int. Cl.
*F28D 15/02* (2006.01)
*F28D 15/04* (2006.01)
*H05K 7/20* (2006.01)

(52) U.S. Cl.
CPC ..... *H05K 7/20336* (2013.01); *F28D 15/0233* (2013.01); *F28D 15/046* (2013.01)

(58) Field of Classification Search
CPC ............ H05K 7/20336; F28D 15/0233; F28D 15/046
See application file for complete search history.

(56) References Cited

U.S. PATENT DOCUMENTS

2007/0227704 A1 10/2007 Nagai et al.
2010/0065255 A1 3/2010 Liu et al.
(Continued)

FOREIGN PATENT DOCUMENTS

CN 110779370 A 2/2020
JP H10-339591 A 12/1998
(Continued)

OTHER PUBLICATIONS

Mar. 19, 2024 Decision to Grant issued in Japanese Patent Application No. 2023-500945.
(Continued)

*Primary Examiner* — Jianying C Atkisson
*Assistant Examiner* — Khaled Ahmed Ali Al Samiri
(74) *Attorney, Agent, or Firm* — Oliff PLC

(57) ABSTRACT

A vapor chamber includes a main body sheet having a first main body surface and a second main body surface provided on an opposite side to the first main body surface, a space provided on the first main body surface of the main body sheet, a first sheet laminated on the first main body surface of the main body sheet and covering the space, and a retracted portion retracted toward the space beyond an outer periphery of the main body sheet or an outer periphery of the first sheet in a plan view.

23 Claims, 30 Drawing Sheets

(56) References Cited

U.S. PATENT DOCUMENTS

| | | | | |
|---|---|---|---|---|
| 2011/0005724 A1* | 1/2011 | Kasai | B23K 20/02 156/308.2 |
| 2018/0156545 A1* | 6/2018 | Delano | F28D 15/043 |

FOREIGN PATENT DOCUMENTS

| | | | |
|---|---|---|---|
| JP | 2007-266153 | A | 10/2007 |
| JP | 2008-082698 | A | 4/2008 |
| JP | 2009-236362 | A | 10/2009 |
| JP | 2020-003194 | A | 1/2020 |
| WO | 2020/184620 | A1 | 9/2020 |

OTHER PUBLICATIONS

May 10, 2022 International Search Report issued in International Patent Application No. PCT/JP2022/006732.

Aug. 22, 2023 International Preliminary Report on Patentability issued in International Patent Application No. PCT/JP2022/006732.

Sep. 19, 2024 Office Action issued in Korean Patent Application No. 10-2023-7031284.

Oct. 3, 2025 Office Action issued in Japanese Patent Application No. 2024-062943.

* cited by examiner

MAIN BODY SHEET FOR VAPOR CHAMBER, VAPOR CHAMBER, AND ELECTRONIC APPARATUS

TECHNICAL FIELD

The present disclosure relates to a main body sheet for a vapor chamber, a vapor chamber, and an electronic apparatus.

BACKGROUND ART

Devices accompanied by heat generation, such as central processing units (CPUs), light emitting diodes (LED), and power semiconductors, that are used for mobile terminals and the like, including portable terminals and tablet terminals, are cooled by heat dissipation members, such as heat pipes (see, for example, PTL 1). In recent years, for the purpose of providing thinner mobile terminals and the like, low-profile heat dissipation members are also desired, and, therefore, development of vapor chambers that can lead to a further lower profile than heat pipes has been proceeding. A working fluid is filled in a vapor chamber. The vapor chamber cools a device in a manner such that the working fluid absorbs and diffuses the heat of the device.

More specifically, the working fluid in the vapor chamber receives heat from the device at a part proximate to the device (vaporizing portion) to be vaporized into vapor (working vapor). The working vapor diffuses in a direction to move away from the vaporizing portion in a vapor channel to be cooled and condensed into liquid. A liquid channel serving as a capillary structure (wick) is provided in the vapor chamber, and liquid (working liquid) of the working fluid enters the liquid channel through the vapor channel, flows through the liquid channel, and is transported toward the vaporizing portion. Then, the working liquid receives heat at the vaporizing portion again to be vaporized. In this way, the working fluid transfers heat of the device by circulating in the vapor chamber while repeating a phase change, that is, vaporization and condensation, thus enhancing heat dissipation efficiency.

CITATION LIST

Patent Literature

PTL 1: Japanese Unexamined Patent Application Publication No. 2008-082698

SUMMARY OF INVENTION

Technical Problem

Manufactured vapor chambers are placed and stored in a predetermined place. After that, the vapor chambers are taken out from a placement place and conveyed at the time of shipping or attachment to devices.

However, vapor chambers have a low profile, the side of each of the vapor chambers is formed upright, and there is no portion to be held at the time of being conveyed. For this reason, it is sometimes difficult to convey vapor chambers.

In consideration of such a point, it is an object of the present disclosure to provide a main body sheet for a vapor chamber, a vapor chamber, and an electronic apparatus, capable of improving the conveyability of a vapor chamber.

Solution to Problem

A first aspect of the present disclosure provides a vapor chamber in which a working fluid is filled. The vapor chamber includes a main body sheet having a first main body surface and a second main body surface provided on an opposite side to the first main body surface;

a space provided on the first main body surface of the main body sheet;

a first sheet laminated on the first main body surface of the main body sheet and covering the space; and a retracted portion retracted toward the space beyond an outer periphery of the main body sheet or an outer periphery of the first sheet in a plan view.

According to a second aspect of the present disclosure, in the vapor chamber according to the above-described first aspect, the retracted portion may include a first retracted portion provided in the first sheet and retracted toward the space beyond the outer periphery of the main body sheet in a plan view.

According to a third aspect of the present disclosure, in the vapor chamber according to the above-described first aspect, the retracted portion may include a main body sheet retracted portion provided in the main body sheet and retracted toward the space beyond the outer periphery of the first sheet in a plan view.

According to a fourth aspect of the present disclosure, in the vapor chamber according to any one of the above-described first aspect to the above-described third aspect, the first sheet may have a pair of first side edges extending in a first direction and a pair of second side edges extending in a second direction orthogonal to the first direction in a plan view, and the retracted portion may be provided at each of the pair of first side edges and the pair of second side edges.

According to a fifth aspect of the present disclosure, in the vapor chamber according to any one of the above-described first aspect to the above-described third aspect, the first sheet may have a pair of first side edges extending in a first direction and a pair of second side edges extending in a second direction orthogonal to the first direction in a plan view, and at least one of the pair of first side edges may have the retracted portion.

According to a sixth aspect of the present disclosure, in the vapor chamber according to the above-described fifth aspect, the retracted portion may be provided at each of the pair of first side edges.

According to a seventh aspect of the present disclosure, in the vapor chamber according to one of the above-described fifth aspect to the above-described sixth aspect, the retracted portion may be provided at part of the first side edge.

According to an eighth aspect of the present disclosure, in the vapor chamber according to the above-described fifth aspect, the retracted portion may be provided at one of the pair of first side edges and may be provided at one of the pair of second side edges.

According to a ninth aspect of the present disclosure, in the vapor chamber according to any one of the above-described first aspect to the above-described eighth aspect, the retracted portion may be retracted to a position 10 μm or longer and 1000 μm or shorter away from an outer periphery of the main body sheet in a plan view.

According to a tenth aspect of the present disclosure, in the vapor chamber according to any one of the above-described first aspect to the above-described ninth aspect, the retracted portion may be provided at a position 30 μm or longer away from the space in a plan view.

According to an eleventh aspect of the present disclosure, in the vapor chamber according to any one of the above-described first aspect to the above-described tenth aspect, the vapor chamber may further include a second sheet laminated on the second main body surface of the main body sheet, the space may extend through from the first main body surface to the second main body surface, the second sheet may cover the space on the second main body surface, and the retracted portion may include a second retracted portion provided in the second sheet and retracted toward the space beyond the outer periphery of the main body sheet in a plan view.

A twelfth aspect of the present disclosure provides a vapor chamber in which a working fluid is filled. The vapor chamber includes a main body sheet having a first main body surface and a second main body surface provided on an opposite side to the first main body surface;

a space provided on the first main body surface of the main body sheet;

a first sheet laminated on the first main body surface of the main body sheet and covering the space;

a through-hole extending through the main body sheet and the first sheet; and a retracted portion retracted toward an opposite side to the through-hole beyond an inner periphery defining the through-hole of the main body sheet or the through-hole of the first sheet in a plan view.

According to a thirteenth aspect of the present disclosure, in the vapor chamber according to the above-described twelfth aspect, the retracted portion may include a first retracted portion provided in the first sheet and retracted toward an opposite side to the through-hole beyond the inner periphery defining the through-hole of the main body sheet in a plan view.

According to a fourteenth aspect of the present disclosure, in the vapor chamber according to one of the above-described twelfth aspect to the above-described thirteenth aspect, the vapor chamber may further include a second sheet laminated on the second main body surface of the main body sheet, the space may extend through from the first main body surface to the second main body surface, the second sheet may cover the space on the second main body surface, the through-hole may extend through the main body sheet, the first sheet, and the second sheet, and the retracted portion may include a second retracted portion provided in the second sheet and retracted toward an opposite side to the through-hole beyond the inner periphery defining the through-hole of the main body sheet in a plan view.

According to a fifteenth aspect of the present disclosure, in the vapor chamber according to the above-described twelfth aspect, the retracted portion may include a main body sheet retracted portion provided in the main body sheet and retracted toward an opposite side to the through-hole beyond the inner periphery defining the through-hole of the first sheet in a plan view.

A sixteenth aspect of the present disclosure provides an electronic apparatus. The electronic apparatus includes a housing;

a device accommodated in the housing; and the vapor chamber according to any one of the above-described first aspect to the above-described fifteenth aspect, in thermal contact with the device.

A seventeenth aspect of the present disclosure provides a main body sheet for a vapor chamber in which a working fluid is filled. The main body sheet includes a first main body surface;

a second main body surface provided on an opposite side to the first main body surface;

a space provided on the first main body surface;

an outer periphery in a plan view; and a retracted portion retracted toward the space beyond the outer periphery in a sectional view along a thickness direction.

According to an eighteenth aspect of the present disclosure, in the main body sheet for a vapor chamber according to the above-described seventeenth aspect, the retracted portion may have a retracted edge extending from the outer periphery in the sectional view, the outer periphery may be located adjacent to the second main body surface, the retracted edge may extend from the outer periphery to the first main body surface, and the retracted edge may be curved in a concave shape toward the space.

According to a nineteenth aspect of the present disclosure, in the main body sheet for a vapor chamber according to the above-described seventeenth aspect, the retracted portion may have a retracted edge extending from the outer periphery in the sectional view, the outer periphery may be located adjacent to the second main body surface, the retracted edge may extend from the outer periphery to the first main body surface, and the retracted edge may be inclined with respect to the thickness direction.

According to a twentieth aspect of the present disclosure, in the main body sheet for a vapor chamber according to the above-described seventeenth aspect, the retracted portion may have a retracted edge extending from the outer periphery in the sectional view, the outer periphery may be located adjacent to the second main body surface, the retracted edge may extend from the outer periphery to the first main body surface, and the retracted edge may be curved in a convex shape toward an opposite side to the space.

According to a twenty-first aspect of the present disclosure, in the main body sheet for a vapor chamber according to any one of the above-described eighteenth aspect to the above-described twentieth aspect, the retracted edge may be formed so as to approach the space as approaching the first main body surface.

According to a twenty-second aspect of the present disclosure, in the main body sheet for a vapor chamber according to the above-described seventeenth aspect, the retracted portion may have a retracted edge extending from the outer periphery in the sectional view, the outer periphery may be located adjacent to the second main body surface, and the retracted edge may include a first retracted edge extending from the first main body surface toward the second main body surface, a second retracted edge extending from the second main body surface toward the first main body surface, and a step connection edge connecting the first retracted edge with the second retracted edge.

According to a twenty-third aspect of the present disclosure, in the main body sheet for a vapor chamber according to the above-described eighteenth aspect, the retracted edge may extend from the outer periphery through a relay point to the first main body surface, and the retracted edge may be formed so as to approach the space as approaching from the outer periphery to the relay point and may be formed so as to go away from the space as approaching from the relay point to the first main body surface.

According to a twenty-fourth aspect of the present disclosure, in the main body sheet for a vapor chamber according to the above-described seventeenth aspect, the retracted portion may include a first main body surface-side retracted portion provided adjacent to the first main body surface and a second main body surface-side retracted portion provided adjacent to the second main body surface, and the outer periphery may be located between the first main body surface and the second main body surface.

According to a twenty-fifth aspect of the present disclosure, in the main body sheet for a vapor chamber according to the above-described twenty-fourth aspect, the first main body surface-side retracted portion may have a first main body surface-side retracted edge extending from the outer periphery to the first main body surface in the sectional view, the first main body surface-side retracted edge may be curved in a concave shape toward the space so as to approach the space as approaching the first main body surface, the second main body surface-side retracted portion may have a second main body surface-side retracted edge extending from the outer periphery to the second main body surface in the sectional view, and the second main body surface-side retracted edge may be curved in a concave shape toward the space so as to approach the space as approaching the second main body surface.

According to a twenty-sixth aspect of the present disclosure, in the main body sheet for a vapor chamber according to any one of the above-described seventeenth aspect to the above-described twenty-fifth aspect, the outer periphery may have a pair of first side edges extending in a first direction and a pair of second side edges extending in a second direction orthogonal to the first direction in a plan view, and the retracted portion may be retracted from each of the pair of first side edges and the pair of second side edges.

According to a twenty-seventh aspect of the present disclosure, in the main body sheet for a vapor chamber according to any one of the above-described seventeenth aspect to the above-described twenty-fifth aspect, the outer periphery may have a pair of first side edges extending in a first direction and a pair of second side edges extending in a second direction orthogonal to the first direction in a plan view, and the retracted portion may be retracted from at least one of the pair of first side edges.

According to a twenty-eighth aspect of the present disclosure, in the main body sheet for a vapor chamber according to the above-described twenty-seventh aspect, the retracted portion may be retracted from one of the pair of first side edges and is also retracted from one of the pair of second side edges.

According to a twenty-ninth aspect of the present disclosure, in the main body sheet for a vapor chamber according to any one of the above-described twenty-sixth aspect to the above-described twenty-eighth aspect, the retracted portion may be retracted from part of the first side edge.

A thirtieth aspect of the present disclosure provides a vapor chamber. The vapor chamber includes the main body sheet for a vapor chamber according to any one of the above-described seventeenth aspect to the above-described twenty-ninth aspect; and a first sheet laminated on the first main body surface and covering the space.

According to a thirty-first aspect of the present disclosure, in the vapor chamber according to the above-described thirtieth aspect, the vapor chamber may further include a second sheet laminated on the second main body surface, the space may extend through from the first main body surface to the second main body surface, and the second sheet may cover the space on the second main body surface.

A thirty-second aspect of the present disclosure provides an electronic apparatus. The electronic apparatus includes a housing;

a device accommodated in the housing; and the vapor chamber according to one of the above-described twenty-ninth aspect to the above-described thirtieth aspect, in thermal contact with the device.

Advantageous Effects of Invention

According to the present disclosure, it is possible to improve the conveyability of a vapor chamber.

DESCRIPTION OF EMBODIMENTS

Figure 1:
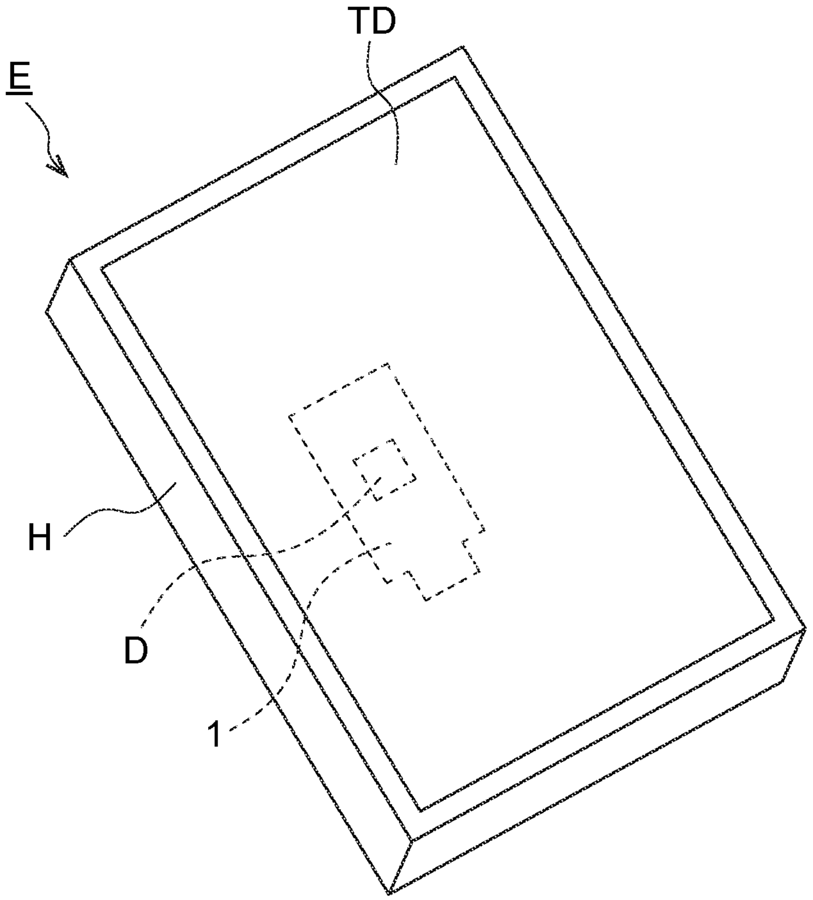
FIG. 1 is a schematic perspective view illustrating an electronic apparatus according to a first embodiment.

Hereinafter, embodiments of the present disclosure will be described with reference to the drawings. In the drawings attached to the present specification, for the sake of easiness of illustration and understanding, the scale, dimensional aspect ratio, and the like are changed or exaggerated as needed from those of real ones.

Terms, such as "parallel", "orthogonal", and "the same", values of length, angle, and physical characteristics, and the like that determine shapes, geometrical conditions, physical characteristics, the degrees of them, used in the specification are not limited to strict meanings and are interpreted by including the range of degrees to which similar functions can be expected. Furthermore, in the drawings, for the sake of clear illustration, the shapes of a plurality of portions from which similar functions can be expected are shown regularly; however, the shapes of the portions may be different from each other without limitations to strict meanings within the range in which the functions can be expected. In the drawings, boundary lines each representing a joint surface or the like between members are indicated merely by straight lines for the sake of convenience; however, the boundary lines are not limited to strict straight lines, and the shapes of the boundary lines can be selected within the range in which desired joint performance can be expected. A boundary line can be lost as a result of joining members.

First Embodiment

A vapor chamber and an electronic apparatus according to a first embodiment will be described with reference to FIG. 1 to FIG. 8. A vapor chamber 1 according to the present embodiment is a device mounted on an electronic apparatus E to cool a device D (a device to be cooled) serving as a heating element accommodated in the electronic apparatus E. Examples of the electronic apparatus E include mobile terminals, such as portable terminals and tablet terminals. Examples of the device D include electronic devices accompanied by heat generation, such as central processing units (CPUs), light emitting diodes (LEDs), and power semiconductors.

Here, initially, the electronic apparatus E on which the vapor chamber 1 according to the present embodiment is mounted will be described by taking a tablet terminal as an example. As shown in FIG. 1, the electronic apparatus E (tablet terminal) includes a housing H, the device D accommodated in the housing H, and the vapor chamber 1. In the electronic apparatus E shown in FIG. 1, a touch panel display TD is provided on the front face of the housing H. The vapor chamber 1 is accommodated in the housing H and is disposed in thermal contact with the device D. With this configuration, the vapor chamber 1 can receive heat that is generated in the device D during use of the electronic apparatus E. The heat received by the vapor chamber 1 is released to outside the vapor chamber 1 via working fluids 2*a*, 2*b* (described later). In this way, the device D is effectively cooled. When the electronic apparatus E is a tablet terminal, the device D corresponds to a central processing unit or the like.

Figure 2:
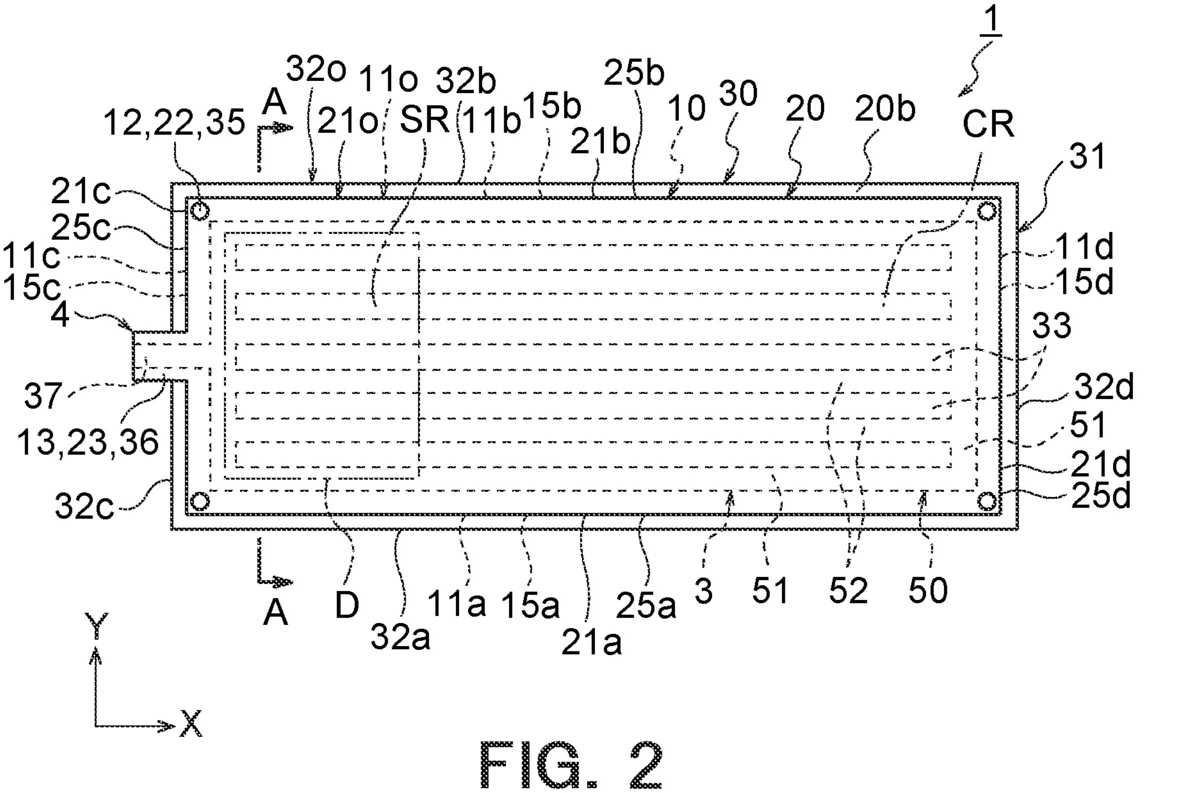
FIG. 2 is a top view showing a vapor chamber according to the first embodiment.
Figure 3:
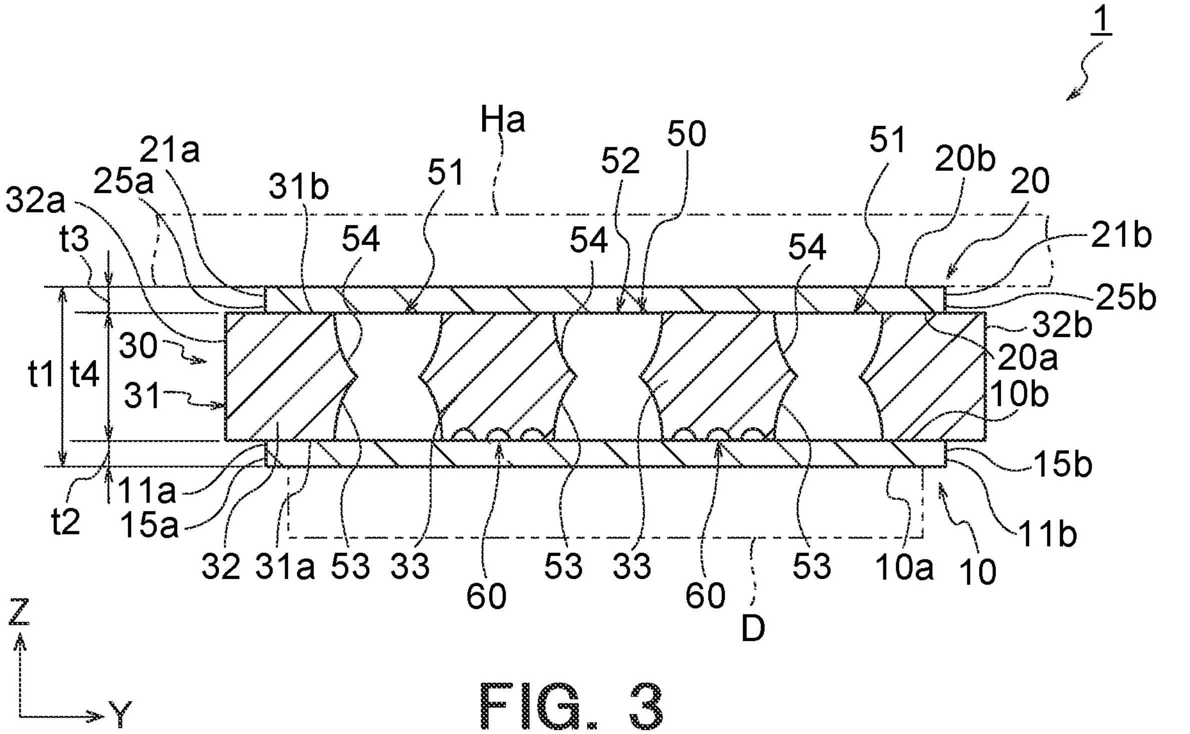
FIG. 3 is a sectional view taken along the line A-A in FIG. 2.

Next, the vapor chamber 1 according to the present embodiment will be described. As shown in FIG. 2 and FIG. 3, the vapor chamber 1 has a sealed space 3 in which the working fluids 2*a*, 2*b* are filled. As the working fluids 2*a*, 2*b* in the sealed space 3 repeat a phase change, the device D of the above-described electronic apparatus E is cooled. Examples of the working fluids 2*a*, 2*b* include pure water, ethanol, methanol, acetone, and mixed solutions of some of them.

As shown in FIG. 2 and FIG. 3, the vapor chamber 1 includes a lower sheet 10 (first sheet), an upper sheet 20 (second sheet), and a vapor chamber wick sheet 30 (main body sheet) interposed between the lower sheet 10 and the upper sheet 20. In the present embodiment, the vapor chamber 1 includes one wick sheet 30. In the vapor chamber 1 according to the present embodiment, the lower sheet 10, the wick sheet 30, and the upper sheet 20 are laminated in this order and joined.

The vapor chamber 1 is schematically formed in a thin sheet shape. The planar shape of the vapor chamber 1 is selectable and may be a rectangular shape as shown in FIG. 2. The planar shape of the vapor chamber 1 may be, for example, a rectangular shape with one side having a length of 1 cm and the other side having a length of 3 cm or may be a square shape with one side having a length of 15 cm. The plane dimensions of the vapor chamber 1 is selectable. In the present embodiment, in an example, an example in which the planar shape of the vapor chamber 1 is a rectangular shape having an X direction as a longitudinal direction will be described. The planar shape of the vapor chamber 1 is not limited to a rectangular shape and may be a selected shape, such as a circular shape, an elliptical shape, an L-shape, and a T-shape.

As shown in FIG. 2, the vapor chamber 1 has a vaporization region SR where the working fluids 2*a*, 2*b* vaporize and a condensation region CR where the working fluids 2*a*, 2*b* condense.

The vaporization region SR is a region that overlaps the device D in a plan view and is a region in which the device D is attached. The vaporization region SR may be disposed in a selected place of the vapor chamber 1. In the present embodiment, the vaporization region SR is formed on one side (left side in FIG. 2) of the vapor chamber 1 in the X direction. Heat from the device D is transferred to the vaporization region SR, and liquid (referred to as working liquid 2*b* as needed) of the working fluid vaporizes in the vaporization region SR due to the heat. Heat from the device D can be transferred not only to the region that overlaps the device D in a plan view but also to around the region. For this reason, the vaporization region SR includes a region that overlaps the device D and a region therearound in a plan view. Here, the plan view corresponds to a state viewed in a direction orthogonal to a surface that the vapor chamber 1 receives heat from the device D (a first lower sheet surface 10*a* (described later) of the lower sheet 10) and a surface that the vapor chamber 1 releases heat received (a second upper sheet surface 20*b* (described later) of the upper sheet 20) and a state when the vapor chamber 1 is viewed from above or a state when the vapor chamber 1 is viewed from below, for example, as shown in FIG. 2.

The condensation region CR is a region that does not overlap the device D in a plan view and is a region where vapor of working fluid (referred to as working vapor 2*a* as needed) mainly releases heat to condense. The condensation region CR may also be referred to as a region around the vaporization region SR. In the present embodiment, the condensation region CR is formed on the other side (right side in FIG. 2) of the vapor chamber 1 in the X direction. Heat from the working vapor 2*a* is released to the upper sheet 20 in the condensation region CR, and the working vapor 2*a* is cooled in the condensation region CR to condense.

When the vapor chamber 1 is installed in a mobile terminal, an upper and lower relation can be lost depending on the attitude of the mobile terminal. However, in the present embodiment, for the sake of convenience, a sheet that receives heat from the device D is referred to as the above-described lower sheet 10, and a sheet that releases the received heat is referred to as the above-described upper sheet 20. Therefore, the description will be made in a state where the lower sheet 10 is disposed on the lower side and the upper sheet 20 is disposed on the upper side.

Initially, the lower sheet 10 will be described.

As shown in FIG. 3, the lower sheet 10 has the first lower sheet surface 10*a* provided on an opposite side to the wick sheet 30 and a second lower sheet surface 10*b* provided on an opposite side to the first lower sheet surface 10*a* (that is, adjacent to the wick sheet 30). The lower sheet 10 may be formed entirely in a flat shape and may entirely have a constant thickness. The above-described device D is attached to the first lower sheet surface 10*a*.

Figure 4:
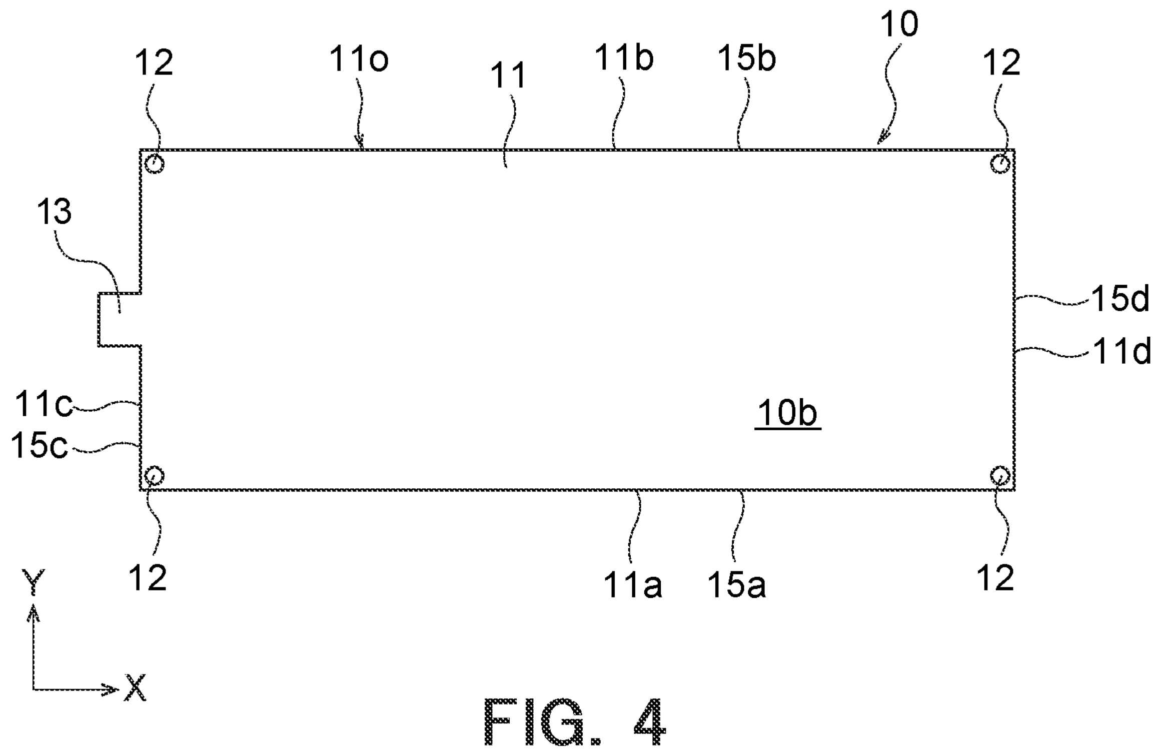
FIG. 4 is a top view of a lower sheet of FIG. 3.

As shown in FIG. 4, the planar shape of the lower sheet 10 may be entirely a rectangular shape. More specifically, the lower sheet 10 may have a pair of long side edges 11*a*, 11*b* (first side edges) extending in the X direction (first direction) and a pair of short side edges 11*c*, 11*d* (second side edges) extending in a Y direction (second direction) orthogonal to the X direction in a plan view. The long side edges 11*a*, 11*b* are respectively provided on both sides in the Y direction. The long side edge 11*a* is provided on one side (lower side in FIG. 4) in the Y direction, and the long side edge 11*b* is provided on the other side (upper side in FIG. 4) in the Y direction. The short side edges 11*c*, 11*d* are respectively provided on both sides in the X direction. The short side edge 11*c* is provided on one side (left side in FIG. 4) in the X direction, and the short side edge 11*d* is provided on the other side (right side in FIG. 4) in the X direction. As will be described later, the lower sheet 10 is formed so as to be entirely smaller than the wick sheet 30 in a plan view. Therefore, lower sheet retracted portions 15*a*, 15*b*, 15*c*, 15*d* (first retracted portions) (described later) are provided at an outer periphery 11*o* of the lower sheet 10, that is, provided respectively at the pair of long side edges 11*a*, 11*b* and the pair of short side edges 11*c*, 11*d*.

As shown in FIG. 4, the lower sheet 10 may have a rectangular lower sheet main body 11 and a lower sheet filling protrusion 13 protruding outward from the lower sheet main body 11. In the example shown in FIG. 4, the lower sheet filling protrusion 13 is provided at the short side edge 11*c* and protrudes from the short side edge 11*c* toward one side (left side in FIG. 4) in the X direction.

As shown in FIG. 4, alignment holes 12 may be respectively provided at four corners of the lower sheet main body 11*f* the lower sheet 10. In the example shown in FIG. 4, the planar shape of each alignment hole 12 is a circular shape; however, the planar shape is not limited thereto. The alignment holes 12 may extend through the lower sheet main body 11.

Next, the upper sheet 20 will be described.

As shown in FIG. 3, the upper sheet 20 has a first upper sheet surface 20*a* provided adjacent to the wick sheet 30 and the second upper sheet surface 20*b* provided on an opposite side to the first upper sheet surface 20*a*. The upper sheet 20 may be formed entirely in a flat shape and may entirely have a constant thickness. A housing member Ha that is part of the housing H of the mobile terminal or the like is attached to the second upper sheet surface 20*b*. The whole of the second upper sheet surface 20*b* may be covered with the housing member Ha.

Figure 5:
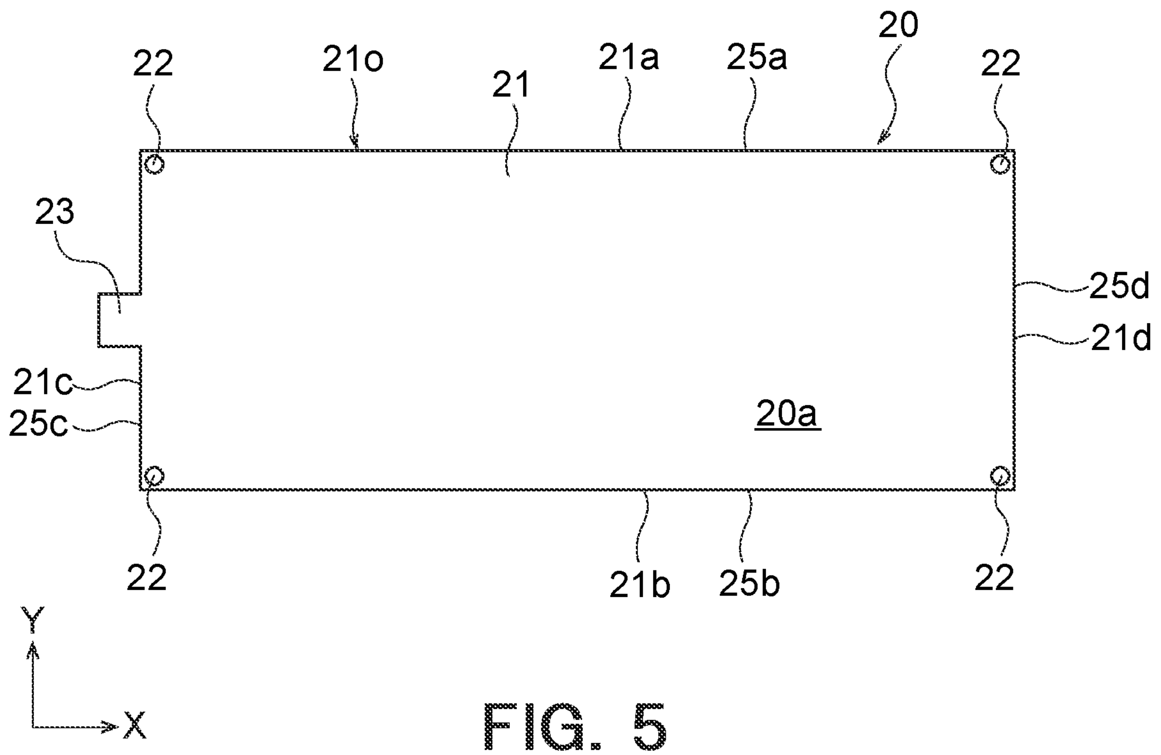
FIG. 5 is a bottom view of an upper sheet of FIG. 3.

As shown in FIG. 5, the planar shape of the upper sheet 20 may be entirely a rectangular shape. More specifically, the upper sheet 20 may have a pair of long side edges 21*a*, 21*b* extending in the X direction and a pair of short side edges 21*c*, 21*d* extending in the Y direction in a plan view. The long side edges 21*a*, 21*b* are respectively provided on both sides in the Y direction. The long side edge 21*a* is provided on one side (lower side in FIG. 5) in the Y direction, and the long side edge 21*b* is provided on the other side (upper side in FIG. 5) in the Y direction. The short side edges 21*c*, 21*d* are respectively provided on both sides in the X direction. The short side edge 21*c* is provided on one side (left side in FIG. 5) in the X direction, and the short side edge 21*d* is provided on the other side (right side in FIG. 5) in the X direction. As will be described later, the upper sheet 20 is formed so as to be entirely smaller than the wick sheet 30 in a plan view. Therefore, upper sheet retracted portions 25*a*, 25*b*, 25*c*, 25*d* (second retracted portions) (described later) are provided at an outer periphery 21*o* of the upper sheet 20, that is, provided respectively at the pair of long side edges 21*a*, 21*b* and the pair of short side edges 21*c*, 21*d*.

As shown in FIG. 5, the upper sheet 20 may have a rectangular upper sheet main body 21 and an upper sheet filling protrusion 23 protruding outward from the upper sheet main body 21. In the example shown in FIG. 5, the upper sheet filling protrusion 23 is provided at the short side edge 21*c* and protrudes from the short side edge 21*c* toward one side (left side in FIG. 5) in the X direction.

As shown in FIG. 5, alignment holes 22 may be respectively provided at four corners of the upper sheet main body 21 of the upper sheet 20. In the example shown in FIG. 5, the planar shape of each alignment hole 22 is a circular shape; however, the planar shape is not limited thereto. The alignment holes 12 may extend through the upper sheet main body 21.

Next, the wick sheet 30 will be described.

As shown in FIG. 3, the wick sheet 30 includes a sheet main body 31 and a vapor channel 50 (space) provided in the sheet main body 31. The sheet main body 31 has a first main body surface 31*a* and a second main body surface 31*b* provided on an opposite side to the first main body surface 31*a*. The first main body surface 31*a* is disposed adjacent to the lower sheet 10, and the second main body surface 31*b* is disposed adjacent to the upper sheet 20.

The second lower sheet surface 10*b* of the lower sheet 10 and the first main body surface 31*a* of the sheet main body 31 may be permanently joined with each other by thermocompression bonding. Similarly, the first upper sheet surface 20*a* of the upper sheet 20 and the second main body surface 31*b* of the sheet main body 31 may be permanently joined with each other by thermocompression bonding. Examples of joining by thermocompression bonding may include diffusion joining. However, the lower sheet 10, the upper sheet 20, and the wick sheet 30 may be joined not by diffusion joining but by another method, such as brazing, as long as they can be permanently joined. The term "permanently joined" is not limited to a strict meaning and is used as a term meaning that a joint of the lower sheet 10 with the wick sheet 30 can be maintained and a joint of the upper sheet 20 with the wick sheet 30 can be maintained to such an extent that the sealability of the sealed space 3 can be maintained during operation of the vapor chamber 1.

Figure 6:
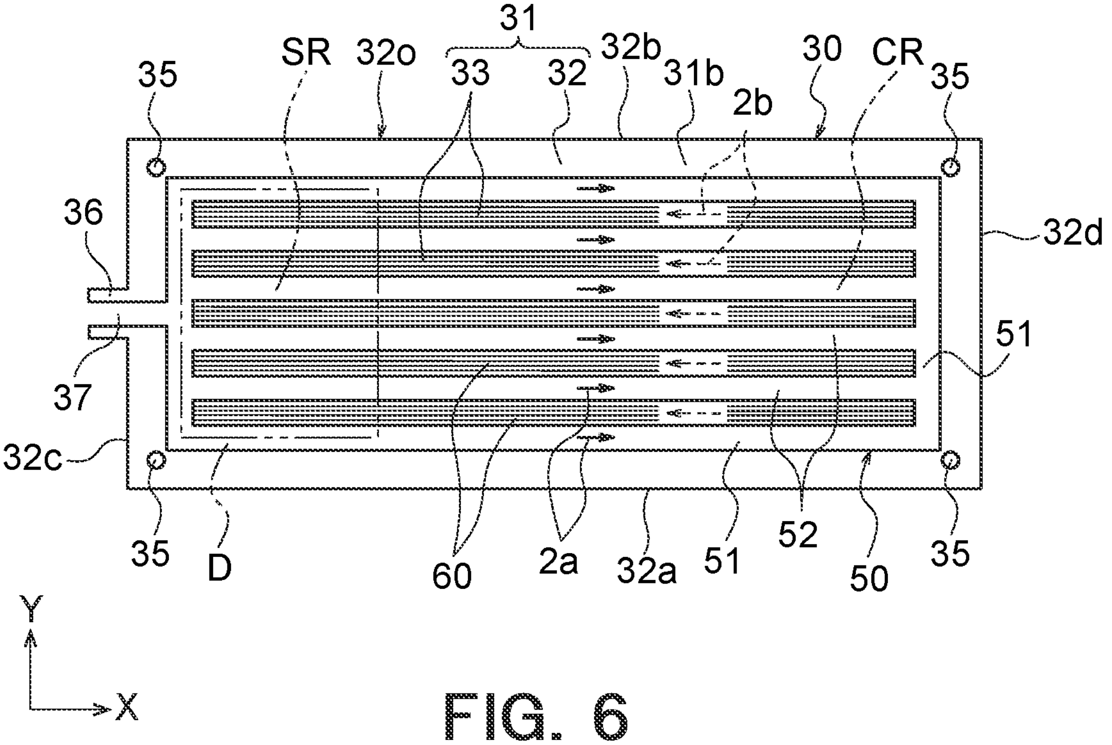
FIG. 6 is a top view of a wick sheet of FIG. 3.

As shown in FIG. 6, the outline shape of the wick sheet 30 may be entirely a rectangular shape in a plan view. More specifically, the wick sheet 30 may have a pair of long side edges 32*a*, 32*b* extending in the X direction and a pair of short side edges 32*c*, 32*d* extending in the Y direction in a plan view. The long side edges 32*a*, 32*b* are respectively provided on both sides in the Y direction. The long side edge 32*a* is provided on one side (lower side in FIG. 6) in the Y direction, and the long side edge 32*b* is provided on the other side (upper side in FIG. 6) in the Y direction. The short side edges 32*c*, 32*d* are respectively provided on both sides in the X direction. The short side edge 32*c* is provided on one side (left side in FIG. 6) in the X direction, and the short side edge 32*d* is provided on the other side (right side in FIG. 6) in the X direction.

As shown in FIG. 6, the wick sheet 30 may have a wick sheet filling protrusion 36 protruding outward from a frame 32. In the example shown in FIG. 6, the wick sheet filling protrusion 36 is provided at the short side edge 32*c* and protrudes from the short side edge 32*c* toward one side (left side in FIG. 6) in the X direction.

As shown in FIG. 6, alignment holes 35 may be respectively provided at four corners of the sheet main body 31 of the wick sheet 30. In the example shown in FIG. 6, the planar shape of each alignment hole 35 is a circular shape; however, the planar shape is not limited thereto. The alignment holes 35 may extend through the sheet main body 31.

As shown in FIG. 3 and FIG. 6, the sheet main body 31 of the wick sheet 30 according to the present embodiment has the frame 32 formed in a rectangular frame shape in a plan view and a plurality of lands 33 provided inside the frame 32. The frame 32 and the lands 33 are portions where the material of the wick sheet 30 is left without being etched in an etching process (described later).

In the present embodiment, the frame 32 is formed in a rectangular frame shape in a plan view. The vapor channel 50 (space) is provided inside the frame 32. The lands 33 are provided in the vapor channel 50, and the working vapor 2*a* flows around each of the lands 33. In other words, the vapor channel 50 includes the above-described plurality of lands 33 and vapor passages 51, 52 (described later) that are provided around each of the lands 33 and that are passages through which the working vapor 2*a* flows.

In the present embodiment, each of the lands 33 may extend in a long slender shape in the X direction (right and left direction in FIG. 6) as a longitudinal direction in a plan view, and the planar shape of each of the lands 33 may be a long slender rectangular shape. The lands 33 may be disposed parallel to one another at equal intervals in the Y direction (up and down direction in FIG. 6) orthogonal to the X direction. The width w1 (see FIG. 7) of the land 33 may, for example, range from 100 μm to 1500 μm. Here, the width w1 of the land 33 is the dimension of the land 33 in the Y direction and means a dimension at a position where a through portion 34 (described later) is present in a Z direction. Here, the Z direction corresponds to the up and down direction in FIG. 3 and FIG. 7 and corresponds to the thickness direction of the wick sheet 30.

The frame 32 and the lands 33 are joined to the lower sheet 10 by thermocompression bonding and are joined to the upper sheet 20 by thermocompression bonding. Wall surfaces 53*a* of lower vapor channel recesses 53 and wall surfaces 54*a* of upper vapor channel recesses 54 (described later) are components of side walls of the lands 33. The first main body surface 31*a* and the second main body surface 31*b* of the sheet main body 31 may be formed in a flat shape over the frame 32 and the lands 33.

Figure 7:
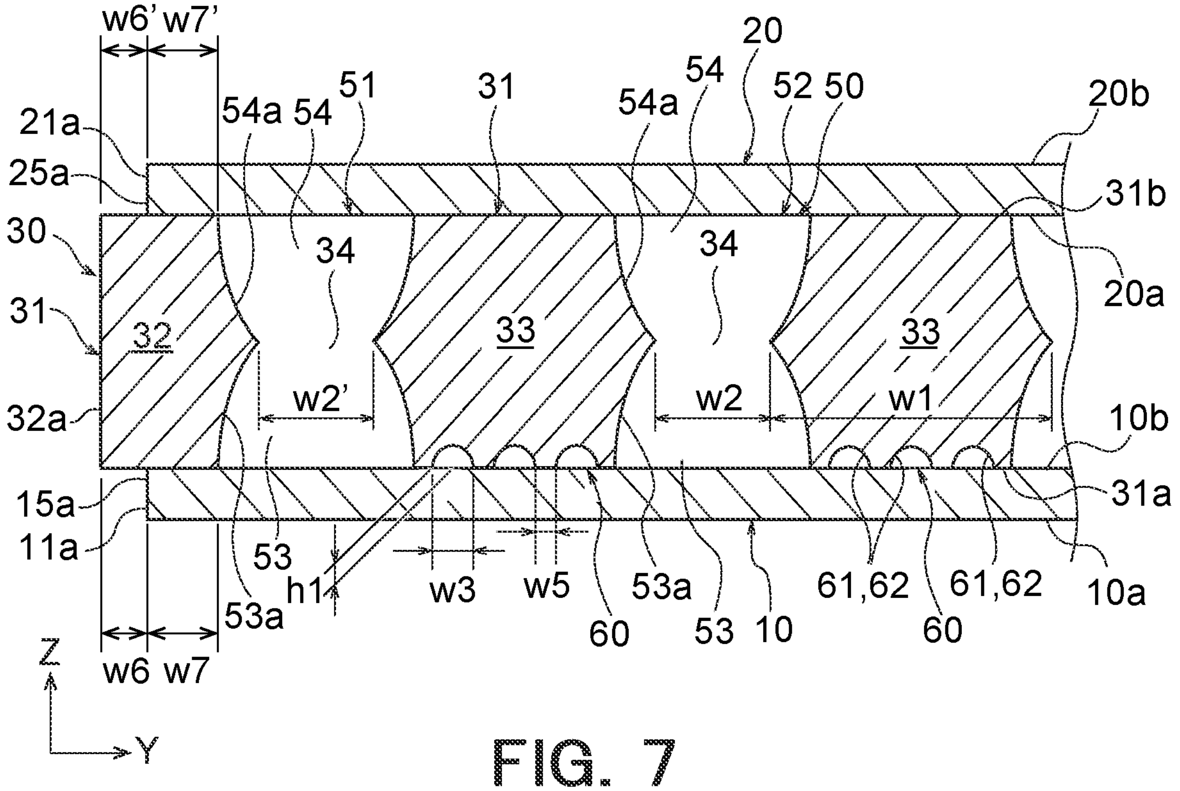
FIG. 7 is a partially enlarged sectional view of FIG. 3.

The vapor channel 50 is mainly a channel through which the working vapor 2*a* passes. The working liquid 2*b* may also pass through the vapor channel 50. As shown in FIG. 3 and FIG. 7, the vapor channel 50 may extend through from the first main body surface 31*a* to the second main body surface 31*b*. In other words, the vapor channel 50 may extend through the sheet main body 31 of the wick sheet 30. The vapor channel 50 may be covered with the lower sheet 10 on the first main body surface 31*a* and may be covered with the upper sheet 20 on the second main body surface 31*b*.

As shown in FIG. 6, the vapor channel 50 according to the present embodiment has a first vapor passage 51 and a plurality of second vapor passages 52. The first vapor passage 51 is formed between the frame 32 and the lands 33. The first vapor passage 51 is formed continuously inside the frame 32 and outside the lands 33. The planar shape of the first vapor passage 51 is a rectangular frame shape. Each of the second vapor passages 52 is formed between any adjacent two of the lands 33. The planar shape of each second vapor passage 52 is a long slender rectangular shape. The vapor channel 50 is partitioned by the plurality of lands 33 into the first vapor passage 51 and the plurality of second vapor passages 52.

As shown in FIG. 3, the first vapor passage 51 and the second vapor passages 52 extend through from the first main body surface 31*a* to the second main body surface 31*b* of the sheet main body 31. In other words, the first vapor passage 51 and the second vapor passages 52 extend through the wick sheet 30 in the Z direction. Each of the first vapor passage 51 and the second vapor passages 52 is made up of the lower vapor channel recess 53 provided on the first main body surface 31*a* and the upper vapor channel recess 54 provided on the second main body surface 31*b*. The lower vapor channel recess 53 and the upper vapor channel recess 54 communicate with each other, so each of the first vapor passage 51 and the second vapor passages 52 of the vapor channel 50 is formed so as to extend from the first main body surface 31*a* to the second main body surface 31*b*.

The lower vapor channel recesses 53 are formed in a concave shape on the first main body surface 31*a* by etching from the first main body surface 31*a* of the wick sheet 30 in the etching process (described later). As a result, each lower vapor channel recess 53 has the wall surface 53*a* formed in a curved shape as shown in FIG. 7. The wall surface 53*a* defines the lower vapor channel recess 53 and is, in a cross section shown in FIG. 7, curved so as to approach the facing wall surface 53*a* as approaching toward the second main body surface 31*b*. The thus configured lower vapor channel recesses 53 are part (lower half) of the first vapor passage 51 and parts (lower halves) of the second vapor passages 52.

The upper vapor channel recesses 54 are formed in a concave shape on the second main body surface 31*b* by etching from the second main body surface 31*b* of the wick sheet 30 in the etching process (described later). As a result, each upper vapor channel recess 54 has the wall surface 54*a* formed in a curved shape as shown in FIG. 7. The wall surface 54*a* defines the upper vapor channel recess 54 and is, in a cross section shown in FIG. 7, curved so as to approach the facing wall surface 54*a* as approaching toward the first main body surface 31*a*. The thus configured upper vapor channel recesses 54 are part (upper half) of the first vapor passage 51 and parts (upper halves) of the second vapor passages 52.

As shown in FIG. 7, the wall surface 53*a* of the lower vapor channel recess 53 and the wall surface 54*a* of the upper vapor channel recess 54 are connected to be continuous to form the through portion 34. The wall surface 53*a* and the wall surface 54*a* both are curved toward the through portion 34. As a result, the lower vapor channel recess 53 and the upper vapor channel recess 54 communicate with each other. In the present embodiment, the planar shape of the through portion 34 in the first vapor passage 51 is a rectangular frame shape as in the case of the first vapor passage 51, and the planar shape of the through portion 34 in the second vapor passage 52 is a long slender rectangular shape as in the case of the second vapor passage 52. The through portion 34 may be defined by ridge lines formed such that the wall surface 53*a* of the lower vapor channel recess 53 and the wall surface 54*a* of the upper vapor channel recess 54 merge with each other and project inward. A plane area of the vapor channel 50 is minimum at the through portion 34. The width w2 and width w2' (see FIG. 7) of the thus configured through portions 34 may, for example, range from 400 μm to 1600 μm. Here, the width w2 of the through portion 34 corresponds to a gap between the adjacent lands 33 in the Y direction. The width w2' of the through portion 34 corresponds to a gap between the frame 32 and the land 33 in the Y direction (or the X direction).

The position of the through portion 34 in the Z direction may be an intermediate position between the first main body surface 31*a* and the second main body surface 31*b* or may be a position shifted downward or upward from the intermediate position. As long as the lower vapor channel recess 53 and the upper vapor channel recess 54 communicate with each other, the position of the through portion 34 is selectable.

In the present embodiment, the sectional shape of each of the first vapor passage 51 and the second vapor passages 52 is formed so as to include the through portion 34 defined by ridge lines formed to extend inward; however, the configuration is not limited thereto. For example, the sectional shape of the first vapor passage 51 and the sectional shape of each second vapor passage 52 may be a trapezoidal shape or a rectangular shape or may be a barrel shape.

The vapor channel 50 including the first vapor passage 51 and the second vapor passages 52 configured in this way is part of the above-described sealed space 3. Each of the vapor passages 51, 52 has a relatively large channel cross-sectional area such that the working vapor 2*a* passes.

Here, FIG. 3 shows the first vapor passage 51, the second vapor passages 52, and the like in a magnified view for clear illustration, and the numbers and layout of these vapor passages 51, 52, and the like differ from those in FIG. 2 or FIG. 6.

Incidentally, although not shown in the drawings, a plurality of supporting portions that support the lands 33 on the frame 32 may be provided in the vapor channel 50. Supporting portions that each support adjacent two of the lands 33 may be provided. These supporting portions may be provided on both sides of the land 33 in the X direction or may be provided on both sides of the land 33 in the Y direction. The supporting portion may be formed so as not to impede flow of the working vapor 2*a* that diffuses in the vapor channel 50. For example, a supporting portion may be disposed on one of the first main body surface 31*a* and the second main body surface 31*b* of the sheet main body 31 of the wick sheet 30, and a space that forms a vapor channel recess may be formed on the other side. As a result, the thickness of the supporting portion can be made less than the thickness of the sheet main body 31, so it is possible to suppress separation of each of the first vapor passage 51 and the second vapor passages 52 in the X direction or in the Y direction.

As shown in FIG. 3, FIG. 6, and FIG. 7, a liquid channel 60 (groove) through which the working liquid 2*b* mainly passes is provided on the first main body surface 31*a* of the sheet main body 31 of the wick sheet 30. More specifically, the liquid channel 60 is provided on the first main body surface 31*a* of each of the lands 33 of the wick sheet 30. The working vapor 2*a* may also pass through the liquid channel 60. The liquid channel 60 is part of the above-described sealed space 3 and communicates with the vapor channel 50. The liquid channel 60 is configured as a capillary structure (wick) for transporting the working liquid 2*b* to the vaporization region SR. The liquid channel 60 may be formed over the entire first main body surface 31*a* of each land 33. The liquid channel 60 does not need to be provided on the second main body surface 31*b* of each land 33.

Figure 8:
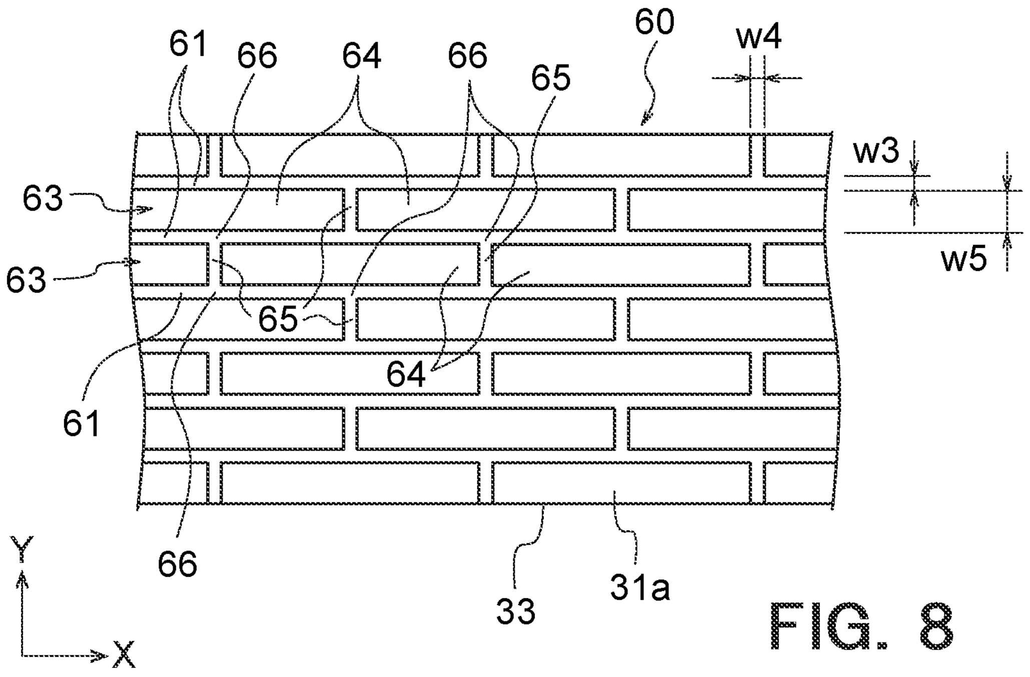
FIG. 8 is a partially enlarged bottom view of a liquid channel shown in FIG. 7.

As shown in FIG. 8, the liquid channel 60 is made up of a plurality of grooves provided on the first main body surface 31*a*. More specifically, the liquid channel 60 has a plurality of liquid channel main stream grooves 61 through which the working liquid 2*b* passes and a plurality of liquid channel communication grooves 65 that communicate with the liquid channel main stream grooves 61.

As shown in FIG. 8, each liquid channel main stream groove 61 is formed so as to extend in the X direction. The liquid channel main stream groove 61 has a channel cross-sectional area smaller than that of the first vapor passage 51 or the second vapor passage 52 of the vapor channel 50 such that the working liquid 2*b* mainly flows by capillary action. As a result, the liquid channel main stream groove 61 is configured to transport the working liquid 2*b* condensed from the working vapor 2*a* to the vaporization region SR. The liquid channel main stream grooves 61 may be disposed at equal intervals in the Y direction.

The liquid channel main stream grooves 61 are formed by etching from the first main body surface 31*a* of the sheet main body 31 of the wick sheet 30 in the etching process (described later). As a result, each liquid channel main stream groove 61 has a wall surface 62 formed in a curved shape as shown in FIG. 7. The wall surface 62 defines the liquid channel main stream groove 61 and is curved in a concave shape toward the second main body surface 31*b*.

The width w3 (a dimension in the Y direction) of the liquid channel main stream groove 61 shown in FIG. 7 and FIG. 8 may, for example, range from 5 μm to 150 μm. The width w3 of the liquid channel main stream groove 61 means a dimension at the first main body surface 31*a*. The depth h1 (a dimension in the Z direction) of the liquid channel main stream groove 61 shown in FIG. 7 may, for example, range from 3 μm to 150 μm.

As shown in FIG. 8, the liquid channel communication grooves 65 extend in a direction different from the X direction. In the present embodiment, the liquid channel communication grooves 65 are formed so as to extend in the Y direction and are formed perpendicularly to the liquid channel main stream grooves 61. Some of the liquid channel communication grooves 65 each are disposed so as to communicate adjacent two of the liquid channel main stream grooves 61. The other liquid channel communication grooves 65 each are disposed so as to communicate the vapor channel 50 (the first vapor passage 51 or the second vapor passage 52) with the liquid channel main stream groove 61. In other words, the liquid channel communication groove 65 extends from an end edge of the land 33 in the Y direction to the liquid channel main stream groove 61 adjacent to the end edge. In this way, the first vapor passage 51 or the second vapor passage 52 of the vapor channel 50 communicates with the liquid channel main stream groove 61.

The liquid channel communication groove 65 has a channel cross-sectional area smaller than that of the first vapor passage 51 or the second vapor passage 52 of the vapor channel 50 such that the working liquid 2*b* mainly flows by capillary action. The liquid channel communication grooves 65 may be disposed at equal intervals in the X direction.

Each of the liquid channel communication grooves 65, as well as the liquid channel main stream grooves 61, is formed by etching and has a wall surface (not shown) formed in a curved shape similar to that of the liquid channel main stream groove 61. The width w4 (a dimension in the X direction) of the liquid channel communication groove 65 shown in FIG. 8 may be equal to the width w3 of the liquid channel main stream groove 61, may be greater than the width w3, or may be less than the width w3. The depth of the liquid channel communication groove 65 may be equal to the depth h1 of the liquid channel main stream groove 61, may be greater than the depth h1, or may be less than the depth h1.

As shown in FIG. 8, the liquid channel 60 has liquid channel protrusion arrays 63 provided on the first main body surface 31*a* of the sheet main body 31. Each of the liquid channel protrusion arrays 63 is provided between adjacent two of the liquid channel main stream grooves 61. Each liquid channel protrusion array 63 includes a plurality of liquid channel protrusions 64 arranged in the X direction. The liquid channel protrusions 64 are provided in the liquid channel 60 and are in contact with the second lower sheet surface 10*b* of the lower sheet 10. Each liquid channel protrusion 64 is formed in a rectangular shape such that the X direction is a longitudinal direction in a plan view. The liquid channel main stream groove 61 is interposed between any adjacent two of the liquid channel protrusions 64 in the Y direction, and the liquid channel communication groove 65 is interposed between any adjacent two of the liquid channel protrusions 64 in the X direction. The liquid channel communication grooves 65 are formed so as to extend in the Y direction and each communicate adjacent two of the liquid channel main stream grooves 61 in the Y direction. As a result, the working liquid 2*b* is allowed to move among these liquid channel main stream grooves 61.

The liquid channel protrusions 64 are portions where the material of the wick sheet 30 is left without being etched in the etching process (described later). In the present embodiment, as shown in FIG. 8, the planar shape of each liquid channel protrusion 64 (the shape at the position of the first main body surface 31*a* of the sheet main body 31 of the wick sheet 30) is a rectangular shape.

In the present embodiment, the liquid channel protrusions 64 are disposed in a staggered manner. More specifically, the liquid channel protrusions 64 of adjacent two of the liquid channel protrusion arrays 63 in the Y direction are disposed so as to be shifted from each other in the X direction. The shift amount may be half the array pitch of the liquid channel protrusions 64 in the X direction. The width w5 (a dimension in the Y direction) of the liquid channel protrusion 64 shown in FIG. 8 may, for example, range from 5 μm to 500 μm. The width w5 of the liquid channel protrusion 64 means a dimension at the first main body surface 31*a*. The arrangement of the liquid channel protrusions 64 is not limited to the staggered manner and may be a parallel array. In this case, the liquid channel protrusions 64 of adjacent two of the liquid channel protrusion arrays 63 in the Y direction are aligned in the X direction.

The liquid channel main stream groove 61 includes liquid channel intersections 66 that communicate with the liquid channel communication grooves 65. At each liquid channel intersection 66, the liquid channel main stream groove 61 and the liquid channel communication groove 65 communicate with each other in a T-shape. As a result, at the liquid channel intersection 66 at which one liquid channel main stream groove 61 communicates with the liquid channel communication groove 65 on one side (for example, the upper side in FIG. 8), communication of the liquid channel communication groove 65 on the other side (for example, the lower side in FIG. 8) with the liquid channel main stream groove 61 can be avoided. As a result, at the liquid channel intersection 66, cutting out the wall surface 62 of the liquid channel main stream groove 61 on both sides (the upper side and the lower side in FIG. 8) is suppressed, so one side of the wall surface 62 can be left. Therefore, even at the liquid channel intersection 66, it is possible to impart capillary action to the working liquid in the liquid channel main stream groove 61, so it is possible to suppress a decrease in the propelling force of the working liquid 2*b* toward the vaporization region SR at the liquid channel intersection 66.

As shown in FIG. 2, the vapor chamber 1 may further include a filling portion 4 at one-side (left-side in FIG. 2) side edge in the X direction. The filling portion 4 is used to fill the working liquid 2*b* into the sealed space 3. In the example shown in FIG. 2, the filling portion 4 is disposed adjacent to the vaporization region SR and protrudes outward from the side edge adjacent to the vaporization region SR.

The filling portion 4 is configured such that the lower sheet filling protrusion 13 (see FIG. 4) of the lower sheet 10, the upper sheet filling protrusion 23 (see FIG. 5) of the upper sheet 20, and the wick sheet filling protrusion 36 (see FIG. 6) of the wick sheet 30 overlap one another. In the illustrated example, the lower surface (first main body surface 31*a*) of the wick sheet filling protrusion 36 and the upper surface (second lower sheet surface 10*b*) of the lower sheet filling protrusion 13 overlap each other, and the upper surface (second main body surface 31*b*) of the wick sheet filling protrusion 36 and the lower surface (first upper sheet surface 20*a*) of the upper sheet filling protrusion 23 overlap each other. Of these, a filling channel 37 may be formed in the wick sheet filling protrusion 36. The filling channel 37 may extend through from the first main body surface 31*a* of the sheet main body 31 to the second main body surface 31*b*. In other words, the filling channel 37 may extend through the sheet main body 31 (the wick sheet filling protrusion 36) in the Z direction. The filling channel 37 may communicate with the first vapor passage 51, and the working liquid 2*b* may be filled into the first vapor passage 51 through the filling channel 37. Depending on the arrangement of the liquid channel 60, the filling channel 37 may communicate with the liquid channel 60. The upper surface and the lower surface of the wick sheet filling protrusion 36 may be formed in a flat shape, and the upper surface of the lower sheet filling protrusion 13 and the lower surface of the upper sheet filling protrusion 23 may also be formed in a flat shape. The planar shapes of the filling protrusions 13, 23, 36 may be the same.

In the present embodiment, an example in which the filling portion 4 is provided at one-side side edge of a pair of side edges of the vapor chamber 1 in the X direction is described; however, the configuration is not limited thereto. The filling portion 4 may be provided at a selected position. The filling channel 37 provided in the wick sheet filling protrusion 36 does not need to extend through the sheet main body 31 as long as the filling channel 37 can fill the working liquid 2*b*. In this case, the filling channel 37 that communicates with the vapor channel 50 may be formed by etching from only one of the first main body surface 31*a* and the second main body surface 31*b* of the sheet main body 31. The filling portion 4 may be cut and removed after the working liquid 2*b* is filled during manufacturing of the vapor chamber 1.

Incidentally, in the present embodiment, as described above, the lower sheet 10 is formed so as to be entirely smaller than the wick sheet 30 in a plan view. Therefore, as shown in FIG. 2, FIG. 3, and FIG. 7, the outer periphery 11*o* of the lower sheet 10 is located inside the outer periphery 32*o* of the wick sheet 30, that is, located adjacent to the vapor channel 50. Thus, the lower sheet 10 has lower sheet retracted portions 15*a*, 15*b*, 15*c*, 15*d* retracted toward the vapor channel 50 beyond the outer periphery 32*o* of the wick sheet 30 in a plan view.

More specifically, the long side edge 11*a* of the lower sheet 10 is located adjacent to the vapor channel 50 beyond the long side edge 32*a* of the wick sheet 30, and the lower sheet retracted portion 15*a* is formed at the long side edge 11*a* of the lower sheet 10. The long side edge 11*b* of the lower sheet 10 is located adjacent to the vapor channel 50 beyond the long side edge 32*b* of the wick sheet 30, and the lower sheet retracted portion 15*b* is formed at the long side edge 11*b* of the lower sheet 10. The short side edge 11*c* of the lower sheet 10 is located adjacent to the vapor channel 50 beyond the short side edge 32*c* of the wick sheet 30, and the lower sheet retracted portion 15*c* is formed at the short side edge 11*c* of the lower sheet 10. The short side edge 11*d* of the lower sheet 10 is located adjacent to the vapor channel 50 beyond the short side edge 32*d* of the wick sheet 30, and the lower sheet retracted portion 15*d* is formed at the short side edge 11*d* of the lower sheet 10. In this way, the lower sheet retracted portions 15*a*, 15*b*, 15*c*, 15*d* are formed all around the outer periphery 11*o* of the lower sheet 10 except a portion where the lower sheet filling protrusion 13 is provided.

As described above, the planar shape of the vapor chamber 1 is not limited to a rectangular shape and may be a selected shape, such as a circular shape, an elliptical shape, an L-shape, and a T-shape. In this case, the lower sheet retracted portions 15*a*, 15*b*, 15*c*, 15*d* may be formed all around the outer periphery 11*o* of the lower sheet 10 or may be formed at selected positions in the outer periphery 11*o* of the lower sheet 10.

The dimension w6 in the Y direction between the long side edge 11*a* of the lower sheet 10 and the long side edge 32*a* of the wick sheet 30, shown in FIG. 7, may, for example, range from 10 μm to 1000 μm. The same applies to the dimension in the Y direction between the long side edge 11*b* of the lower sheet 10 and the long side edge 32*b* of the wick sheet 30, the dimension in the X direction between the short side edge 11*c* of the lower sheet 10 and the short side edge 32*c* of the wick sheet 30, and the dimension in the X direction between the short side edge 11*d* of the lower sheet 10 and the short side edge 32*d* of the wick sheet 30. In other words, each of the lower sheet retracted portions 15*a*, 15*b*, 15*c*, 15*d* may be retracted to a position 10 μm or longer and 1000 μm or shorter away from the outer periphery 32*o* of the wick sheet 30 in a plan view.

The dimension w7 in the Y direction between the long side edge 11*a* of the lower sheet 10 and the vapor channel 50 (first vapor passage 51), shown in FIG. 7, may, for example, range from 30 μm to 3000 μm. Here, the dimension w7 means a dimension at the first main body surface 31*a*. The same applies to the dimension in the Y direction between the long side edge 11*b* of the lower sheet 10 and the vapor channel 50, the dimension in the X direction between the short side edge 11*c* of the lower sheet 10 and the vapor channel 50, and the dimension in the X direction between the short side edge 11*d* of the lower sheet 10 and the vapor channel 50. In other words, each of the lower sheet retracted portions 15*a*, 15*b*, 15*c*, 15*d* may be provided at a position 30 μm or longer and 3000 μm or shorter away from the vapor channel 50 (first vapor passage 51).

In the present embodiment, as described above, the upper sheet 20 is formed so as to be entirely smaller than the wick sheet 30 in a plan view. Therefore, as shown in FIG. 2, FIG. 3, and FIG. 7, the outer periphery 21*o* of the upper sheet 20 is located inside the outer periphery 32*o* of the wick sheet 30, that is, located adjacent to the vapor channel 50. Thus, the upper sheet 20 has upper sheet retracted portions 25*a*, 25*b*, 25*c*, 25*d* retracted toward the vapor channel 50 beyond the outer periphery 32*o* of the wick sheet 30 in a plan view. The upper sheet 20 may have the same size as the lower sheet 10, may be larger than the lower sheet 10, or may be smaller than the lower sheet 10 in a plan view.

More specifically, the long side edge 21*a* of the upper sheet 20 is located adjacent to the vapor channel 50 beyond the long side edge 32*a* of the wick sheet 30, and the upper sheet retracted portion 25*a* is formed at the long side edge 21*a* of the upper sheet 20. The long side edge 21*b* of the upper sheet 20 is located adjacent to the vapor channel 50 beyond the long side edge 32*b* of the wick sheet 30, and the upper sheet retracted portion 25*b* is formed at the long side edge 21*b* of the upper sheet 20. The short side edge 21*c* of the upper sheet 20 is located adjacent to the vapor channel 50 beyond the short side edge 32*c* of the wick sheet 30, and the upper sheet retracted portion 25*c* is formed at the short side edge 21*c* of the upper sheet 20. The short side edge 21*d* of the upper sheet 20 is located adjacent to the vapor channel 50 beyond the short side edge 32*d* of the wick sheet 30, and the upper sheet retracted portion 25*d* is formed at the short side edge 21*d* of the upper sheet 20. In this way, the upper sheet retracted portions 25*a*, 25*b*, 25*c*, 25*d* are formed all around the outer periphery 21*o* of the upper sheet 20 except a portion where the upper sheet filling protrusion 23 is provided.

As described above, the planar shape of the vapor chamber 1 is not limited to a rectangular shape and may be a selected shape, such as a circular shape, an elliptical shape, an L-shape, and a T-shape. In this case, the upper sheet retracted portions 25*a*, 25*b*, 25*c*, 25*d* may be formed all around the outer periphery 21*o* of the upper sheet 20 or may be formed at selected positions in the outer periphery 21*o* of the upper sheet 20.

The dimension w6' in the Y direction between the long side edge 21*a* of the upper sheet 20 and the long side edge 32*a* of the wick sheet 30, shown in FIG. 7, may, for example, range from 10 μm to 1000 μm. The same applies to the dimension in the Y direction between the long side edge 21*b* of the upper sheet 20 and the long side edge 32*b* of the wick sheet 30, the dimension in the X direction between the short side edge 21*c* of the upper sheet 20 and the short side edge 32*c* of the wick sheet 30, and the dimension in the X direction between the short side edge 21*d* of the upper sheet 20 and the short side edge 32*d* of the wick sheet 30. In other words, each of the upper sheet retracted portions 25*a*, 25*b*, 25*c*, 25*d* may be retracted to a position 10 μm or longer and 1000 am or shorter away from the outer periphery 32*o* of the wick sheet 30 in a plan view. The dimension w6' may be equal to the above-described dimension w6, may be greater than the above-described dimension w6, or may be less than the above-described dimension w6.

The dimension w7' in the Y direction between the long side edge 21*a* of the upper sheet 20 and the vapor channel 50 (first vapor passage 51), shown in FIG. 7, may, for example, range from 30 μm to 3000 μm. Here, the dimension w7' means a dimension at the second main body surface 31*b*. The same applies to the dimension in the Y direction between the long side edge 21*b* of the upper sheet 20 and the vapor channel 50, the dimension in the X direction between the short side edge 21*c* of the upper sheet 20 and the vapor channel 50, and the dimension in the X direction between the short side edge 21*d* of the upper sheet 20 and the vapor channel 50. In other words, each of the upper sheet retracted portions 25*a*, 25*b*, 25*c*, 25*d* may be provided at a position 30 μm or longer and 3000 μm or shorter away from the vapor channel 50 (first vapor passage 51). The dimension w7' may be equal to the above-described dimension w7, may be greater than the above-described dimension w7, or may be less than the above-described dimension w7.

Incidentally, the material of the lower sheet 10, the upper sheet 20, and the wick sheet 30 is not limited as long as the material has a good thermal conductivity. The lower sheet 10, the upper sheet 20, and the wick sheet 30 may contain, for example, copper or a copper alloy. In this case, it is possible to enhance the thermal conductivity of each of the sheets 10, 20, 30, and it is possible to enhance the heat dissipation efficiency of the vapor chamber 1.

Particularly, the wick sheet 30 may be made of a material having a lower strength than the material of the lower sheet 10 or the material of the upper sheet 20. In other words, the lower sheet 10 and the upper sheet 20 may be made of a material having a higher strength than the material of the wick sheet 30. The wick sheet 30 may be made of, for example, pure copper (or oxygen-free copper, C1020, or the like) or a copper alloy (for example, phosphor bronze). The lower sheet 10 and the upper sheet 20 may be made of, for example, a copper alloy when the wick sheet 30 is made of pure copper. The lower sheet 10 and the upper sheet 20 may be made of the same material or may be made of different materials.

The thickness t1 of the vapor chamber 1 shown in FIG. 3 may, for example, range from 100 μm to 1000 μm. When the thickness t1 of the vapor chamber 1 is greater than or equal to 100 μm, it is possible to appropriately ensure the vapor channel 50, so it is possible to cause the vapor chamber 1 to appropriately function. On the other hand, when the thickness t1 of the vapor chamber 1 is less than or equal to 1000 μm, it is possible to suppress an increase in the thickness t1 of the vapor chamber 1.

The thickness t2 of the lower sheet 10 shown in FIG. 3 may, for example, range from 6 μm to 100 μm. When the thickness t2 of the lower sheet 10 is greater than or equal to 6 μm, it is possible to ensure the mechanical strength of the lower sheet 10. On the other hand, when the thickness t2 of the lower sheet 10 is less than or equal to 100 μm, it is possible to suppress an increase in the thickness t1 of the vapor chamber 1. Similarly, the thickness t3 of the upper sheet 20 shown in FIG. 3 may be set as in the case of the thickness t2 of the lower sheet 10. The thickness t3 of the upper sheet 20 and the thickness t2 of the lower sheet 10 may be different from each other.

The thickness t4 of the wick sheet 30 shown in FIG. 3 may, for example, range from 50 μm to 400 μm. When the thickness t4 of the wick sheet 30 is greater than or equal to 50 μm, it is possible to appropriately ensure the vapor channel 50, so it is possible to appropriately operate the vapor chamber 1. On the other hand, when the thickness t4 of the wick sheet 30 is less than or equal to 400 μm, it is possible to suppress an increase in the thickness t1 of the vapor chamber 1.

Next, a manufacturing method for the thus configured vapor chamber 1 will be described with reference to FIG. 9 to FIG. 12.

Here, initially, a sheet preparation process of preparing the sheets 10, 20, 30 will be described. The sheet preparation process includes a lower sheet preparation process of preparing the lower sheet 10, an upper sheet preparation process of preparing the upper sheet 20, and a wick sheet preparation process of preparing the wick sheet 30.

In the lower sheet preparation process, initially, a lower sheet base material having a desired thickness is prepared. The lower sheet base material may be a rolled material. Subsequently, the lower sheet 10 having a desired planar shape is formed by etching the lower sheet base material. Alternatively, the lower sheet 10 having a desired planar shape may be formed by press working of the lower sheet base material. In this way, the lower sheet 10 having an outline shape as shown in FIG. 4 can be prepared. In other words, the lower sheet 10 having the above-described outer periphery 11*o* can be obtained.

In the upper sheet preparation process as well, as in the case of the lower sheet preparation process, initially, an upper sheet base material having a desired thickness is prepared. The upper sheet base material may be a rolled material. Subsequently, the upper sheet 20 having a desired planar shape is formed by etching the upper sheet base material. Alternatively, the upper sheet 20 having a desired planar shape may be formed by press working of the upper sheet base material. In this way, the upper sheet 20 having an outline shape as shown in FIG. 5 can be prepared. In other words, the upper sheet 20 having the above-described outer periphery 21*o* can be obtained.

The wick sheet preparation process includes a material sheet preparation process of preparing a metal material sheet M and an etching process of etching the metal material sheet M.

Figure 9:
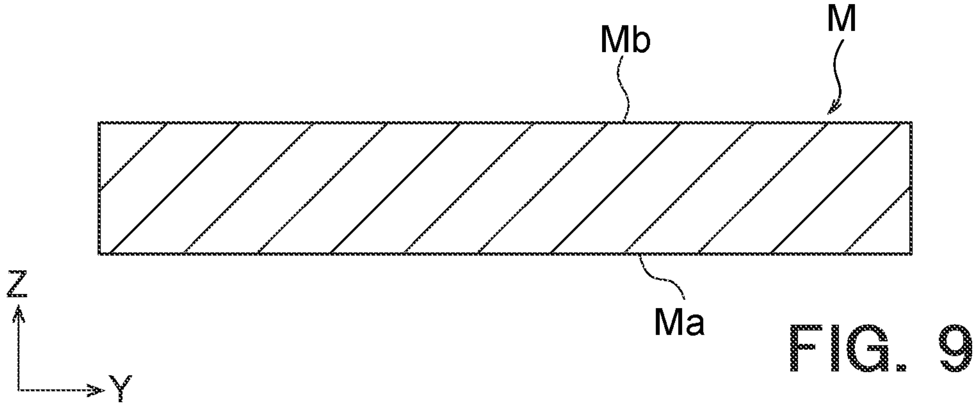
FIG. 9 is a view for illustrating a material sheet preparation process in a manufacturing method for a vapor chamber according to the first embodiment.

Initially, in the material sheet preparation process, as shown in FIG. 9, a sheet-shaped metal material sheet M including a first material surface Ma and a second material surface Mb is prepared. The metal material sheet M may be formed from a rolled material having a desired thickness.

Figure 10:
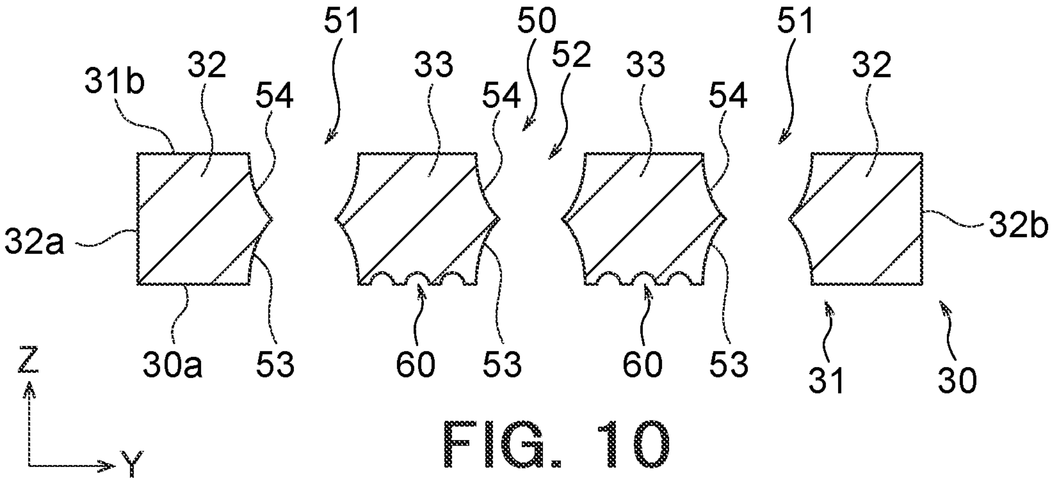
FIG. 10 is a view for illustrating an etching process in the manufacturing method for a vapor chamber according to the first embodiment.

After that, in the etching process, as shown in FIG. 10, the vapor channel 50 and the liquid channel 60 are formed by etching the metal material sheet M from the first material surface Ma and the second material surface Mb.

More specifically, a patterned resist film (not shown) is formed on the first material surface Ma and the second material surface Mb of the metal material sheet M by photolithography. Subsequently, the first material surface Ma and the second material surface Mb of the metal material sheet M are etched through the openings of the patterned resist film. As a result, the first material surface Ma and the second material surface Mb of the metal material sheet M are etched into a patterned shape, and the vapor channel 50 and the liquid channel 60 as shown in FIG. 10 are formed. For example, an iron chloride etchant, such as aqueous ferric chloride, or a copper chloride etchant, such as aqueous copper chloride, may be used as an etchant.

The first material surface Ma and the second material surface Mb of the metal material sheet M may be etched at the same time. However, not limited to this configuration, etching of the first material surface Ma and etching of the second material surface Mb may be performed in different processes. The vapor channel 50 and the liquid channel 60 may be formed by etching at the same time or may be formed in different processes.

In the etching process, a predetermined outline shape as shown in FIG. 6 can be obtained by etching the first material surface Ma and the second material surface Mb of the metal material sheet M. In other words, the wick sheet 30 having the above-described outer periphery 32*o* can be obtained.

In this way, the lower sheet 10, the upper sheet 20, and the wick sheet 30 according to the present embodiment are obtained.

Figure 11:
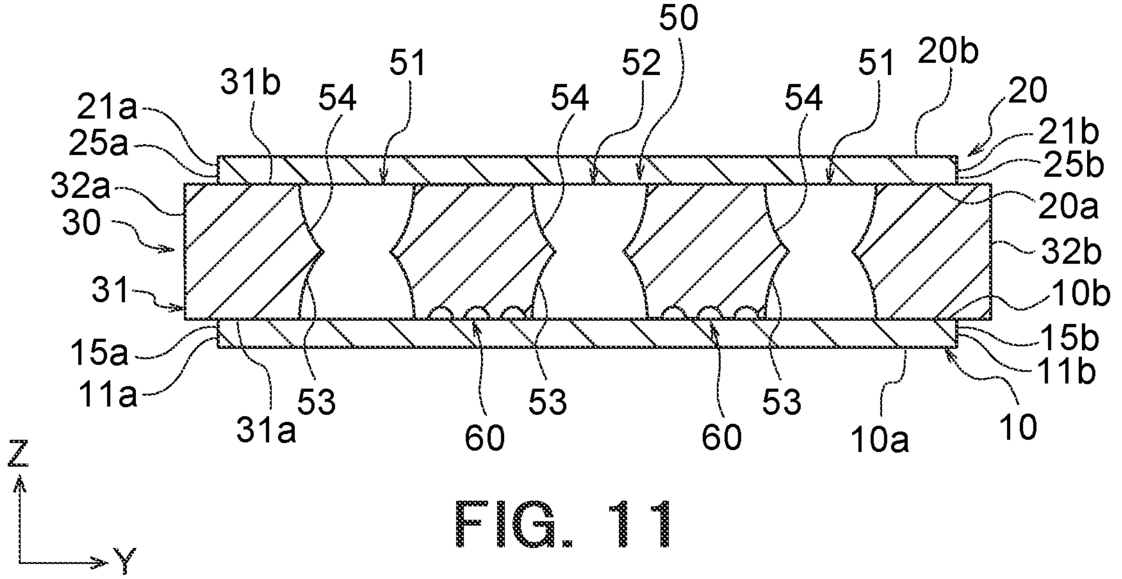
FIG. 11 is a view for illustrating a joining process in the manufacturing method for a vapor chamber according to the first embodiment.

After the preparation process, the lower sheet 10, the upper sheet 20, and the wick sheet 30 are joined together as shown in FIG. 11 in a joining process.

More specifically, initially, the lower sheet 10, the wick sheet 30, and the upper sheet 20 are laminated in this order. In this case, the first main body surface 31*a* of the wick sheet 30 is superimposed on the second lower sheet surface 10*b* of the lower sheet 10, and the first upper sheet surface 20*a* of the upper sheet 20 is superimposed on the second main body surface 31*b* of the wick sheet 30. At this time, the sheets 10, 20, 30 may be aligned by using the alignment holes 12 of the lower sheet 10, the alignment holes 35 of the wick sheet 30, and the alignment holes 22 of the upper sheet 20.

Subsequently, the lower sheet 10, the wick sheet 30, and the upper sheet 20 are temporarily joined. For example, these sheets 10, 20, 30 may be temporarily joined by spot resistance welding, or these sheets 10, 20, 30 may be temporarily joined by laser welding.

After that, the lower sheet 10, the wick sheet 30, and the upper sheet 20 are permanently joined by thermocompression bonding. For example, these sheets 10, 20, 30 may be permanently joined by diffusion joining. Diffusion joining is a method of joining by pressurizing and heating in a laminated direction to use diffusion of atoms that occurs on a joint surface in a controlled atmosphere, such as vacuum and inert gas, while bringing the lower sheet 10 and the wick sheet 30 to be joined into close contact and bringing the wick sheet 30 and the upper sheet 20 into close contact. Diffusion joining heats the materials of the sheets 10, 20, 30 to a temperature close to a melting point but lower than the melting point, so it is possible to avoid melting and deformation of each of the sheets 10, 20, 30. Thus, the first main body surface 31*a* at each of the frame 32 and the lands 33 of the wick sheet 30 is diffusion-joined with the second lower sheet surface 10*b* of the lower sheet 10. The second main body surface 31*b* at each of the frame 32 and the lands

33 of the wick sheet 30 is diffusion-joined with the first upper sheet surface 20*a* of the upper sheet 20. In this way, the sheets 10, 20, 30 are diffusion-joined, and the sealed space 3 having the vapor channel 50 and the liquid channel 60 is formed between the lower sheet 10 and the upper sheet 20. At this stage, the above-described filling channel 37 is not sealed, and the sealed space 3 communicates with an outside via the filling channel 37.

After the joining process, the working liquid 2*b* is filled into the sealed space 3 through the filling channel 37 of the filling portion 4 in a filling process.

After the filling process, the filling channel 37 is sealed in a sealing process. For example, the filling channel 37 may be sealed by partially melting the filling portion 4. As a result, communication between the sealed space 3 and the outside is interrupted, and the sealed space 3 is hermetically sealed. Therefore, the sealed space 3 in which the working liquid 2*b* is filled is obtained, so leakage of the working liquid 2*b* in the sealed space 3 to the outside is suppressed. After the filling channel 37 is sealed, the filling portion 4 may be removed. The whole of the filling portion 4 may be removed. Alternatively, part of the filling portion 4 may be removed, and the remaining part may be left.

In this way, the vapor chamber 1 according to the present embodiment is obtained.

Figure 12:
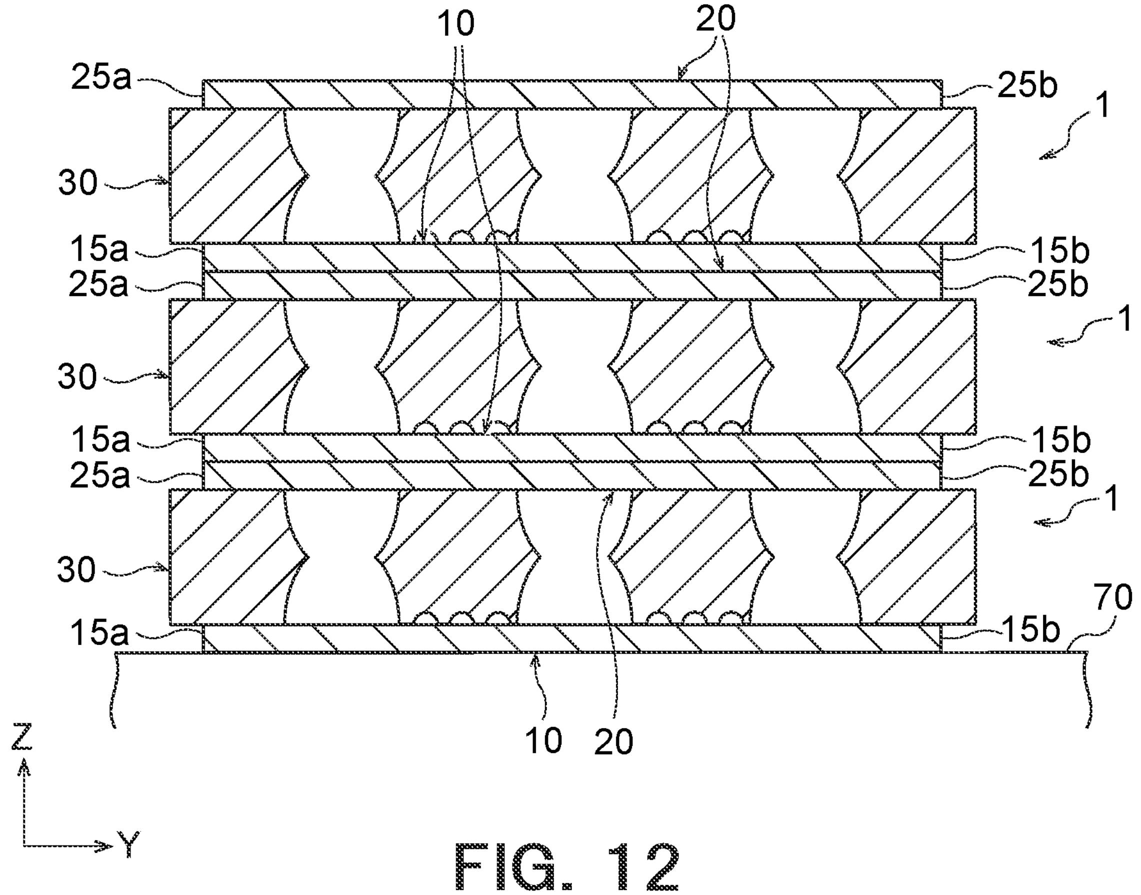
FIG. 12 is a view showing a state where the vapor chambers manufactured by the manufacturing method for a vapor chamber according to the first embodiment are stacked and placed on top of each other.

In this way, the vapor chamber 1 according to the present embodiment can be sequentially manufactured. The manufactured vapor chambers 1 can be placed and stored so as to be stacked on a placement surface 70 provided in a predetermined place as shown in FIG. 12. After that, the vapor chambers 1 are taken out from the placement place and conveyed at the time of shipping or attachment to the device D.

Next, a conveying method for the vapor chambers 1 manufactured in this way will be described with reference to FIG. 13 and FIG. 14. Here, a method of taking out the vapor chamber 1 from a state where the vapor chambers 1 are stacked on top of each other and placed as shown in FIG. 12 and conveyed will be described.

Figure 13:
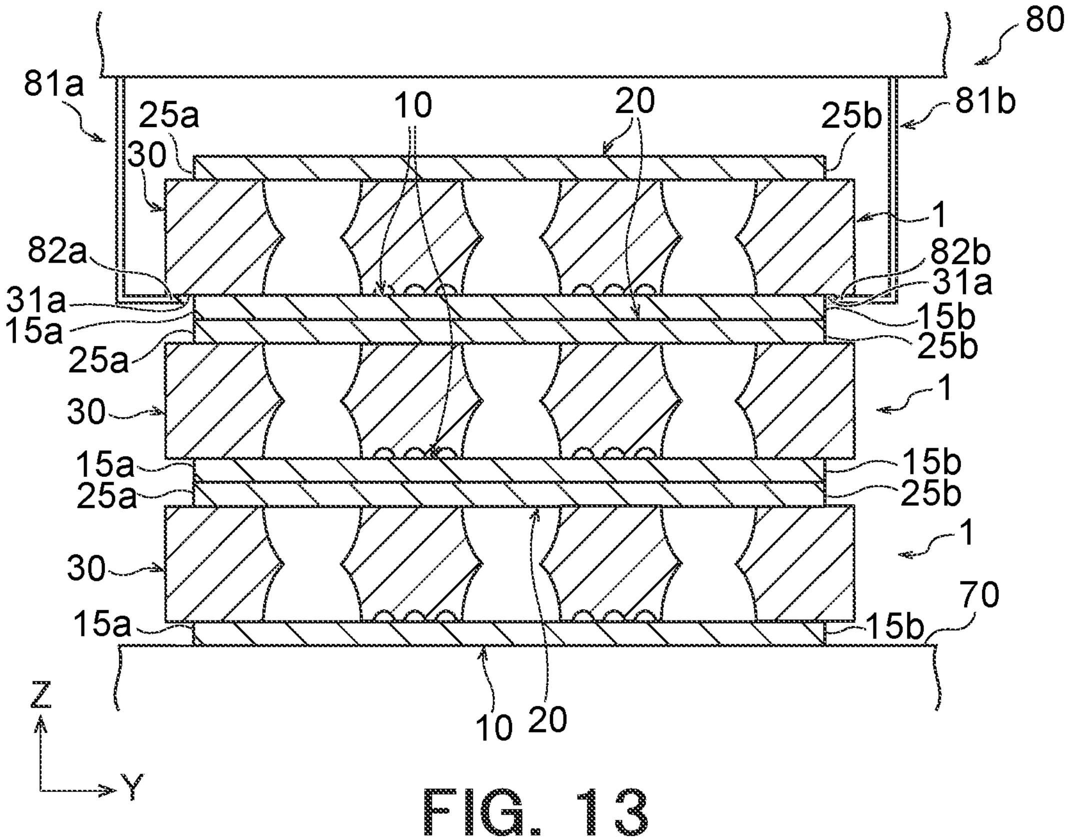
FIG. 13 is a view for illustrating a conveying method for the vapor chambers of FIG. 12 and is a view showing a state where hooks of a suspending apparatus are put into lower sheet retracted portions.

Initially, as shown in FIG. 13, a hook 82*a* of a first arm 81*a* and a hook 82*b* of a second arm 81*b* of a suspending apparatus 80 are respectively put into the lower sheet retracted portions 15*a*, 15*b* of the lower sheet 10.

More specifically, initially, the first arm 81*a* is moved in the vertical direction to position the first hook 82*a* provided at the distal end of the first arm 81*a* to the same position as a position in the Z direction of the lower sheet retracted portion 15*a* of the vapor chamber 1 placed at the top. The second arm 81*b* is moved in the vertical direction to position the second hook 82*b* provided at the distal end of the second arm 81*b* to the same position as a position in the Z direction of the lower sheet retracted portion 15*b* of the vapor chamber 1. Subsequently, the first arm 81*a* is moved in a horizontal direction to put the first hook 82*a* into the lower sheet retracted portion 15*a*. Similarly, the second arm 81*b* is moved in a horizontal direction to put the second hook 82*b* into the lower sheet retracted portion 15*b*. Thus, the first hook 82*a* and the second hook 82*b* each can be brought into contact with the first main body surface 31*a* of the wick sheet 30.

Figure 14:
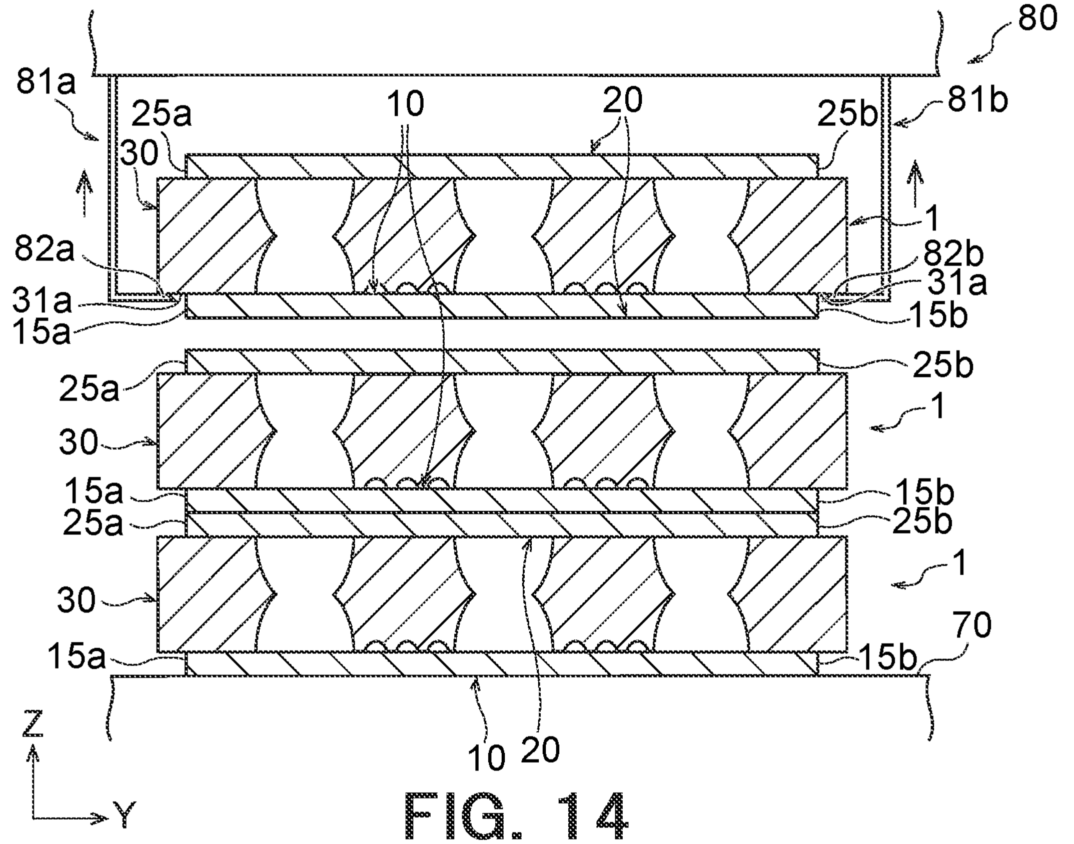
FIG. 14 is a view for illustrating the conveying method for the vapor chambers of FIG. 12 and is a view showing a state where the vapor chamber is suspended by the suspending apparatus.

After that, as shown in FIG. 14, the vapor chamber 1 is suspended by the suspending apparatus 80.

More specifically, in a state where the first hook 82*a* and the second hook 82*b* are in contact with the first main body surface 31*a* of the wick sheet 30, the first arm 81*a* and the second arm 81*b* each are moved upward. Thus, the first main body surface 31*a* of the wick sheet 30 is supported by the first hook 82*a* and the second hook 82*b*, and the vapor chamber 1 is suspended by the suspending apparatus 80.

Then, in a state where the vapor chamber 1 is suspended by the suspending apparatus 80, the first arm 81*a* and the second arm 81*b* are moved in the horizontal direction to convey the vapor chamber 1 to a desired target position.

In this way, the vapor chamber 1 according to the present embodiment can be conveyed by the suspending apparatus 80.

Here, a method of taking out the vapor chamber 1 from a state where the vapor chambers 1 are stacked on top of each other and placed and conveyed will be described. However, not limited to this configuration, even when the vapor chamber 1 is directly mounted on the placement surface 70 as well, the vapor chamber 1 can be conveyed with the suspending apparatus 80.

Figure 15:
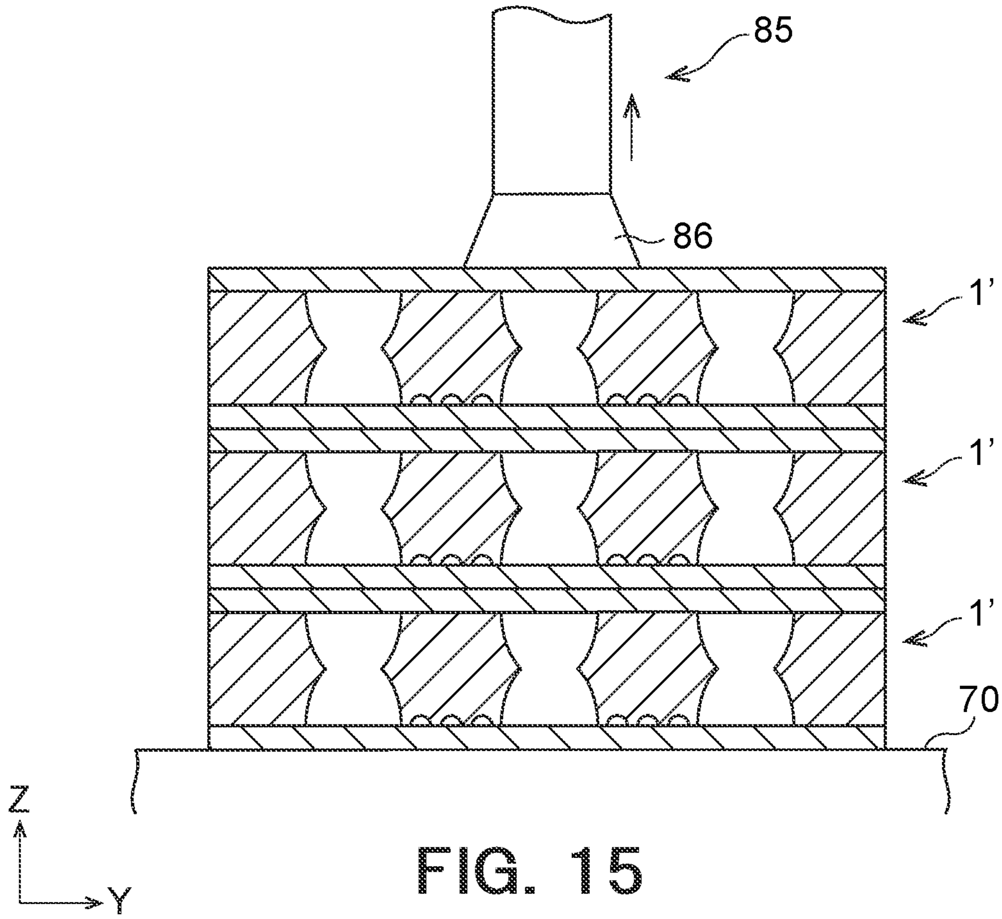
FIG. 15 is a view for illustrating a general conveying method for vapor chambers.

Here, a conveying method for a general vapor chamber 1' will be described. As shown in FIG. 15, the side of the general vapor chamber 1' is formed upright, and the lower sheet retracted portions 15*a*, 15*b*, 15*c*, 15*d* are not formed in the lower sheet 10 unlike the vapor chamber 1 according to the present embodiment. Therefore, the hooks 82*a*, 82*b* of the suspending apparatus 80 cannot be put into the lower sheet retracted portions 15*a*, 15*b*, and it is difficult to convey the general vapor chamber 1' with the above-described suspending apparatus 80.

As shown in FIG. 15, the general vapor chamber 1' can be taken out and conveyed with an adsorption apparatus 85. More specifically, the adsorption apparatus 85 has an adsorption pad 86 that generates adsorption force by exerting a negative pressure inside and presses the adsorption pad 86 against the upper surface of the vapor chamber 1' to be adsorbed to the vapor chamber 1'. After that, in a state where the vapor chamber 1' is adsorbed by the adsorption pad 86, the adsorption apparatus 85 is moved upward to suspend the vapor chamber 1'. Then, the adsorption apparatus 85 is moved in the horizontal direction to convey the vapor chamber 1' to a desired target position.

At this time, when the vapor chamber 1' has a thin profile, the vapor chamber 1' may deform due to adsorption force exerted from the adsorption pad 86 on the upper surface of the vapor chamber 1'. Therefore, the thin profile of the vapor chamber 1' can be suppressed to suppress deformation of the vapor chamber 1'.

In contrast, in the present embodiment, the lower sheet retracted portions 15*a*, 15*b*, 15*c*, 15*d* are provided in the lower sheet 10 of the vapor chamber 1. As a result, the hooks 82*a*, 82*b* of the suspending apparatus 80 can be put into the lower sheet retracted portions 15*a*, 15*b*, 15*c*, 15*d* of the vapor chamber 1 placed. Therefore, the vapor chamber 1 can be suspended and conveyed with the suspending apparatus 80, so using the above-described adsorption apparatus 85 is not required. Therefore, it is possible to suppress deformation of the vapor chamber 1'. As a result, a further thin-profile vapor chamber 1' can be implemented.

Conveying the vapor chamber 1 with the above-described suspending apparatus 80 is an example, and the vapor chamber 1 may be conveyed with another selected apparatus or the like. For example, the vapor chamber 1 may be conveyed with a tool having a sharp distal end. More specifically, the vapor chamber 1 may be lifted by putting the distal end of the tool into the lower sheet retracted portion 15*a* and then moving the tool upward. Then, the vapor chamber 1 may be conveyed by holding the lifted vapor chamber 1 with a hand. Alternatively, for example, without using such an apparatus or tool, the finger is put into the lower sheet retracted portion 15*a* to lift the vapor chamber 1, and then the vapor chamber 1 may be held with a hand and conveyed. In such a case as well, since the lower sheet retracted portions 15*a*, 15*b*, 15*c*, 15*d* are provided in the lower sheet 10, it is easy to take out and convey the vapor chamber 1.

Next, an operation method for the vapor chamber 1, that is, a method of cooling the device D, will be described.

The vapor chamber 1 conveyed as described above is installed in the housing H of a mobile terminal or the like at a conveyance destination, and the housing member Ha contacts with the second upper sheet surface 20*b* of the upper sheet 20. The device D, such as a CPU, that is a device to be cooled is attached to the first lower sheet surface 10*a* of the lower sheet 10 (or the vapor chamber 1 is attached to the device D), and the first lower sheet surface 10*a* of the lower sheet 10 contacts with the device D. The working liquid 2*b* in the sealed space 3 adheres, with its surface tension, to the wall surface of the sealed space 3, that is, the wall surfaces 53*a* of the lower vapor channel recesses 53, the wall surfaces 54*a* of the upper vapor channel recesses 54, and the wall surfaces 62 of the liquid channel main stream grooves 61 and the wall surfaces of the liquid channel communication grooves 65 of the liquid channel 60. The working liquid 2*b* can also adhere to portions exposed to the lower vapor channel recesses 53, the liquid channel main stream grooves 61, and the liquid channel communication grooves 65, of the second lower sheet surface 10*b* of the lower sheet 10. The working liquid 2*b* can also adhere to portions exposed to the upper vapor channel recesses 54, of the first upper sheet surface 20*a* of the upper sheet 20.

When the device D generates heat in this state, the working liquid 2*b* present in the vaporization region SR (see FIG. 6) receives heat from the device D. The working liquid 2*b* absorbs the received heat as latent heat to be vaporized (evaporated) into the working vapor 2*a*. Most of the generated working vapor 2*a* diffuses in the lower vapor channel recesses 53 and the upper vapor channel recesses 54 that are components of the sealed space 3 (see the continuous line arrows in FIG. 6). The working vapor 2*a* in the vapor channel recesses 53, 54 leaves from the vaporization region SR, and most of the working vapor 2*a* is transferred to the condensation region CR with a relatively low temperature (a right-side portion in FIG. 6). In the condensation region CR, the working vapor 2*a* mainly dissipates heat to the upper sheet 20 to be cooled. Heat that the upper sheet 20 has received from the working vapor 2*a* is transmitted to outside air via the housing member Ha (see FIG. 3).

The working vapor 2*a* dissipates heat to the upper sheet 20 in the condensation region CR and loses the absorbed latent heat in the vaporization region SR to be condensed into the working liquid 2*b*. The produced working liquid 2*b* adheres to the wall surfaces 53*a*, 54*a* of the vapor channel recesses 53, 54, the second lower sheet surface 10*b* of the lower sheet 10, and the first upper sheet surface 20*a* of the upper sheet 20. Here, since the working liquid 2*b* continues to vaporize in the vaporization region SR, the working liquid 2*b* in a region other than the vaporization region SR of the liquid channel 60 (that is, the condensation region CR) is transferred toward the vaporization region SR by the capillary action of the liquid channel main stream grooves 61 (see the dashed line arrows in FIG. 6). As a result, the working liquid 2*b* having adhered to the wall surfaces 53*a*, 54*a*, the second lower sheet surface 10*b*, and the first upper sheet surface 20*a* moves to the liquid channel 60, passes through the liquid channel communication grooves 65, and enters the liquid channel main stream grooves 61. In this way, the liquid channel main stream grooves 61 and the liquid channel communication grooves 65 are filled with the working liquid 2*b*. Therefore, the filled working liquid 2*b* gains propelling force toward the vaporization region SR by the capillary action of the liquid channel main stream grooves 61, and is transferred smoothly toward the vaporization region SR.

In the liquid channel 60, each liquid channel main stream groove 61 communicates with another adjacent one of the liquid channel main stream grooves 61 via corresponding some of the liquid channel communication grooves 65. As a result, the working liquid 2*b* moves between adjacent two of the liquid channel main stream grooves 61, so occurrence of dryout in the liquid channel main stream grooves 61 is suppressed. Therefore, the capillary action is imparted to the working liquid 2*b* in each liquid channel main stream groove 61, and the working liquid 2*b* is smoothly transferred toward the vaporization region SR.

The working liquid 2*b* having reached the vaporization region SR receives heat again from the device D to vaporize. The working vapor 2*a* vaporized from the working liquid 2*b* moves to the lower vapor channel recesses 53 and the upper vapor channel recesses 54 with a greater channel cross-sectional area through the liquid channel communication grooves 65 in the vaporization region SR and diffuses in the vapor channel recesses 53, 54. In this way, the working fluids 2*a*, 2*b* circulate in the sealed space 3 while repeating a phase change, that is, vaporization and condensation, to transfer and dissipate heat of the device D. As a result, the device D is cooled.

In this way, according to the present embodiment, the lower sheet 10 has the lower sheet retracted portions 15*a*, 15*b*, 15*c*, 15*d* retracted toward the vapor channel 50 beyond the outer periphery 32*o* of the wick sheet 30 in a plan view. As a result, the hooks 82*a*, 82*b*, or the like, of the suspending apparatus 80 can be put into the lower sheet retracted portions 15*a*, 15*b*, 15*c*, 15*d* of the vapor chamber 1 placed. Therefore, it is possible to easily lift the vapor chamber 1, so it is possible to make it easy to convey the vapor chamber 1. As a result, it is possible to improve the conveyability of the vapor chamber 1.

According to the present embodiment, using the adsorption apparatus 85 is not required to convey the vapor chamber 1. Therefore, it is possible to suppress deformation of the vapor chamber 1. As a result, a further thin-profile vapor chamber 1 can be implemented.

According to the present embodiment, since the lower sheet 10 has the lower sheet retracted portions 15*a*, 15*b*, 15*c*, 15*d*, it is possible to avoid contact of the end of the lower sheet 10 with another component or the like to damage the component during manufacturing, use, or the like of the vapor chamber 1. It is also possible to avoid leakage of the working liquid 2*b* in the sealed space 3 due to peeling of the lower sheet 10 from the wick sheet 30 resulting from contact of the end of the lower sheet 10 with another component or the like. Therefore, it is possible to improve the safety of the vapor chamber 1.

According to the present embodiment, the lower sheet retracted portions 15*a*, 15*b*, 15*c*, 15*d* are respectively provided at the pair of long side edges 11*a*, 11*b* and the pair of short side edges 11*c*, 11*d* of the lower sheet 10. As a result, it is possible to put the hooks 82*a*, 82*b*, or the like, of the suspending apparatus 80 into any some of the lower sheet retracted portions 15*a*, 15*b*, 15*c*, 15*d* in selected directions in a plan view of the vapor chamber 1 placed and lift the vapor chamber 1. Therefore, it is possible to further easily lift the vapor chamber 1. As a result, it is possible to further improve the conveyability of the vapor chamber 1.

According to the present embodiment, each of the lower sheet retracted portions 15*a*, 15*b*, 15*c*, 15*d* is retracted to a position 10 μm or longer and 1000 μm or shorter away from the outer periphery 32*o* of the wick sheet 30 in a plan view. In this way, since the lower sheet retracted portions 15*a*, 15*b*, 15*c*, 15*d* are retracted 10 μm or greater, it is possible to firmly support the first main body surface 31*a* of the wick sheet 30 with the hooks 82*a*, 82*b*, or the like, of the suspending apparatus 80. Therefore, it is possible to further easily lift the vapor chamber 1. As a result, it is possible to further improve the conveyability of the vapor chamber 1. Since the lower sheet retracted portions 15*a*, 15*b*, 15*c*, 15*d* are retracted 1000 μm or less, it is possible to effectively use the region of the vapor chamber 1. In other words, it is possible to provide the vapor channel 50 and the liquid channel 60 in a further wide region of the vapor chamber 1, so it is possible to improve the performance of the vapor chamber 1.

According to the present embodiment, the lower sheet retracted portions 15*a*, 15*b*, 15*c*, 15*d* each are provided at a position 30 μm or longer away from the vapor channel 50 in a plan view. When the distance between the vapor channel 50 and each of the lower sheet retracted portions 15*a*, 15*b*, 15*c*, 15*d* is greater than or equal to 30 am in this way, it is possible to firmly join the first main body surface 31*a* with the second lower sheet surface 10*b* in the joining process during manufacturing of the vapor chamber 1. Therefore, it is possible to suppress a decrease in the strength of the vapor chamber 1.

According to the present embodiment, the vapor channel 50 extends through from the first main body surface 31*a* to the second main body surface 31*b*, and the upper sheet 20 covers the vapor channel 50 on the second main body surface 31*b*. In this way, when the vapor chamber 1 is made up of the lower sheet 10, the upper sheet 20, and the wick sheet 30, it is possible to dissipate heat, received by the lower sheet 10 from the device D, through the upper sheet 20. Thus, it is possible to effectively cool the device D. Therefore, it is possible to improve the performance of the vapor chamber 1.

According to the present embodiment, the upper sheet 20 has the upper sheet retracted portions 25*a*, 25*b*, 25*c*, 25*d* retracted toward the vapor channel 50 beyond the outer periphery 32*o* of the wick sheet 30 in a plan view. As a result, when the vapor chambers 1 are placed so as to be stacked on top of each other, it is possible to make it easy to put the hooks 82*a*, 82*b*, or the like, of the suspending apparatus 80 into the lower sheet retracted portions 15*a*, 15*b*. In other words, as shown in FIG. 13, when each of the vapor chambers 1 has the upper sheet retracted portions 25*a*, 25*b*, it is possible to ensure wider space for putting the hooks 82*a*, 82*b*, or the like, of the suspending apparatus 80 in by combining the lower sheet retracted portions 15*a*, 15*b* of the vapor chamber 1 disposed at the top with the upper sheet retracted portions 25*a*, 25*b* of the vapor chamber 1 disposed on the lower side. Therefore, it is possible to further easily lift the vapor chamber 1, so it is possible to further improve the conveyability of the vapor chamber 1. Thus, for example, the thickness t2 of the lower sheet 10 can be made thinner than the thickness (a dimension in the Z direction) of each of the hooks 82*a*, 82*b* of the suspending apparatus 80. Therefore, a further thin-profile vapor chamber 1 can be implemented.

According to the present embodiment, since the upper sheet 20 has the upper sheet retracted portions 25*a*, 25*b*, 25*c*, 25*d*, it is possible to avoid contact of the end of the upper sheet 20 with another component or the like to damage the component during manufacturing, use, or the like of the vapor chamber 1. It is also possible to avoid leakage of the working liquid 2*b* in the sealed space 3 due to peeling of the upper sheet 20 from the wick sheet 30 resulting from contact of the end of the upper sheet 20 with another component or the like. Therefore, it is possible to improve the safety of the vapor chamber 1.

According to the present embodiment, the wick sheet 30 is made of a material having a lower strength than the material of the lower sheet 10 or the material of the upper sheet 20. As described above, in the present embodiment, the lower sheet 10 has the lower sheet retracted portions 15*a*, 15*b*, 15*c*, 15*d*, and the upper sheet 20 has the upper sheet retracted portions 25*a*, 25*b*, 25*c*, 25*d*. As a result, when the vapor chamber 1 is installed in the housing H of a mobile terminal or the like, it is possible to avoid contact of the lower sheet 10 or the upper sheet 20 having a relatively high strength with the housing H even when the vapor chamber 1 unexpectedly contacts with the housing H. In other words, the wick sheet 30 having a relatively low strength contacts with the housing H. Therefore, it is possible to suppress damage to the housing H and suppress drop of foreign matter into the housing H due to damage to the housing H. It is also possible to suppress damage to the vapor chamber 1, so it is also possible to suppress drop of foreign matter into the housing H due to damage to the vapor chamber 1.

First Modification of First Embodiment

In the above-described first embodiment, an example in which the lower sheet retracted portions 15*a*, 15*b*, 15*c*, 15*d* are respectively provided at the pair of long side edges 11*a*, 11*b* and the pair of short side edges 11*c*, 11*d* of the lower sheet 10 has been described (see FIG. 2). However, not limited to this configuration, at least one of the pair of long side edges 11*a*, 11*b* of the lower sheet 10 may have a corresponding one of the lower sheet retracted portions 15*a*, 15*b*.

Figure 16:
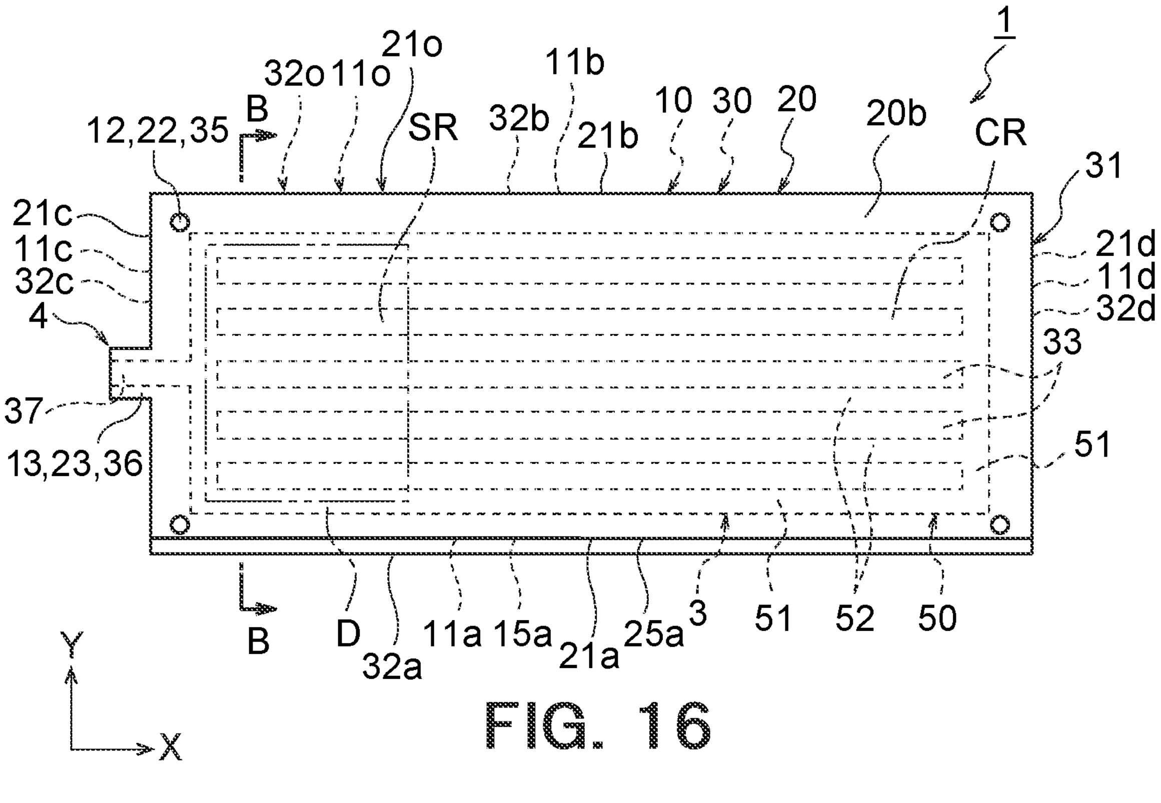
FIG. 16 is a modification (first modification) of FIG. 2.
Figure 17:
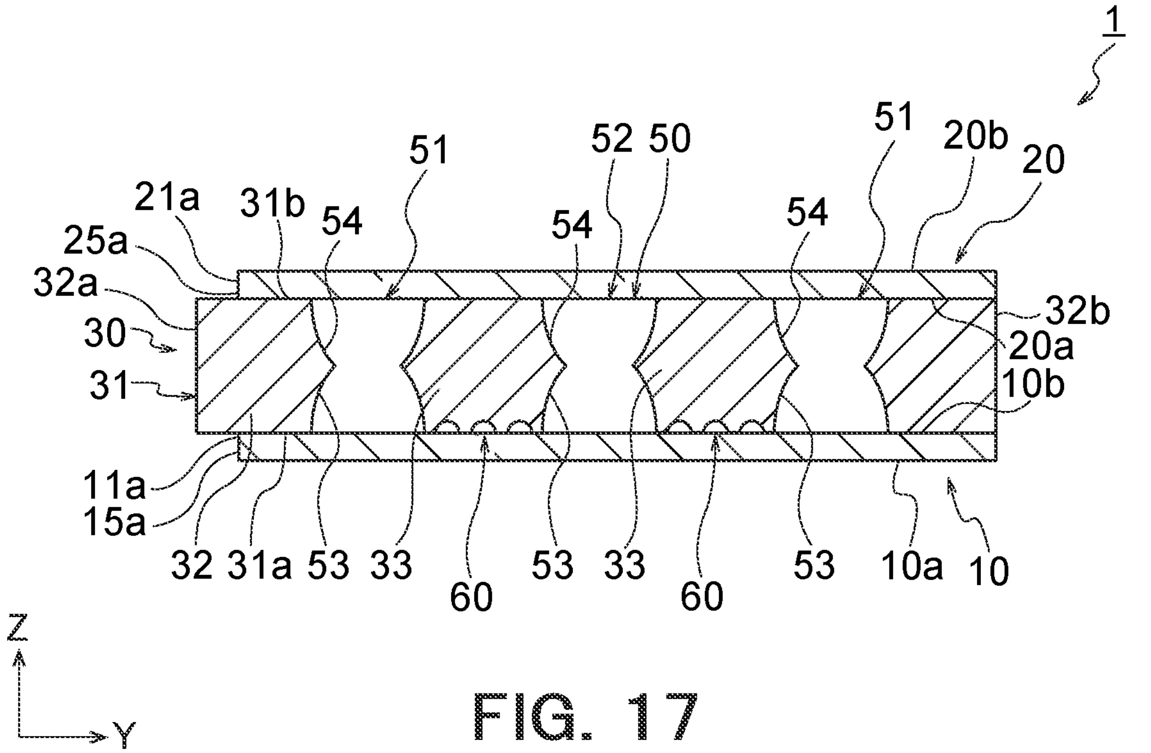
FIG. 17 is a sectional view taken along the line B-B in FIG. 16.

In the example shown in FIG. 16 and FIG. 17, the lower sheet retracted portion 15*a* is provided at the long side edge 11*a* (lower side in FIG. 16) of the lower sheet 10. Similarly, in the upper sheet 20, the upper sheet retracted portion 25*a* is provided at the long side edge 21*a* (lower side in FIG. 16) of the upper sheet 20.

In such a case as well, it is possible to put a predetermined apparatus or tool, a finger, or the like into the lower sheet retracted portion 15*a*, so it is possible to easily lift the vapor chamber 1. Therefore, it is possible to improve the conveyability of the vapor chamber 1. When the region in which the lower sheet retracted portion 15*a* is provided is limited, it is possible to effectively use the region of the vapor chamber 1. In other words, it is possible to provide the vapor channel 50 and the liquid channel 60 in a further wide region of the vapor chamber 1, so it is possible to improve the performance of the vapor chamber 1.

Second Modification of First Embodiment

One of the pair of long side edges 11*a*, 11*b* of the lower sheet 10 may have a corresponding one of the lower sheet retracted portions 15*a*, 15*b*, 15*c*, 15*d*, and one of the pair of short side edges 11*c*, 11*d* of the lower sheet 10 may have a corresponding one of the lower sheet retracted portions 15*a*, 15*b*, 15*c*, 15*d*.

Figure 18:
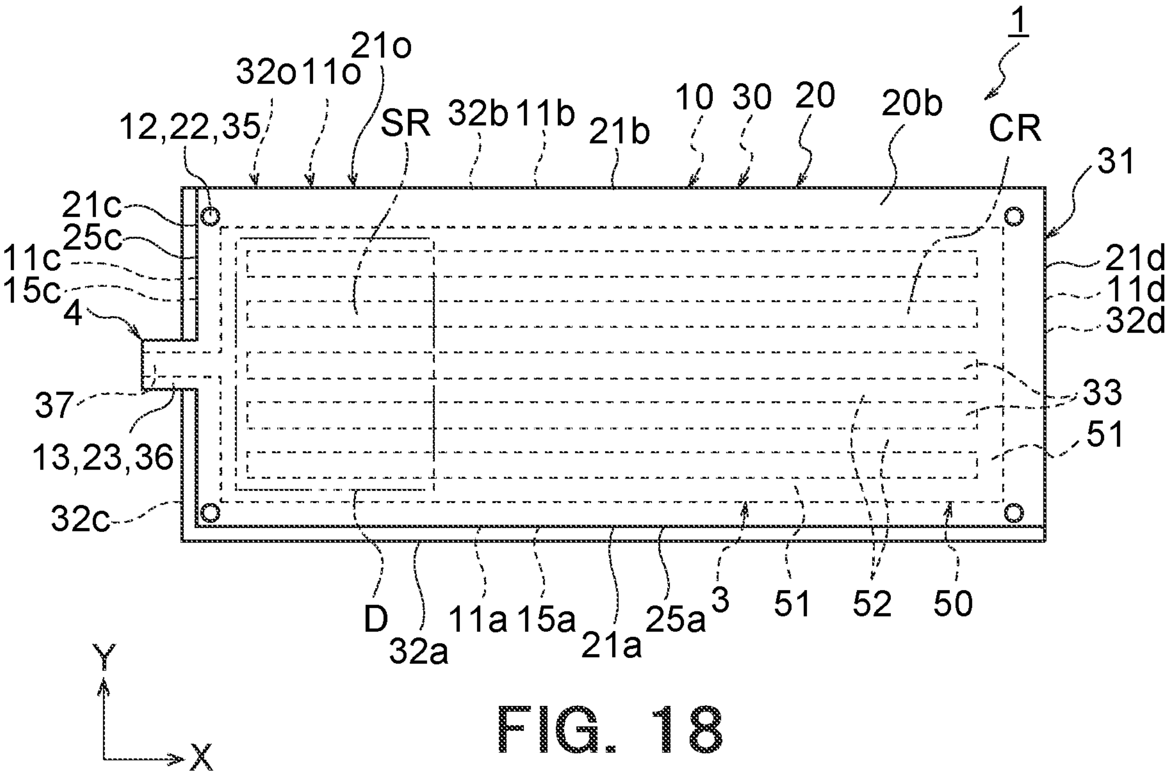
FIG. 18 is a modification (second modification) of FIG. 2.

In the example shown in FIG. 18, the lower sheet retracted portion 15*a* is provided at the long side edge 11*a* (lower side in FIG. 18) of the lower sheet 10, and the lower sheet retracted portion 15*c* is provided at the short side edge 11*c* (left side in FIG. 18) of the lower sheet 10. Similarly, in the upper sheet 20, the upper sheet retracted portion 25*a* is provided at the long side edge 21*a* (lower side in FIG. 18) of the upper sheet 20, the upper sheet retracted portion 25*c* is provided at the short side edge 21*c* (left side in FIG. 18) of the upper sheet 20.

In such a case as well, it is possible to put a predetermined apparatus or tool, a finger, or the like into the lower sheet retracted portions 15*a*, 15*c*, so it is possible to easily lift the vapor chamber 1. Therefore, it is possible to improve the conveyability of the vapor chamber 1. When the regions in which the lower sheet retracted portions 15*a*, 15*c* are provided are limited, it is possible to effectively use the region of the vapor chamber 1. In other words, it is possible to provide the vapor channel 50 and the liquid channel 60 in a further wide region of the vapor chamber 1, so it is possible to improve the performance of the vapor chamber 1.

Furthermore, in the example shown in FIG. 18, the sides of the long side edge 11*a* and the short side edge 11*c* where the lower sheet retracted portions 15*a*, 15*c* of the vapor chamber 1 are respectively provided can be lifted and conveyed, and the sides of the long side edge 11*b* and the short side edge 11*d* where the lower sheet retracted portions 15*a*, 15*c* of the vapor chamber 1 are not provided can be respectively pushed against predetermined wall surfaces. As a result, it is easy to align the vapor chamber 1 with respect to the wall surfaces. Therefore, when, for example, manufacturing information or the like is printed by applying laser beam to a predetermined position of the vapor chamber 1, it is possible to print the manufacturing information or the like at an accurate position. After the vapor chamber 1 is pushed against the wall surfaces as well, it is possible to easily lift the sides of the long side edge 11*a* and the short side edge 11*c* of the vapor chamber 1. Therefore, it is possible to improve the conveyability of the vapor chamber 1.

Third Modification of First Embodiment

The lower sheet retracted portions 15*a*, 15*b* may be respectively provided at both the long side edges 11*a*, 11*b* of the lower sheet 10. Furthermore, the lower sheet retracted portions 15*a*, 15*b* may be respectively provided at parts of the long side edges 11*a*, 11*b* of the lower sheet 10.

Figure 19:
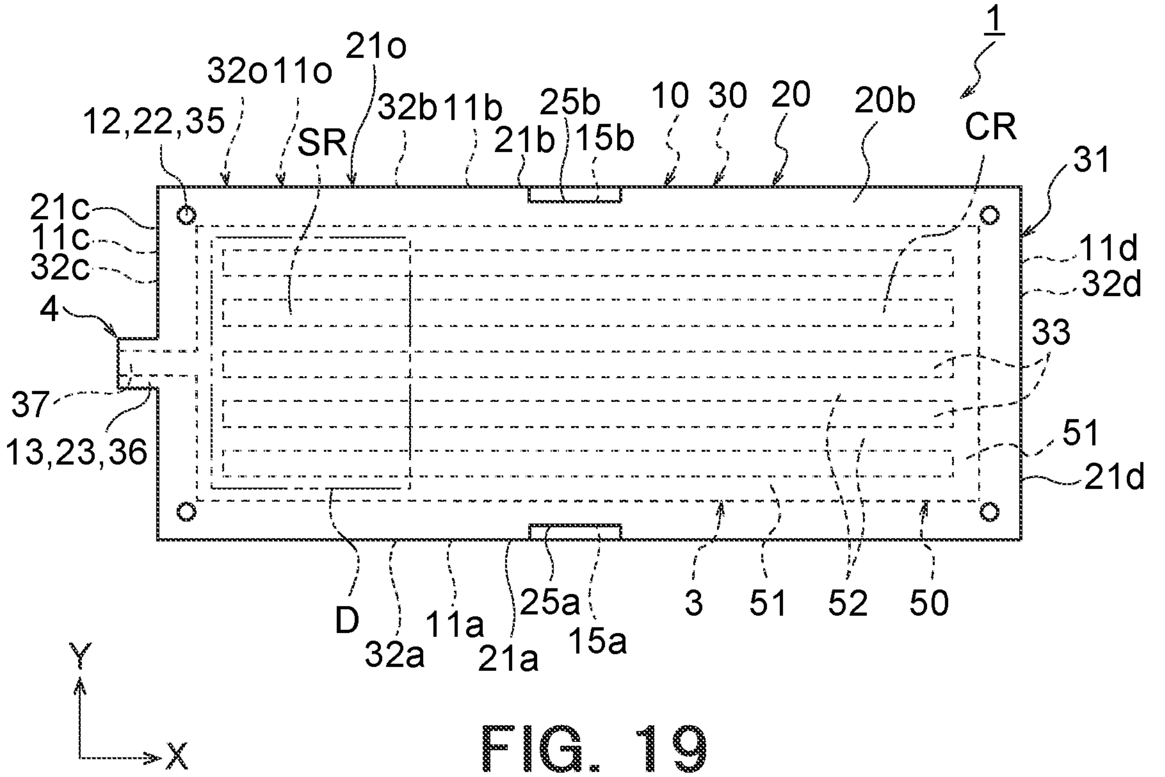
FIG. 19 is a modification (third modification) of FIG. 2.

In the example shown in FIG. 19, the lower sheet retracted portions 15*a*, 15*b* are respectively provided at both the long side edges 11*a*, 11*b* of the lower sheet 10, and the lower sheet retracted portions 15*a*, 15*b* are respectively provided at part of the long side edge 11*a* and part of the long side edge 11*b*. Similarly, in the upper sheet 20, the upper sheet retracted portions 25*a*, 25*b* are respectively provided at both the long side edges 21*a*, 21*b* of the upper sheet 20, and the upper sheet retracted portions 25*a*, 25*b* are respectively provided at part of the long side edge 21*a* and part of the long side edge 21*b*. The lower sheet retracted portions 15*a*, 15*b* may be respectively provided at the center of the long side edge 11*a* and the center of the long side edge 11*b*. The upper sheet retracted portions 25*a*, 25*b* may also be respectively provided at the center of the long side edge 11*a* and the center of the long side edge 11*b*.

In this case, the lower sheet retracted portion 15*a* and the lower sheet retracted portion 15*b* may be disposed at positions symmetric with respect to the center of gravity of the vapor chamber 1 in a plan view. The upper sheet retracted portion 25*a* may be disposed at a position overlapping the lower sheet retracted portion 15*a* in a plan view, and the upper sheet retracted portion 25*b* may be disposed at a position overlapping the lower sheet retracted portion 15*b* in a plan view.

In such a case as well, it is possible to put the hooks 82*a*, 82*b*, or the like, of the suspending apparatus 80 into the lower sheet retracted portions 15*a*, 15*b*, so it is possible to easily lift the vapor chamber 1. Therefore, it is possible to improve the conveyability of the vapor chamber 1. When the regions in which the lower sheet retracted portions 15*a*, 15*c* are provided are further limited, it is possible to further effectively use the region of the vapor chamber 1. In other words, it is possible to provide the vapor channel 50 and the liquid channel 60 in a further wide region of the vapor chamber 1, so it is possible to further improve the performance of the vapor chamber 1.

When the lower sheet retracted portion 15*a* and the lower sheet retracted portion 15*b* are disposed at positions symmetric with respect to the center of gravity of the vapor chamber 1 in a plan view, it is possible to stabilize the attitude of the vapor chamber 1 at the time of suspending the vapor chamber 1 with the suspending apparatus 80 or the like. Therefore, it is possible to easily convey the vapor chamber 1. When the upper sheet retracted portions 25*a*, 25*b* are disposed at positions respectively overlapping the lower sheet retracted portions 15*a*, 15*b* in a plan view, it is possible to easily put the hooks 82*a*, 82*b*, or the like, of the suspending apparatus 80 into the lower sheet retracted portions 15*a*, 15*b* in a case where the vapor chambers 1 are placed so as to be stacked on top of each other.

Fourth Modification of First Embodiment

The lower sheet retracted portions 15*a*, 15*b* may be provided at the corners of the lower sheet 10.

Figure 20:
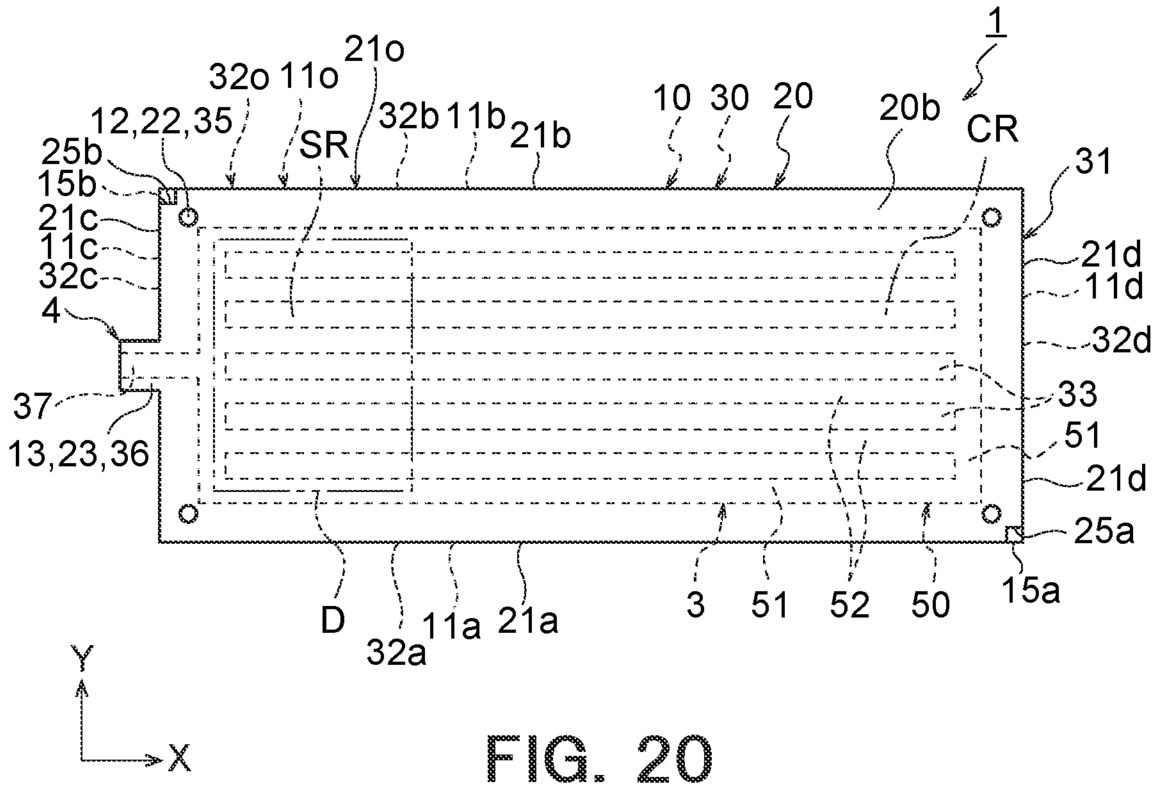
FIG. 20 is a modification (fourth modification) of FIG. 2.

In the example shown in FIG. 20, the lower sheet retracted portion 15*a* is provided at a corner (lower right side in FIG. 20) to the sides of the long side edge 11*a* and the short side edge 11*d* of the lower sheet 10). The lower sheet retracted portion 15*b* is provided at a corner (upper left side in FIG. 20) to the sides of the long side edge 11*b* and the short side edge 11*c* of the lower sheet 10. Similarly, in the upper sheet 20, the upper sheet retracted portion 25*a* is provided at a corner (lower right side in FIG. 20) to the sides of the long side edge 21*a* and the short side edge 21*d* of the upper sheet 20. The upper sheet retracted portion 25*b* is provided at a corner (upper left side in FIG. 20) to the sides of the long side edge 21*b* and the short side edge 21*c* of the upper sheet 20.

In this case, the lower sheet retracted portion 15*a* and the lower sheet retracted portion 15*b* may be disposed at positions symmetric with respect to the center of gravity of the vapor chamber 1 in a plan view. The upper sheet retracted portion 25*a* may be disposed at a position overlapping the lower sheet retracted portion 15*a* in a plan view, and the upper sheet retracted portion 25*b* may be disposed at a position overlapping the lower sheet retracted portion 15*b* in a plan view.

In such a case as well, it is possible to put the hooks 82*a*, 82*b*, or the like, of the suspending apparatus 80 into the lower sheet retracted portions 15*a*, 15*b*, so it is possible to easily lift the vapor chamber 1. Therefore, it is possible to improve the conveyability of the vapor chamber 1. When the regions in which the lower sheet retracted portions 15*a*, 15*c* are provided are further limited, it is possible to further effectively use the region of the vapor chamber 1. In other words, it is possible to provide the vapor channel 50 and the liquid channel 60 in a further wide region of the vapor chamber 1, so it is possible to further improve the performance of the vapor chamber 1.

When the lower sheet retracted portion 15*a* and the lower sheet retracted portion 15*b* are disposed at positions symmetric with respect to the center of gravity of the vapor chamber 1 in a plan view, it is possible to stabilize the attitude of the vapor chamber 1 at the time of suspending the vapor chamber 1 with the suspending apparatus 80 or the like. Therefore, it is possible to easily convey the vapor chamber 1. When the upper sheet retracted portions 25*a*, 25*b* are disposed at positions respectively overlapping the lower sheet retracted portions 15*a*, 15*b* in a plan view, it is possible to easily put the hooks 82*a*, 82*b*, or the like, of the suspending apparatus 80 into the lower sheet retracted portions 15*a*, 15*b* in a case where the vapor chambers 1 are placed so as to be stacked on top of each other.

Fifth Modification of First Embodiment

In the above-described first embodiment, an example in which the lower sheet 10 has the lower sheet retracted portions 15*a*, 15*b*, 15*c*, 15*d*, and the upper sheet 20 has the upper sheet retracted portions 25*a*, 25*b*, 25*c*, 25*d* has been described (see FIG. 3). However, not limited to this configuration, the lower sheet 10 does not need to have the lower sheet retracted portions 15*a*, 15*b*, 15*c*, 15*d*. Alternatively, the upper sheet 20 does not need to have the upper sheet retracted portions 25*a*, 25*b*, 25*c*, 25*d*.

Figure 21:
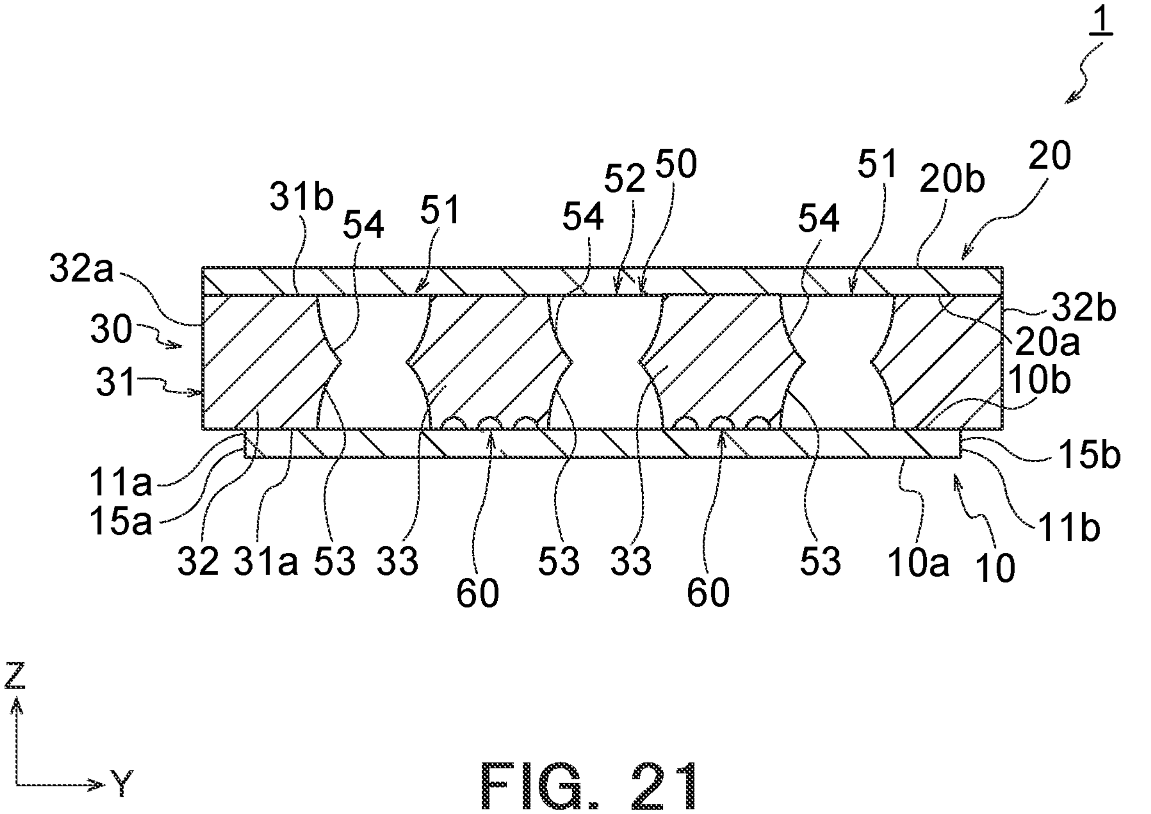
FIG. 21 is a modification (fifth modification) of FIG. 3.

In the example shown in FIG. 21, the lower sheet 10 has the lower sheet retracted portions 15*a*, 15*b*, 15*c*, 15*d*, but the upper sheet 20 does not have the upper sheet retracted portions 25*a*, 25*b*, 25*c*, 25*d*.

In such a case as well, it is possible to put a predetermined apparatus or tool, a finger, or the like into the lower sheet retracted portions 15*a*, 15*b*, 15*c*, 15*d*, so it is possible to easily lift the vapor chamber 1. Therefore, it is possible to improve the conveyability of the vapor chamber 1.

The upper sheet 20 may have the upper sheet retracted portions 25*a*, 25*b*, 25*c*, 25*d*, but the lower sheet 10 does not need to have the lower sheet retracted portions 15*a*, 15*b*, 15*c*, 15*d*.

In this case, a predetermined apparatus or tool, a finger, or the like is put into the upper sheet retracted portions 25*a*, 25*b*, 25*c*, 25*d*, in a state where the vapor chamber 1 is placed in an opposite orientation, that is, in a state where the second upper sheet surface 20*b* of the upper sheet 20 is placed so as to face the placement surface 70. Thus, it is possible to easily lift the vapor chamber 1. Therefore, it is possible to improve the conveyability of the vapor chamber 1.

Sixth Modification of First Embodiment

In the above-described first embodiment, an example in which no liquid channel 60 is provided between the vapor channel 50 and each of the lower sheet retracted portions 15*a*, 15*b*, 15*c*, 15*d* has been described (see FIG. 3). However, not limited to this configuration, the liquid channel 60 may be provided between the vapor channel 50 and each of the lower sheet retracted portions 15*a*, 15*b*, 15*c*, 15*d*.

Figure 22:
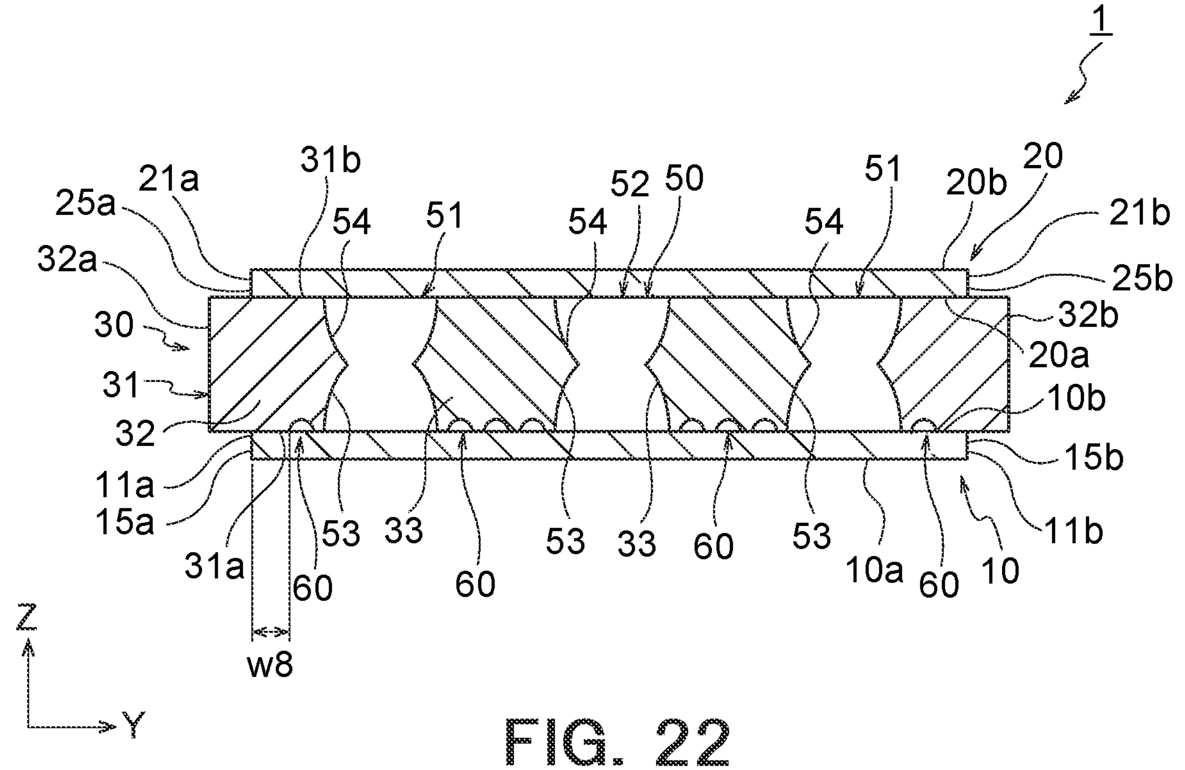
FIG. 22 is a modification (sixth modification) of FIG. 3.

In the example shown in FIG. 22, the liquid channel 60 is provided between the vapor channel 50 and each of the lower sheet retracted portions 15*a*, 15*b*. In other words, the liquid channel 60 is provided between the first vapor passage 51 and the long side edge 11*a* of the lower sheet 10, and the liquid channel 60 is provided between the first vapor passage 51 and the long side edge 11*b* of the lower sheet 10.

In this case, the dimension w8 in the Y direction between the liquid channel 60 and the long side edge 11*a* of the lower sheet 10, shown in FIG. 22, may, for example, range from 30 μm to 3000 μm. Here, the dimension w8 means a dimension at the first main body surface 31*a*. The same applies to the dimension in the Y direction between the liquid channel 60 and the long side edge 11*b* of the lower sheet 10. In other words, each of the lower sheet retracted portions 15*a*, 15*b* may be provided at a position 30 μm or longer and 3000 μm or shorter away from the liquid channel 60.

In such a case as well, it is possible to put a predetermined apparatus or tool, a finger, or the like into the lower sheet retracted portions 15*a*, 15*b*, 15*c*, 15*d*, so it is possible to easily lift the vapor chamber 1. Therefore, it is possible to improve the conveyability of the vapor chamber 1.

When the distance between the liquid channel 60 and each of the lower sheet retracted portions 15*a*, 15*b*, 15*c*, 15*d* is greater than or equal to 30 μm, it is possible to firmly join the first main body surface 31*a* with the second lower sheet surface 10*b* in the joining process during manufacturing of the vapor chamber 1. Therefore, it is possible to suppress a decrease in the strength of the vapor chamber 1.

Seventh Modification of First Embodiment

In the above-described first embodiment, an example in which the vapor chamber 1 includes one wick sheet 30 has been described. However, not limited to this configuration, the vapor chamber 1 may include a plurality of the wick sheets 30.

Figure 23:
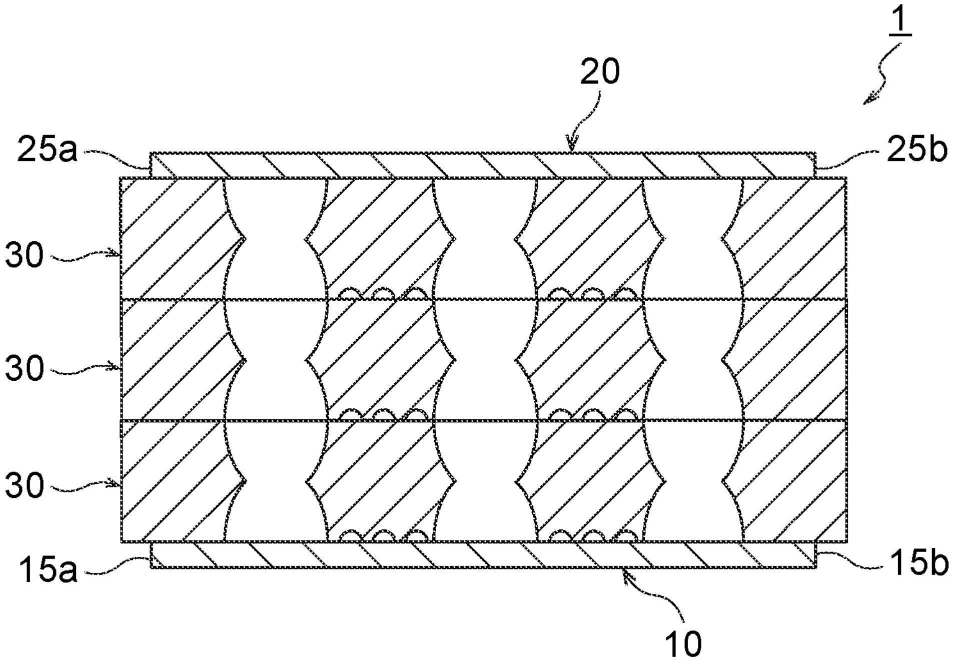
FIG. 23 is a modification (seventh modification) of FIG. 3.

In the example shown in FIG. 23, the vapor chamber 1 includes three wick sheets 30. The wick sheets 30 may be provided between the lower sheet 10 and the upper sheet 20. Each of the wick sheets 30 is formed so as to be entirely greater than the lower sheet 10 or the upper sheet 20 in a plan view. In other words, the lower sheet 10 and the upper sheet 20 each are entirely formed so as to be smaller than each of the wick sheets 30 in a plan view. Therefore, the lower sheet 10 has the lower sheet retracted portions 15*a*, 15*b*, 15*c*, 15*d*. The upper sheet 20 has the upper sheet retracted portions 25*a*, 25*b*, 25*c*, 25*d*.

In such a case as well, it is possible to put a predetermined apparatus or tool, a finger, or the like into the lower sheet retracted portion 15*a*, so it is possible to easily lift the vapor chamber 1. Therefore, it is possible to improve the conveyability of the vapor chamber 1.

In the example shown in FIG. 23, the wick sheets 30 have the same shape and dimensions to one another; however, not limited to this configuration, the wick sheets 30 may have different shapes and dimensions from one another. For example, although not shown in the drawing, one of the wick sheets 30 may be formed so as to be entirely smaller than the other wick sheets 30 in a plan view. The one of the wick sheets 30 may be formed so as to be entirely smaller than the lower sheet 10 or the upper sheet 20 in a plan view.

In the example shown in FIG. 23, the vapor chamber 1 includes three wick sheets 30; however, not limited to this configuration. The number of the wick sheets 30 is selectable. The vapor chamber 1 may include two wick sheets 30 or may include four or more wick sheets 30.

Eighth Modification of First Embodiment

The vapor chamber 1 may have a through-hole 90.

Figure 24:
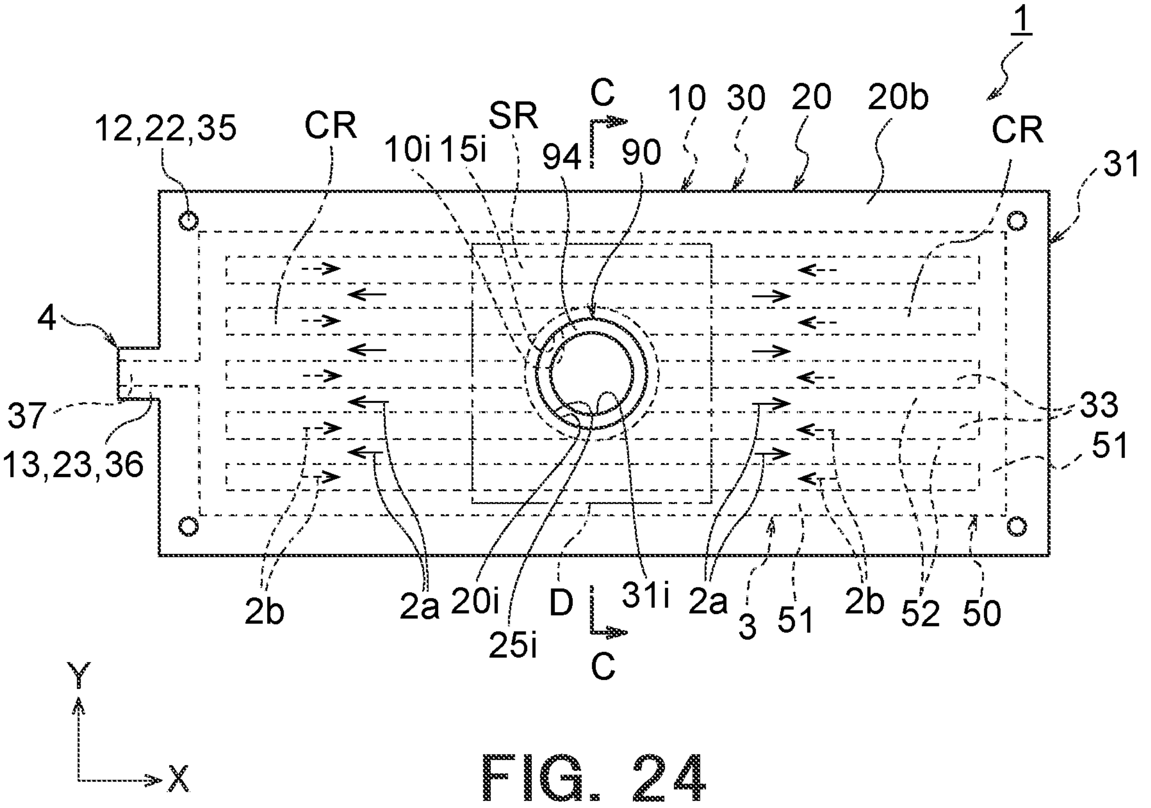
FIG. 24 is a modification (eighth modification) of FIG. 2.
Figure 25:
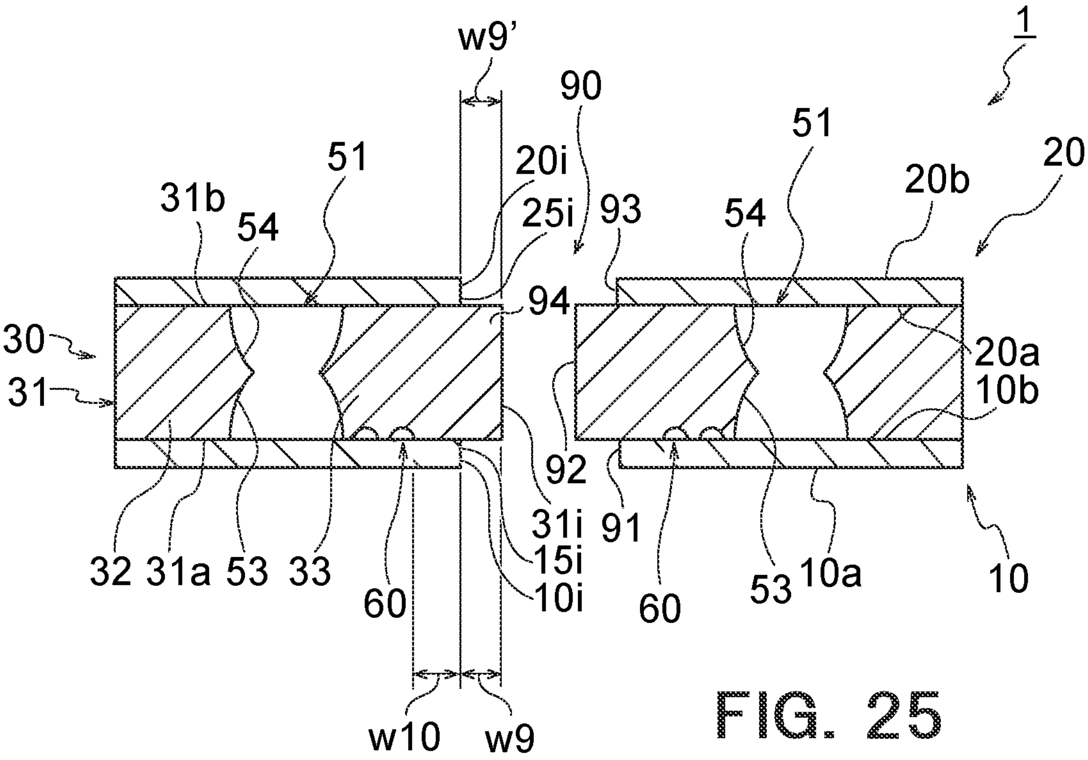
FIG. 25 is a sectional view taken along the line C-C in FIG. 24.

In the example shown in FIG. 24 and FIG. 25, the vapor chamber 1 has the through-hole 90 that extends through the lower sheet 10, the wick sheet 30, and the upper sheet 20.

The through-hole 90 includes a lower sheet through portion 91 extending through from the first lower sheet surface 10*a* to the second lower sheet surface 10*b*, a wick sheet through portion 92 extending through from the first main body surface 31*a* to the second main body surface 31*b*, and an upper sheet through portion 93 extending through from the first upper sheet surface 20*a* to the second upper sheet surface 20*b*. In other words, the lower sheet through portion 91 extends through the lower sheet 10, the wick sheet through portion 92 extends through the wick sheet 30, and the upper sheet through portion 93 extends through the upper sheet 20. A wall 94 is formed around the wick sheet through portion 92, and the vapor channel 50 and the liquid channel 60 do not communicate with the through-hole 90. In the example shown in FIG. 24, the vaporization region SR is provided at the center of the vapor chamber 1 in the X direction, and the condensation region CR is provided on one side and the other side (the left side and the right side in FIG. 24) of the vapor chamber 1 in the X direction.

The lower sheet through portion 91 may be formed by etching a lower sheet base material in the above-described lower sheet preparation process. Alternatively, the lower sheet through portion 91 may be formed by press working of the lower sheet base material. The upper sheet through portion 93 may be formed by etching an upper sheet base material in the above-described upper sheet preparation process. Alternatively, the upper sheet through portion 93 may be formed by press working of the upper sheet base material. The wick sheet through portion 92 may be formed by etching a metal material sheet M in an etching process of the above-described wick sheet preparation process. In FIG. 25, the sectional shape of the wick sheet through portion 92 is a rectangular shape. Alternatively, as in the case of the above-described first vapor passage 51 or the second vapor passage 52, the wick sheet through portion 92 may have a shape such that a lower recess formed in a concave shape on the first main body surface 31*a* and an upper recess formed in a concave shape on the second main body surface 31*b* communicate with each other. The same applies to the lower sheet through portion 91 and the upper sheet through portion 93.

In the example shown in FIG. 24 and FIG. 25, in a plan view, an inner periphery 10*i* of the lower sheet 10, defining the lower sheet through portion 91, is located outside an inner periphery 31*i* of the wick sheet 30, defining the wick sheet through portion 92, that is, on an opposite side to the through-hole 90. Thus, the lower sheet 10 has a lower sheet retracted portion 15*i* retracted toward an opposite side to the through-hole 90 beyond the inner periphery 31*i* of the wick sheet 30, defining the through-hole 90, in a plan view.

The dimension w9 in the Y direction between the inner periphery 10*i* of the lower sheet 10 and the inner periphery 31*i* of the wick sheet 30, shown in FIG. 25, may, for example, range from 10 μm to 1000 μm. In other words, the lower sheet retracted portion 15*i* may be retracted to a position 10 μm or longer and 1000 μm or shorter away from the inner periphery 31*i* of the wick sheet 30 in a plan view.

The dimension w10 in the Y direction between the liquid channel 60 and the inner periphery 10*i* of the lower sheet 10, shown in FIG. 25, may, for example, range from 30 μm to 3000 μm. Here, the dimension w10 means a dimension at the first main body surface 31*a*. In other words, the lower sheet retracted portion 15*i* may be provided at a position 30 am or longer and 3000 am or shorter away from the liquid channel 60. When the vapor channel 50 is provided between the liquid channel 60 and the inner periphery 10*i* of the lower sheet 10, the dimension in the Y direction between the vapor channel 50 and the inner periphery 10*i* of the lower sheet 10 may range from 30 am to 3000 μm.

In the example shown in FIG. 24 and FIG. 25, in a plan view, an inner periphery 20*i* of the upper sheet 20, defining the upper sheet through portion 93, is located outside an inner periphery 31*i* of the wick sheet 30, defining the wick sheet through portion 92, that is, on an opposite side to the through-hole 90. Thus, the upper sheet 20 has an upper sheet retracted portion 25*i* retracted toward an opposite side to the through-hole 90 beyond the inner periphery 31*i* of the wick sheet 30, defining the through-hole 90, in a plan view.

The dimension w9' in the Y direction between the inner periphery 20*i* of the upper sheet 20 and the inner periphery 31*i* of the wick sheet 30, shown in FIG. 25, may, for example, range from 10 μm to 1000 μm. In other words, the upper sheet retracted portion 25*i* may be retracted to a position 10 μm or longer and 1000 μm or shorter away from the inner periphery 31*i* of the wick sheet 30 in a plan view. The dimension w9' may be equal to the above-described dimension w9, may be greater than the above-described dimension w9, or may be less than the above-described dimension w9.

Figure 26:
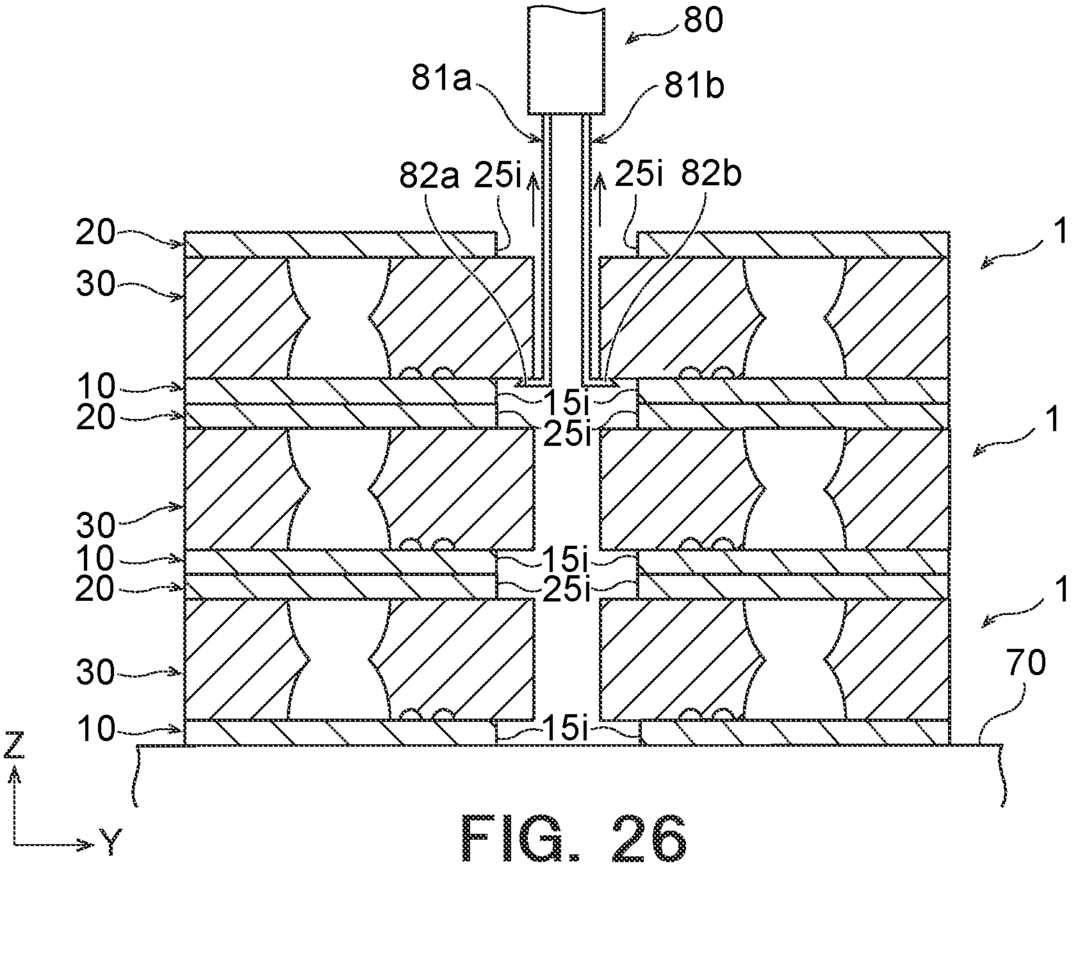
FIG. 26 is a view for illustrating a conveying method for the vapor chamber of FIG. 25.

In such a case as well, as shown in FIG. 26, it is possible to put the first arm 81*a* and the second arm 81*b*, or the like, of the suspending apparatus 80 into the lower sheet retracted portion 15*i* of the lower sheet 10, so it is possible to easily lift the vapor chamber 1. Therefore, it is possible to improve the conveyability of the vapor chamber 1.

In this way, since the lower sheet retracted portion 15*i* is retracted 10 μm or greater, it is possible to firmly support the first main body surface 31*a* of the wick sheet 30 with the hooks 82*a*, 82*b*, or the like, of the suspending apparatus 80. Therefore, it is possible to further easily lift the vapor chamber 1. As a result, it is possible to further improve the conveyability of the vapor chamber 1. Since the lower sheet retracted portion 15*i* is retracted 1000 μm or less, it is possible to effectively use the region of the vapor chamber 1. In other words, it is possible to provide the vapor channel 50 and the liquid channel 60 in a further wide region of the vapor chamber 1, so it is possible to improve the performance of the vapor chamber 1.

When the distance between the vapor channel 50 and the lower sheet retracted portion 15*i* is greater than or equal to 30 μm, it is possible to firmly join the first main body surface 31*a* with the second lower sheet surface 10*b* in the joining process during manufacturing of the vapor chamber 1. Therefore, it is possible to suppress a decrease in the strength of the vapor chamber 1.

When the vapor chamber 1 is made up of the lower sheet 10, the upper sheet 20, and the wick sheet 30, it is possible to dissipate heat, received by the lower sheet 10 from the device D, through the upper sheet 20. Thus, it is possible to effectively cool the device D. Therefore, it is possible to improve the performance of the vapor chamber 1.

The upper sheet 20 has the upper sheet retracted portion 25*i* retracted toward an opposite side to the through-hole 90 beyond the inner periphery 31*i* of the wick sheet 30 in a plan view. As a result, when the vapor chambers 1 are placed so as to be stacked on top of each other, it is possible to make it easy to put the hooks 82*a*, 82*b*, or the like, of the suspending apparatus 80 into the lower sheet retracted portion 15*i*. In other words, as shown in FIG. 26, when each of the vapor chambers 1 has the upper sheet retracted portion 25*i*, it is possible to ensure wider space for putting the hooks 82*a*, 82*b*, or the like, of the suspending apparatus 80 in by combining the lower sheet retracted portion 15*i* of the vapor chamber 1 disposed at the top with the upper sheet retracted portion 25*i* of the vapor chamber 1 disposed on the lower side. Therefore, it is possible to further easily lift the vapor chamber 1, so it is possible to further improve the conveyability of the vapor chamber 1. Thus, for example, the thickness t2 of the lower sheet 10 can be made thinner than the thickness (a dimension in the Z direction) of each of the hooks 82*a*, 82*b* of the suspending apparatus 80. Therefore, a further thin-profile vapor chamber 1 can be implemented.

Ninth Modification of First Embodiment

In the above-described first embodiment, an example in which the vapor chamber 1 is made up of the lower sheet 10, the upper sheet 20, and the wick sheet 30 has been described. However, not limited to this configuration, the vapor chamber 1 may be made up of the lower sheet 10 (first sheet) and the wick sheet 30 (main body sheet).

Figure 27:
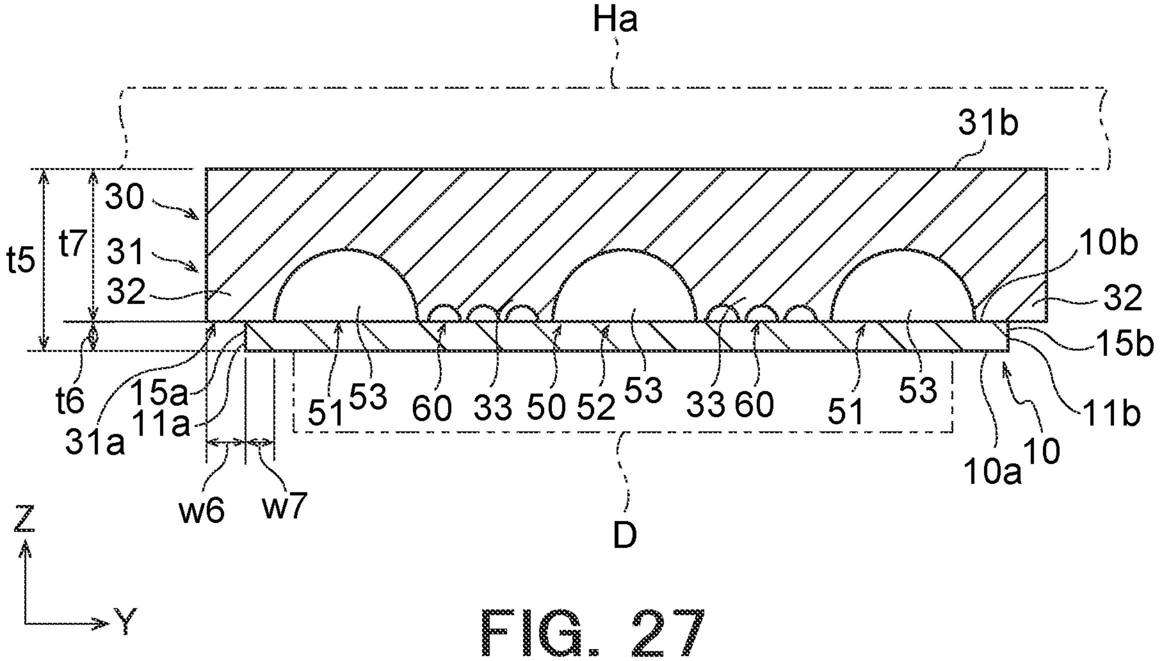
FIG. 27 is a modification (ninth modification) of FIG. 3.

In the example shown in FIG. 27, the vapor chamber 1 includes the lower sheet 10 and the wick sheet 30 and does not include the upper sheet 20. The housing member Ha may be attached to the second main body surface 31*b* of the wick sheet 30. Heat of the working vapor 2*a* is transferred from the wick sheet 30 to the housing member Ha.

In the example shown in FIG. 27, the vapor channel 50 is provided at the first main body surface 31*a*, but the vapor channel 50 does not extend to the second main body surface 31*b* or extend through the wick sheet 30. In other words, the first vapor passage 51 and the second vapor passages 52 of the vapor channel 50 are the lower vapor channel recesses 53, and the upper vapor channel recesses 54 are not provided in the wick sheet 30.

The thickness t5 of the vapor chamber 1 shown in FIG. 27 may, for example, range from 100 μm to 1000 μm. The thickness t6 of the lower sheet 10 shown in FIG. 27 may, for example, range from 6 μm to 200 μm. The thickness t7 of the wick sheet 30 shown in FIG. 27 may, for example, range from 50 μm to 800 μm.

Not limited to the example shown in FIG. 27, the vapor channel 50 may be provided on the second lower sheet surface 10*b* of the lower sheet 10. In this case, the vapor channel 50 of the lower sheet 10 may be provided at a position facing the vapor channel 50 of the wick sheet 30. The liquid channel 60 may be provided on the second lower sheet surface 10*b* of the lower sheet 10.

In this way, the vapor chamber 1 may be made up of the lower sheet 10 and the wick sheet 30.

In such a case as well, it is possible to put the hooks 82*a*, 82*b*, or the like, of the suspending apparatus 80 into the lower sheet retracted portions 15*a*, 15*b*, so it is possible to easily lift the vapor chamber 1. Therefore, it is possible to improve the conveyability of the vapor chamber 1.

Second Embodiment

Next, a vapor chamber and an electronic apparatus according to a second embodiment will be described with reference to FIG. 28 to FIG. 30.

Figure 28:
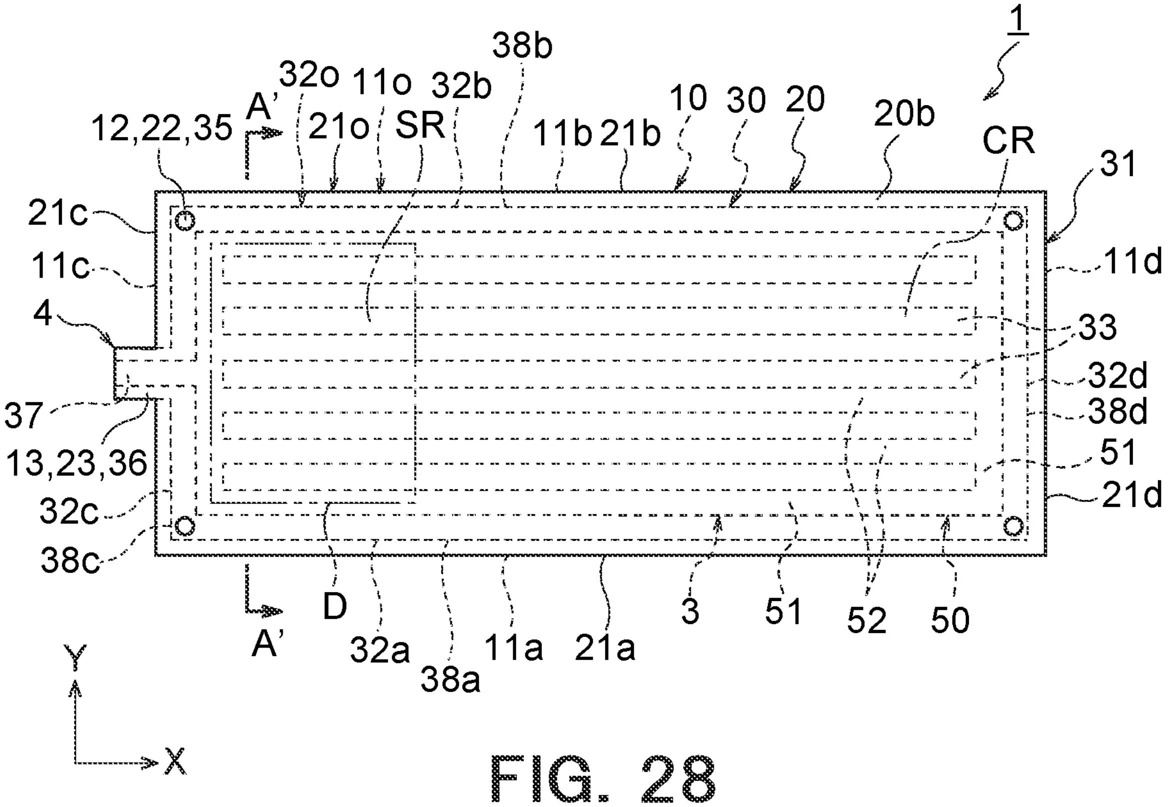
FIG. 28 is a top view showing a vapor chamber according to a second embodiment.
Figure 29:
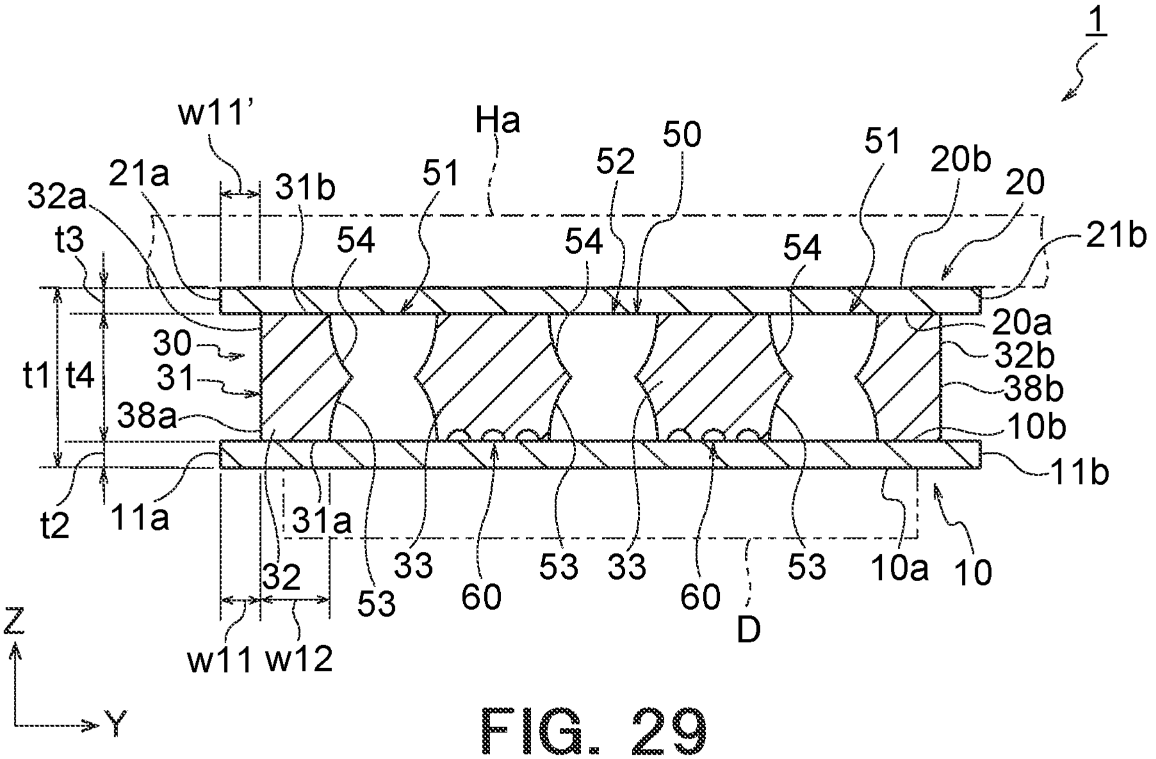
FIG. 29 is a sectional view taken along the line A'-A' in FIG. 28.
Figure 30:
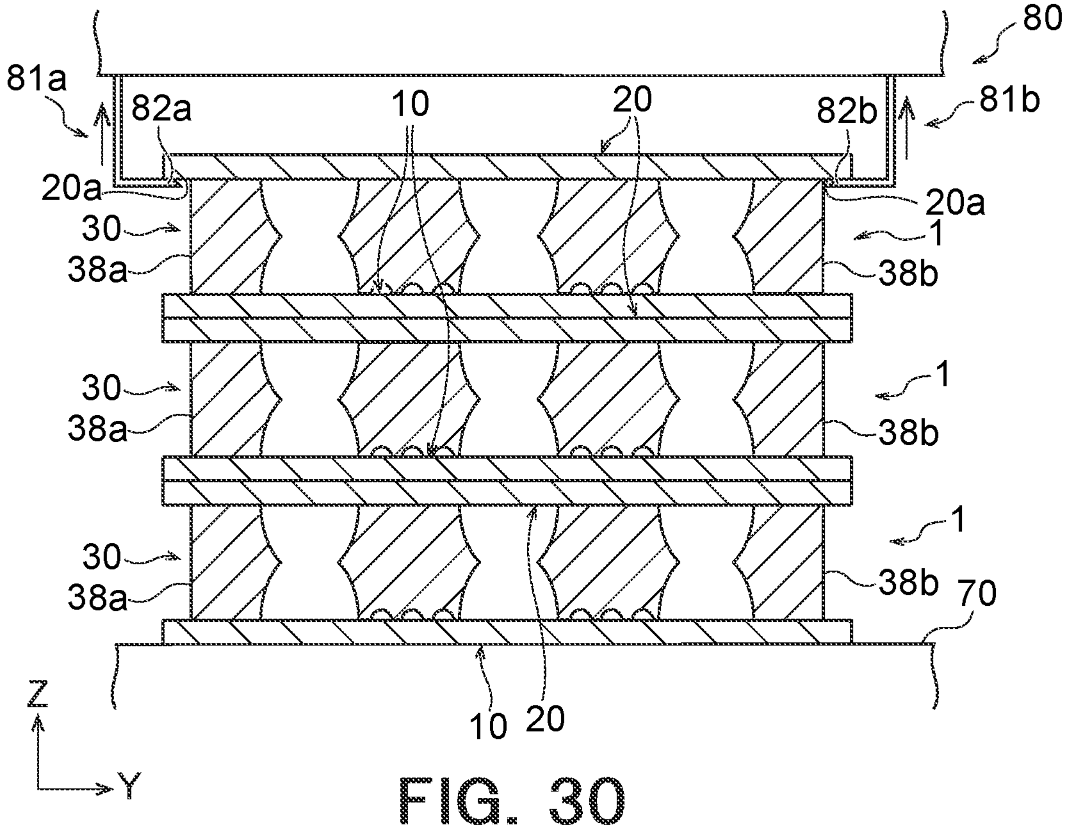
FIG. 30 is a view for illustrating a conveying method for the vapor chamber of FIG. 29.

The second embodiment shown in FIG. 28 to FIG. 30 mainly differs from the first embodiment shown in FIG. 1 to FIG. 14 in that a main body sheet includes a main body sheet retracted portion retracted toward a space beyond an outer periphery of a first sheet in a plan view, and the remaining configuration is substantially the same as that of the first embodiment. In FIG. 28 to FIG. 30, like reference signs are assigned to the same portions as those of the first embodiment shown in FIG. 1 to FIG. 14, and the detailed description is omitted.

In the present embodiment, as shown in FIG. 28 and FIG. 29, the wick sheet 30 (main body sheet) is formed so as to be entirely smaller than the lower sheet 10 (second sheet) or the upper sheet 20 (first sheet) in a plan view. Therefore, the outer periphery 32*o* of the wick sheet 30 is located inside the outer periphery 11*o* of the lower sheet 10 and the outer periphery 21*o* of the upper sheet 20, that is, adjacent to the vapor channel 50. Thus, the wick sheet 30 has the wick sheet retracted portions 38*a*, 38*b*, 38*c*, 38*d* (main body sheet retracted portions) retracted toward the vapor channel 50 beyond the outer periphery 11*o* of the lower sheet 10 and the outer periphery 21*o* of the upper sheet 20 in a plan view.

More specifically, the long side edge 32*a* of the wick sheet 30 is located adjacent to the vapor channel 50 beyond the long side edge 11*a* of the lower sheet 10 and the long side edge 21*a* of the upper sheet 20, and the wick sheet retracted portion 38*a* is formed at the long side edge 32*a* of the wick sheet 30. The long side edge 32*b* of the wick sheet 30 is located adjacent to the vapor channel 50 beyond the long side edge 11*b* of the lower sheet 10 and the long side edge 21*b* of the upper sheet 20, and the wick sheet retracted portion 38*b* is formed at the long side edge 32*b* of the wick sheet 30. The short side edge 32*c* of the wick sheet 30 is located adjacent to the vapor channel 50 beyond the short side edge 11*c* of the lower sheet 10 and the short side edge 21*c* of the upper sheet 20, and the wick sheet retracted portion 38*c* is formed at the short side edge 32*c* of the wick sheet 30. The short side edge 32*d* of the wick sheet 30 is located adjacent to the vapor channel 50 beyond the short side edge 11*d* of the lower sheet 10 and the short side edge 21*d* of the upper sheet 20, and the wick sheet retracted portion 38*d* is formed at the short side edge 32*d* of the wick sheet 30. In this way, the wick sheet retracted portions 38*a*, 38*b*, 38*c*, 38*d* are formed all around the outer periphery 32*o* of the wick sheet 30 except a portion where the wick sheet filling protrusion 36 is provided.

The dimension w11 in the Y direction between the long side edge 11*a* of the lower sheet 10 and the long side edge 32*a* of the wick sheet 30, shown in FIG. 29, may, for example, range from 10 μm to 1000 μm. The same applies to the dimension in the Y direction between the long side edge 11*b* of the lower sheet 10 and the long side edge 32*b* of the wick sheet 30, the dimension in the X direction between the short side edge 11*c* of the lower sheet 10 and the short side edge 32*c* of the wick sheet 30, and the dimension in the X direction between the short side edge 11*d* of the lower sheet 10 and the short side edge 32*d* of the wick sheet 30. In other words, each of the wick sheet retracted portions 38*a*, 38*b*, 38*c*, 38*d* may be retracted to a position 10 μm or longer and 1000 μm or shorter away from the outer periphery 11*o* of the lower sheet 10 in a plan view.

The dimension w11' in the Y direction between the long side edge 21*a* of the upper sheet 20 and the long side edge 32*a* of the wick sheet 30, shown in FIG. 29, may, for example, range from 10 μm to 1000 μm. The same applies to the dimension in the Y direction between the long side edge 21*b* of the upper sheet 20 and the long side edge 32*b* of the wick sheet 30, the dimension in the X direction between the short side edge 21*c* of the upper sheet 20 and the short side edge 32*c* of the wick sheet 30, and the dimension in the X direction between the short side edge 21*d* of the upper sheet 20 and the short side edge 32*d* of the wick sheet 30. In other words, each of the wick sheet retracted portions 38*a*, 38*b*, 38*c*, 38*d* may be retracted to a position 10 am or longer and 1000 am or shorter away from the outer periphery 21*o* of the upper sheet 20 in a plan view. The dimension w11' may be equal to the above-described dimension w11, may be greater than the above-described dimension w11, or may be less than the above-described dimension w11.

The dimension w12 in the Y direction between the long side edge 32*a* of the wick sheet 30 and the vapor channel 50 (first vapor passage 51), shown in FIG. 29, may, for example, range from 30 am to 3000 μm. Here, the dimension w12 means a dimension at the first main body surface 31*a* or the second main body surface 31*b*. The same applies to the dimension in the Y direction between the long side edge 32*b* of the wick sheet 30 and the vapor channel 50, the dimension in the X direction between the short side edge 32*c* of the wick sheet 30 and the vapor channel 50, and the dimension in the X direction between the short side edge 32*d* of the wick sheet 30 and the vapor channel 50. In other words, each of the wick sheet retracted portions 38*a*, 38*b*, 38*c*, 38*d* may be provided at a position 30 μm or longer and 3000 μm or shorter away from the vapor channel 50 (first vapor passage 51).

Next, a conveying method for the vapor chamber 1 according to the present embodiment will be described with reference to FIG. 30. Here, a method of taking out the vapor chamber 1 from a state where the vapor chambers 1 are stacked on top of each other and placed and conveyed will be described.

Initially, as shown in FIG. 30, the hook 82*a* of the first arm 81*a* and the hook 82*b* of the second arm 81*b* of the suspending apparatus 80 are respectively put into the wick sheet retracted portions 38*a*, 38*b* of the wick sheet 30, and the first hook 82*a* and the second hook 82*b* each are brought into contact with the first upper sheet surface 20*a* of the upper sheet 20.

Subsequently, in a state where the first hook 82*a* and the second hook 82*b* are in contact with the first upper sheet surface 20*a* of the upper sheet 20, the first arm 81*a* and the second arm 81*b* each are moved upward. Thus, the first upper sheet surface 20*a* of the upper sheet 20 is supported by the first hook 82*a* and the second hook 82*b*, and the vapor chamber 1 is suspended by the suspending apparatus 80.

Then, in a state where the vapor chamber 1 is suspended by the suspending apparatus 80, the first arm 81*a* and the second arm 81*b* are moved in the horizontal direction to convey the vapor chamber 1 to a desired target position.

In this way, the vapor chamber 1 according to the present embodiment can be conveyed by the suspending apparatus 80.

As in the case of the first embodiment, conveying the vapor chamber 1 with the above-described suspending apparatus 80 is an example, and the vapor chamber 1 may be conveyed with another selected apparatus or the like.

In this way, according to the present embodiment, the wick sheet 30 has the wick sheet retracted portions 38*a*, 38*b*, 38*c*, 38*d* retracted toward the vapor channel 50 beyond the outer periphery 21*o* of the upper sheet 20 in a plan view. As a result, the hooks 82*a*, 82*b*, or the like, of the suspending apparatus 80 can be put into the wick sheet retracted portions 38*a*, 38*b*, 38*c*, 38*d* of the vapor chamber 1 placed. Therefore, it is possible to easily lift the vapor chamber 1, so it is possible to make it easy to convey the vapor chamber 1. As a result, it is possible to improve the conveyability of the vapor chamber 1.

According to the present embodiment, using the adsorption apparatus 85 is not required to convey the vapor chamber 1. Therefore, it is possible to suppress deformation of the vapor chamber 1. As a result, a further thin-profile vapor chamber 1 can be implemented.

According to the present embodiment, the wick sheet 30 is formed so as to be entirely smaller than the lower sheet 10 or the upper sheet 20 in a plan view. As a result, in the joining process during manufacturing of the vapor chamber 1, it is possible to eliminate the necessity for strict alignment of the lower sheet 10, the wick sheet 30, and the upper sheet 20. In other words, even when the lower sheet 10 and the upper sheet 20 are misaligned with respect to the wick sheet 30, it is possible to cover the vapor channel 50 provided in the wick sheet 30 with the lower sheet 10 and the upper sheet 20. Therefore, it is possible to easily manufacture the vapor chamber 1.

According to the present embodiment, the wick sheet retracted portions 38*a*, 38*b*, 38*c*, 38*d* are respectively provided at the pair of long side edges 32*a*, 32*b* and the pair of short side edges 32*c*, 32*d* of the wick sheet 30. As a result, it is possible to put the hooks 82*a*, 82*b*, or the like, of the suspending apparatus 80 into any some of the wick sheet retracted portions 38*a*, 38*b*, 38*c*, 38*d* in selected directions in a plan view of the vapor chamber 1 placed and lift the vapor chamber 1. Therefore, it is possible to further easily lift the vapor chamber 1. As a result, it is possible to further improve the conveyability of the vapor chamber 1.

According to the present embodiment, each of the wick sheet retracted portions 38*a*, 38*b*, 38*c*, 38*d* is retracted to a position 10 μm or longer and 1000 μm or shorter away from the outer periphery 21*o* of the upper sheet 20 in a plan view. In this way, since the wick sheet retracted portions 38*a*, 38*b*, 38*c*, 38*d* are retracted 10 μm or greater, it is possible to firmly support the first upper sheet surface 20*a* of the upper sheet 20 with the hooks 82*a*, 82*b*, or the like, of the suspending apparatus 80. Therefore, it is possible to further easily lift the vapor chamber 1. As a result, it is possible to further improve the conveyability of the vapor chamber 1. Since the wick sheet retracted portions 38*a*, 38*b*, 38*c*, 38*d* are retracted 1000 μm or less, it is possible to effectively use the region of the vapor chamber 1. In other words, it is possible to provide the vapor channel 50 and the liquid channel 60 in a further wide region of the vapor chamber 1, so it is possible to improve the performance of the vapor chamber 1.

According to the present embodiment, the wick sheet retracted portions 38*a*, 38*b*, 38*c*, 38*d* each are provided at a position 30 μm or longer away from the vapor channel 50 in a plan view. When the distance between the vapor channel 50 and each of the wick sheet retracted portions 38*a*, 38*b*, 38*c*, 38*d* is greater than or equal to 30 μm in this way, it is possible to firmly join the second main body surface 31*b* with the first upper sheet surface 20*a* in the joining process during manufacturing of the vapor chamber 1. Therefore, it is possible to suppress a decrease in the strength of the vapor chamber 1.

According to the present embodiment, when the vapor chamber 1 is made up of the lower sheet 10, the upper sheet 20, and the wick sheet 30, it is possible to dissipate heat, received by the lower sheet 10 from the device D, through the upper sheet 20. Thus, it is possible to effectively cool the device D. Therefore, it is possible to improve the performance of the vapor chamber 1.

According to the present embodiment, the wick sheet retracted portions 38*a*, 38*b*, 38*c*, 38*d* are retracted toward the vapor channel 50 beyond the outer periphery 11*o* of the lower sheet 10 in a plan view. As a result, even when the vapor chamber 1 is placed in an opposite orientation, that is, even when the second upper sheet surface 20*b* of the upper sheet 20 is placed so as to face the placement surface 70, it is possible to easily lift the vapor chamber by bringing the hooks 82*a*, 82*b*, or the like, of the suspending apparatus 80 into contact with the second lower sheet surface 10*b* of the lower sheet 10 and moving the hooks 82*a*, 82*b*, or the like, of the suspending apparatus 80 upward. Therefore, even when the vapor chamber 1 is placed in an opposite orientation, it is possible to easily convey the vapor chamber 1. As a result, it is possible to further improve the conveyability of the vapor chamber 1.

According to the present embodiment, the lower sheet 10 and the upper sheet 20 are made of a material having a higher strength than the material of the wick sheet 30. As a result, when the hooks 82*a*, 82*b*, or the like, of the suspending apparatus 80 are brought into contact with the first upper sheet surface 20*a* of the upper sheet 20 or the second lower sheet surface 10*b* of the lower sheet 10 and then the vapor chamber 1 is suspended, it is possible to suppress deformation of the lower sheet 10 and the upper sheet 20.

First Modification of Second Embodiment

In the above-described second embodiment, an example in which the wick sheet retracted portions 38*a*, 38*b*, 38*c*, 38*d* are respectively provided at the pair of long side edges 32*a*, 32*b* and the pair of short side edges 32*c*, 32*d* of the wick sheet 30 has been described (see FIG. 28). However, not limited to this configuration, as in the case of the first modification of the above-described first embodiment, at least one of the pair of long side edges 32*a*, 32*b* of the wick sheet 30 may have a corresponding one of the wick sheet retracted portions 38*a*, 38*b*.

Second Modification of Second Embodiment

As in the case of the second modification of the above-described first embodiment, one of the pair of long side edges 32*a*, 32*b* of the wick sheet 30 may have a corresponding one of the wick sheet retracted portions 38*a*, 38*b*, 38*c*, 38*d*, and one of the pair of short side edges 32*c*, 32*d* of the wick sheet 30 may have a corresponding one of the wick sheet retracted portions 38*a*, 38*b*, 38*c*, 38*d*.

Third Modification of Second Embodiment

As in the case of the third modification of the above-described first embodiment, the wick sheet retracted portions 38*a*, 38*b* may be respectively provided at both the long side edges 32*a*, 32*b* of the wick sheet 30. Furthermore, the wick sheet retracted portions 38*a*, 38*b* may be respectively provided at parts of the long side edges 32*a*, 32*b* of the wick sheet 30.

Fourth Modification of Second Embodiment

As in the case of the fourth modification of the above-described first embodiment, the wick sheet retracted portions 38*a*, 38*b* may be respectively provided at corners of the wick sheet 30.

Fifth Modification of Second Embodiment

In the above-described second embodiment, an example in which the wick sheet retracted portions 38*a*, 38*b*, 38*c*, 38*d* are retracted toward the vapor channel 50 beyond the outer periphery 11*o* of the lower sheet 10 and are retracted toward the vapor channel 50 beyond the outer periphery 21*o* of the upper sheet 20 in a plan view has been described (see FIG. 29). However, not limited to this configuration, the wick sheet retracted portions 38*a*, 38*b*, 38*c*, 38*d* do not need to be retracted toward the vapor channel 50 beyond the outer periphery 11*o* of the lower sheet 10 in a plan view. Alternatively, the wick sheet retracted portions 38*a*, 38*b*, 38*c*, 38*d* do not need to be retracted toward the vapor channel 50 beyond the outer periphery 21*o* of the upper sheet 20 in a plan view.

Figure 31:
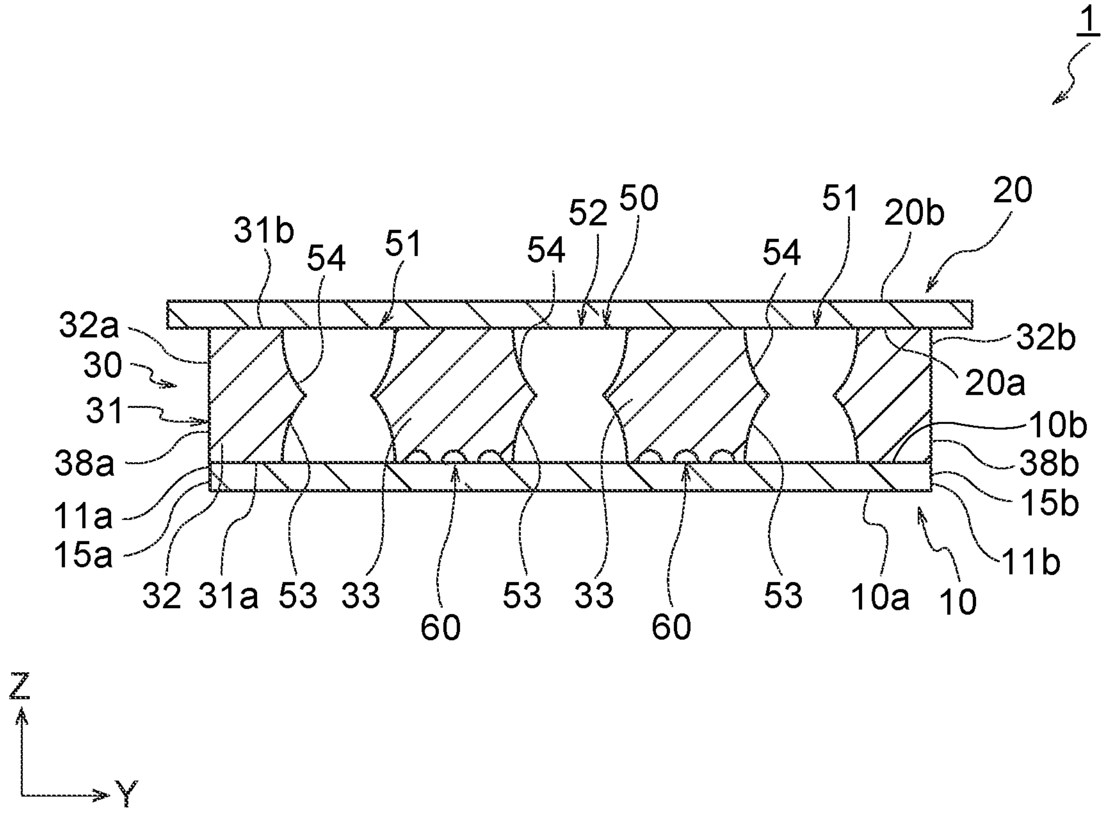
FIG. 31 is a modification (fifth modification) of FIG. 29.

In the example shown in FIG. 31, the wick sheet 30 is formed so as to be entirely smaller than the upper sheet 20 and is formed in the same size as the lower sheet 10 in a plan view. In other words, the wick sheet 30 and the lower sheet 10 are formed so as to be entirely smaller than the upper sheet 20 in a plan view. Thus, the wick sheet 30 has the wick sheet retracted portions 38*a*, 38*b*, 38*c*, 38*d* retracted toward the vapor channel 50 beyond the outer periphery 21*o* of the upper sheet 20 in a plan view.

In such a case as well, it is possible to put a predetermined apparatus or tool, a finger, or the like into the wick sheet retracted portions 38*a*, 38*b*, 38*c*, 38*d*, so it is possible to easily lift the vapor chamber 1. Therefore, it is possible to improve the conveyability of the vapor chamber 1.

The wick sheet 30 may be formed so as to be entirely smaller than the lower sheet 10 and may be formed in the same size as the upper sheet 20 in a plan view. In other words, the wick sheet 30 and the upper sheet 20 may be formed so as to be entirely smaller than the lower sheet 10 in a plan view. Thus, the wick sheet 30 has the wick sheet retracted portions 38*a*, 38*b*, 38*c*, 38*d* retracted toward the vapor channel 50 beyond the outer periphery 11*o* of the lower sheet 10 in a plan view.

In this case, a predetermined apparatus or tool, a finger, or the like is put into the wick sheet retracted portions 38*a*, 38*b*, 38*c*, 38*d* in a state where the vapor chamber 1 is placed in an opposite orientation, that is, in a state where the second upper sheet surface 20*b* of the upper sheet 20 is placed so as to face the placement surface 70. Thus, it is possible to easily lift the vapor chamber 1. Therefore, it is possible to improve the conveyability of the vapor chamber 1.

Sixth Modification of Second Embodiment

In the above-described second embodiment, an example in which no liquid channel 60 is provided between the vapor channel 50 and each of the wick sheet retracted portions 38*a*, 38*b*, 38*c*, 38*d* has been described (see FIG. 29). However, not limited to this configuration, as in the case of the sixth modification of the above-described first embodiment, the liquid channel 60 may be provided between the vapor channel 50 and each of the wick sheet retracted portions 38*a*, 38*b*, 38*c*, 38*d*.

Seventh Modification of Second Embodiment

In the above-described second embodiment, an example in which the vapor chamber 1 includes one wick sheet 30 has been described (see FIG. 29). However, not limited to this configuration, as in the case of the seventh modification of the first embodiment, the vapor chamber 1 may include a plurality of the wick sheets 30.

Eighth Modification of Second Embodiment

As in the case of the eighth modification of the above-described first embodiment, the vapor chamber 1 may have the through-hole 90.

Figure 32:
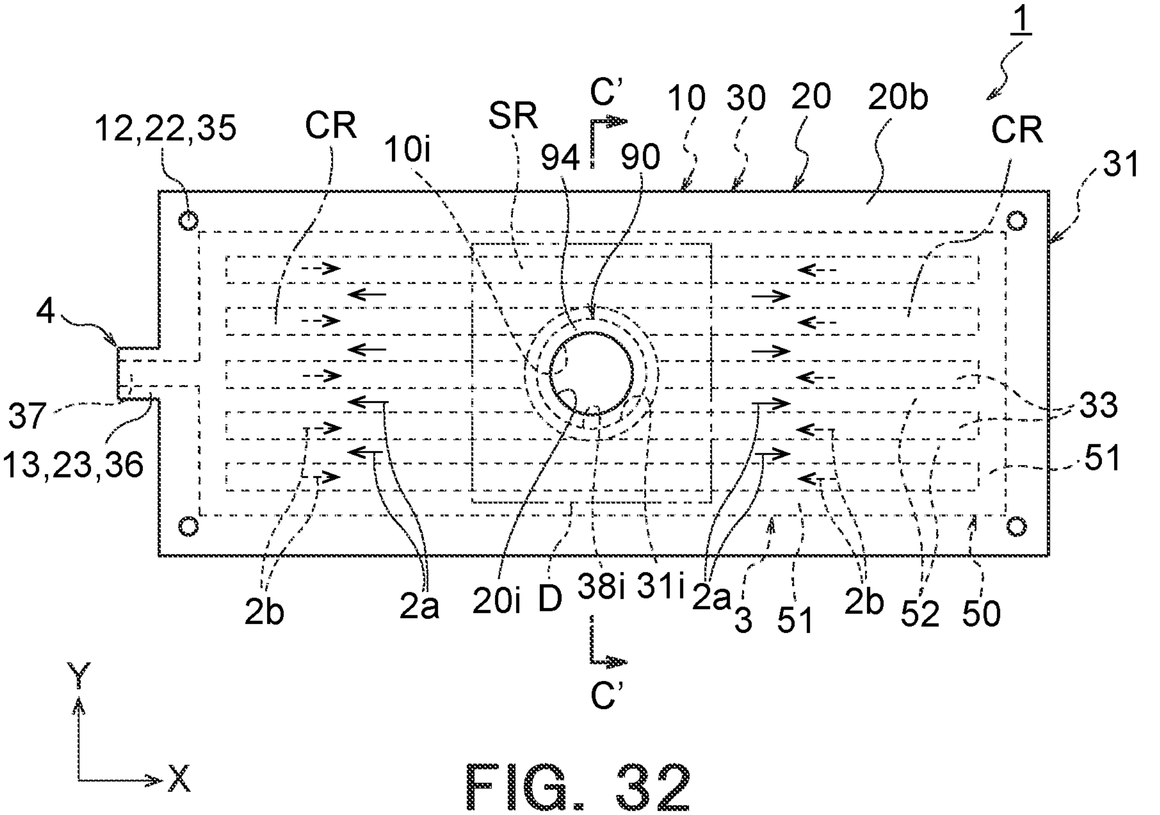
FIG. 32 is a modification (eighth modification) of FIG. 28.
Figure 33:
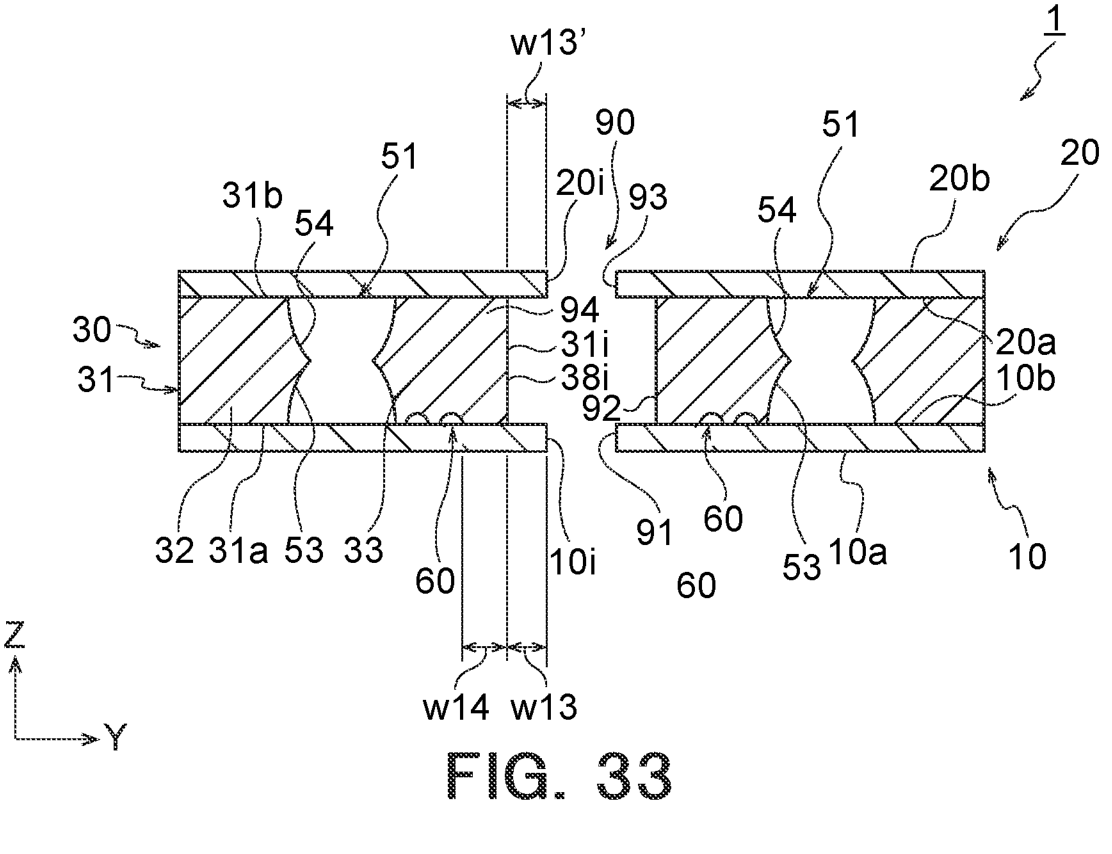
FIG. 33 is a sectional view taken along the line C'-C' in FIG. 32.

In the example shown in FIG. 32 and FIG. 33, in a plan view, the inner periphery 31*i* of the wick sheet 30, defining the wick sheet through portion 92, is located outside the inner periphery 10*i* of the lower sheet 10, defining the lower sheet through portion 91, and the inner periphery 20*i* of the upper sheet 20, defining the upper sheet through portion 93, that is, on an opposite side to the through-hole 90. Thus, the wick sheet 30 has a wick sheet retracted portion 38*i* retracted toward an opposite side to the through-hole 90 beyond the inner periphery 10*i* of the lower sheet 10, defining the through-hole 90, and the inner periphery 20*i* of the upper sheet 20, defining the through-hole 90, in a plan view.

The dimension w13 in the Y direction between the inner periphery 10*i* of the lower sheet 10 and the inner periphery 31*i* of the wick sheet 30, shown in FIG. 33, may, for example, range from 10 μm to 1000 μm. In other words, the wick sheet retracted portion 38*i* may be retracted to a position 10 μm or longer and 1000 μm or shorter away from the inner periphery 10*i* of the lower sheet 10 in a plan view.

The dimension w13' in the Y direction between the inner periphery 20*i* of the upper sheet 20 and the inner periphery 31*i* of the wick sheet 30, shown in FIG. 33, may, for example, range from 10 μm to 1000 μm. In other words, the wick sheet retracted portion 38*i* may be retracted to a position 10 am or longer and 1000 am or shorter away from the inner periphery 20*i* of the upper sheet 20 in a plan view. The dimension w13' may be equal to the above-described dimension w13, may be greater than the above-described dimension w13, or may be less than the above-described dimension w13.

The dimension w14 in the Y direction between the liquid channel 60 and the inner periphery 31*i* of the wick sheet 30, shown in FIG. 33, may, for example, range from 30 am to 3000 μm. Here, the dimension w14 means a dimension at the first main body surface 31*a* or the second main body surface 31*b*. In other words, the wick sheet retracted portion 38*i* may be provided at a position 30 μm or longer and 3000 μm or shorter away from the liquid channel 60. When the vapor channel 50 is provided between the liquid channel 60 and the inner periphery 31*i* of the wick sheet 30, the dimension in the Y direction between the vapor channel 50 and the inner periphery 31*i* of the wick sheet 30 may range from 30 μm to 3000 μm.

Figure 34:
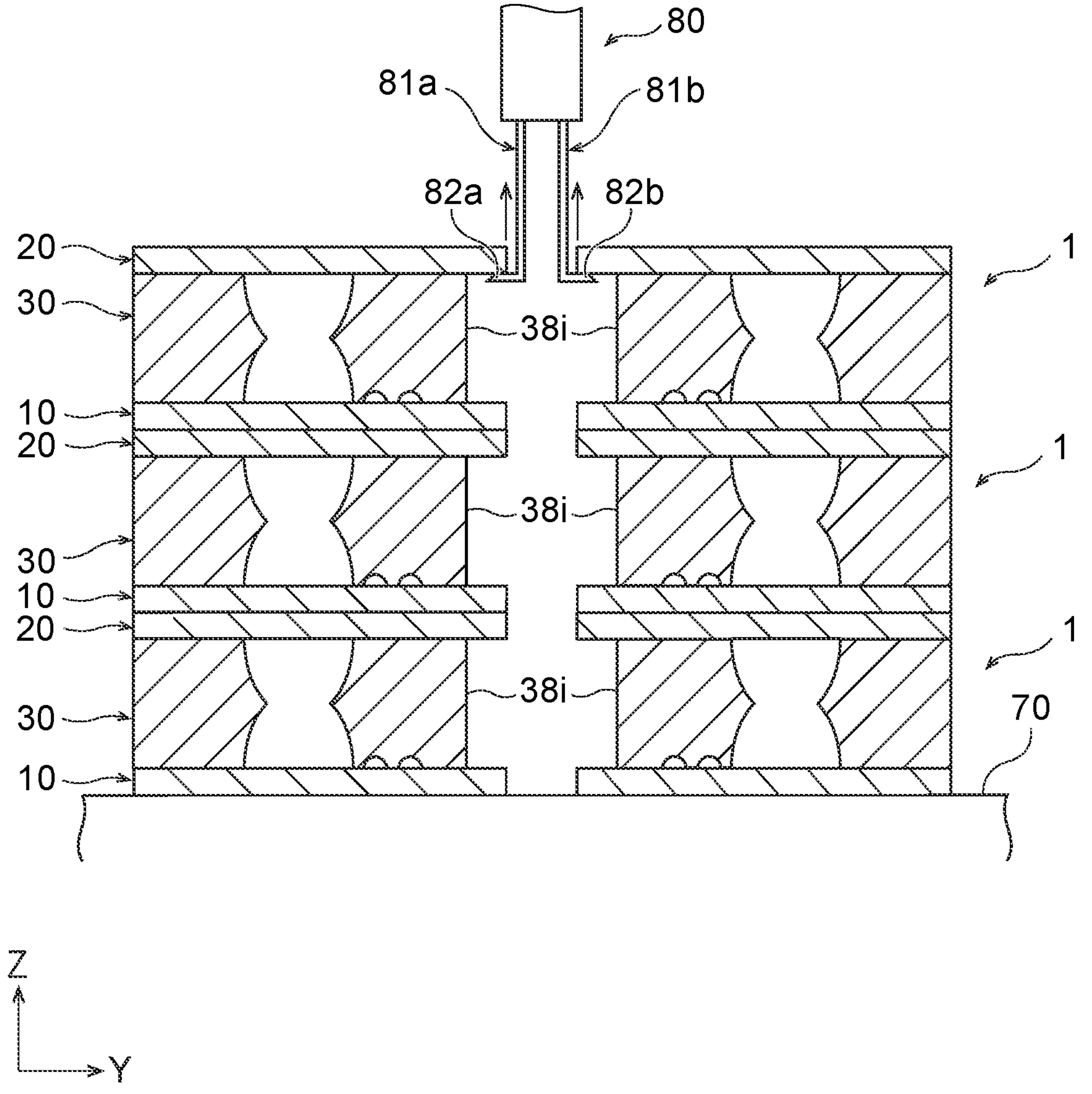
FIG. 34 is a view for illustrating a conveying method for the vapor chamber of FIG. 33.

In such a case as well, as shown in FIG. 34, it is possible to put the first arm 81*a* and the second arm 81*b*, or the like, of the suspending apparatus 80 into the wick sheet retracted portion 38*i*, so it is possible to easily lift the vapor chamber 1. Therefore, it is possible to improve the conveyability of the vapor chamber 1.

In this way, since the wick sheet retracted portion 38*i* is retracted 10 μm or greater, it is possible to firmly support the first upper sheet surface 20*a* of the upper sheet 20 with the hooks 82*a*, 82*b*, or the like, of the suspending apparatus 80. Therefore, it is possible to further easily lift the vapor chamber 1. As a result, it is possible to further improve the conveyability of the vapor chamber 1. Since the wick sheet retracted portion 38*i* is retracted 1000 μm or less, it is possible to effectively use the region of the vapor chamber 1. In other words, it is possible to provide the vapor channel 50 and the liquid channel 60 in a further wide region of the vapor chamber 1, so it is possible to improve the performance of the vapor chamber 1.

When the distance between the vapor channel 50 and the wick sheet retracted portion 38*i* is greater than or equal to 30 μm, it is possible to firmly join the first main body surface 31*a* with the first upper sheet surface 20*a* in the joining process during manufacturing of the vapor chamber 1. Therefore, it is possible to suppress a decrease in the strength of the vapor chamber 1.

When the vapor chamber 1 is made up of the lower sheet 10, the upper sheet 20, and the wick sheet 30, it is possible to dissipate heat, received by the lower sheet 10 from the device D, through the upper sheet 20. Thus, it is possible to effectively cool the device D. Therefore, it is possible to improve the performance of the vapor chamber 1.

The wick sheet retracted portion 38*i* is retracted toward the vapor channel 50 beyond the inner periphery 10*i* of the lower sheet 10 in a plan view. As a result, even when the vapor chamber 1 is placed in an opposite orientation, that is, even when the second upper sheet surface 20*b* of the upper sheet 20 is placed so as to face the placement surface 70, it is possible to easily lift the vapor chamber by bringing the hooks 82*a*, 82*b*, or the like, of the suspending apparatus 80 into contact with the second lower sheet surface 10*b* of the lower sheet 10 and moving the hooks 82*a*, 82*b*, or the like, of the suspending apparatus 80 upward. Therefore, even when the vapor chamber 1 is placed in an opposite orientation, it is possible to easily convey the vapor chamber 1. As a result, it is possible to further improve the conveyability of the vapor chamber 1.

Ninth Modification of Second Embodiment

In the above-described first embodiment, an example in which the vapor chamber 1 is made up of the lower sheet 10, the upper sheet 20, and the wick sheet 30 has been described. However, not limited to this configuration, as in the case of the ninth modification of the above-described first embodiment, the vapor chamber 1 may be made up of the lower sheet 10 (first sheet) and the wick sheet 30 (main body sheet).

Third Embodiment

Next, a vapor chamber and an electronic apparatus according to a third embodiment will be described with reference to FIG. 35 to FIG. 41.

Figure 35:
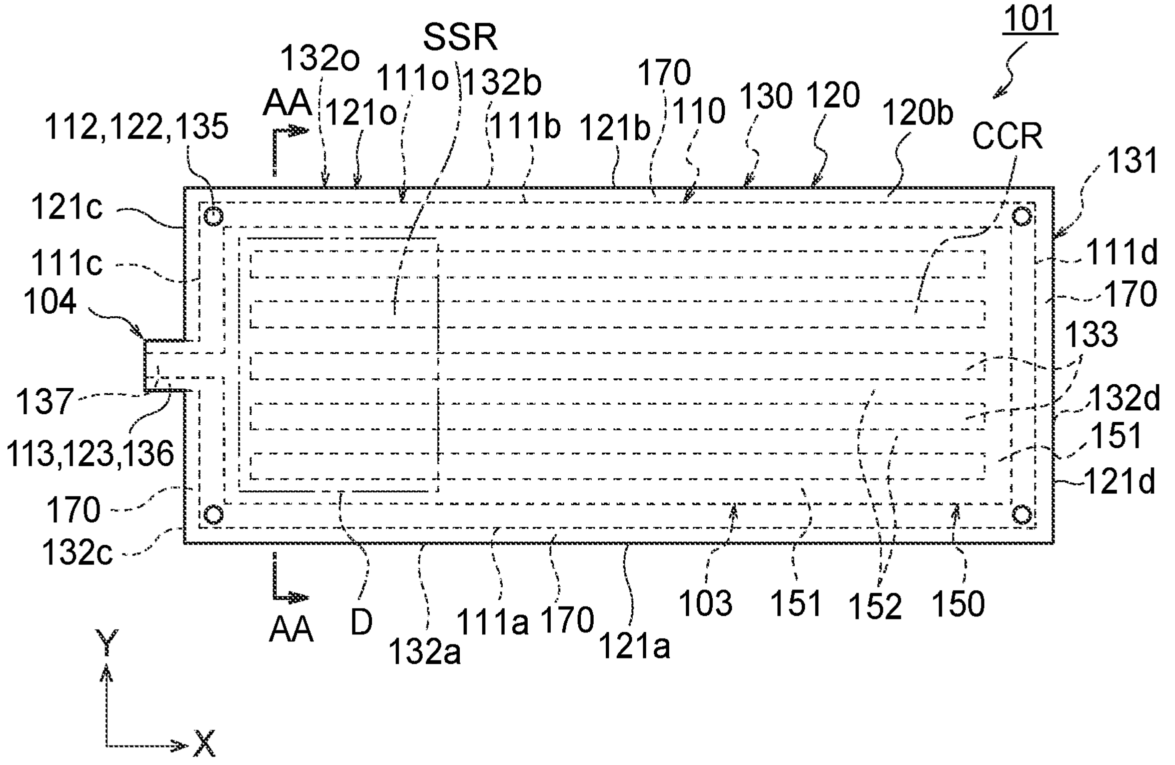
FIG. 35 is a top view showing a vapor chamber according to a third embodiment.
Figure 36:
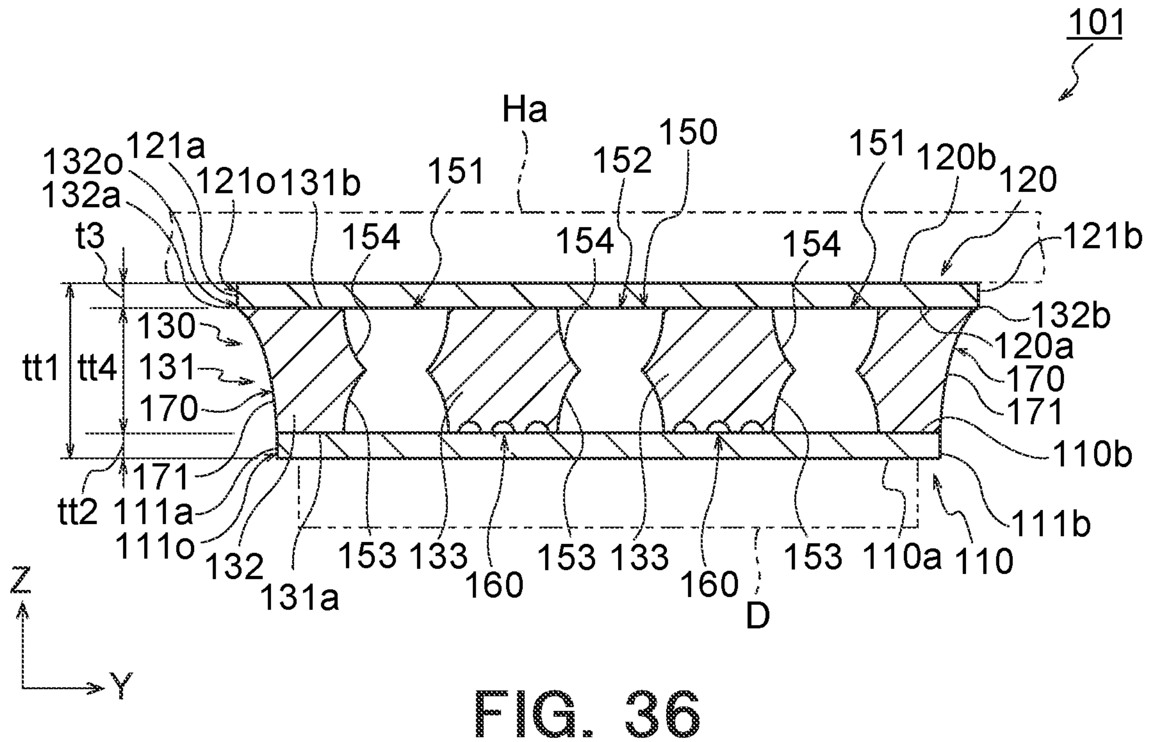
FIG. 36 is a sectional view taken along the line AA-AA in FIG. 35.

As shown in FIG. 35 and FIG. 36, a vapor chamber 101 according to the present embodiment has a sealed space 103 in which the working fluids 2*a*, 2*b* are filled. As the working fluids 2*a*, 2*b* in the sealed space 103 repeat a phase change, the device D of the above-described electronic apparatus E is cooled.

As shown in FIG. 35 and FIG. 36, the vapor chamber 101 includes a lower sheet 110 (first sheet), an upper sheet 120 (second sheet), and a vapor chamber wick sheet 130 (main body sheet) interposed between the lower sheet 110 and the upper sheet 120. In the present embodiment, the vapor chamber 101 includes one wick sheet 130. In the vapor chamber 101 according to the present embodiment, the lower sheet 110, the wick sheet 130, and the upper sheet 120 are laminated in this order and joined.

The vapor chamber 101 is schematically formed in a thin sheet shape. The planar shape of the vapor chamber 101 is selectable and may be a rectangular shape as shown in FIG. 35. The planar shape of the vapor chamber 101 may be, for example, a rectangular shape with one side having a length of 1 cm and the other side having a length of 3 cm or may be a square shape with one side having a length of 15 cm. The plane dimensions of the vapor chamber 101 are selectable. In the present embodiment, in an example, an example in which the planar shape of the vapor chamber 101 is a rectangular shape having an X direction as a longitudinal direction will be described. The planar shape of the vapor chamber 101 is not limited to a rectangular shape and may be a selected shape, such as a circular shape, an elliptical shape, an L-shape, and a T-shape.

As shown in FIG. 35, the vapor chamber 101 has a vaporization region SSR where the working fluids 2*a*, 2*b* vaporize and a condensation region CCR where the working fluids 2*a*, 2*b* condense.

The vaporization region SSR is a region that overlaps the device D in a plan view and is a region in which the device D is attached. The vaporization region SSR may be disposed in a selected place of the vapor chamber 101. In the present embodiment, the vaporization region SSR is formed on one side (left side in FIG. 35) of the vapor chamber 101 in the X direction. Heat from the device D is transferred to the vaporization region SSR, and liquid (working liquid 2*b*) of the working fluid vaporizes in the vaporization region SSR due to the heat. Heat from the device D can be transferred not only to the region that overlaps the device D in a plan view but also to around the region. For this reason, the vaporization region SSR includes a region that overlaps the device D and a region therearound in a plan view. Here, the plan view corresponds to a state viewed in a direction orthogonal to a surface that the vapor chamber 101 receives heat from the device D (a first lower sheet surface 110*a* (described later) of the lower sheet 110) and a surface that the vapor chamber 101 releases heat received (a second upper sheet surface 120*b* (described later) of the upper sheet 120) and a state when the vapor chamber 101 is viewed from above or a state when the vapor chamber 101 is viewed from below, for example, as shown in FIG. 35.

The condensation region CCR is a region that does not overlap the device D in a plan view and is a region where vapor of working fluid (working vapor 2*a*) mainly releases heat to condense. The condensation region CCR may also be referred to as a region around the vaporization region SSR. In the present embodiment, the condensation region CCR is formed on the other side (right side in FIG. 35) of the vapor chamber 101 in the X direction. Heat from the working vapor 2*a* is released to the upper sheet 120 in the condensation region CCR, and the working vapor 2*a* is cooled in the condensation region CCR to condense.

When the vapor chamber 101 is installed in a mobile terminal, an upper and lower relation can be lost depending on the attitude of the mobile terminal. However, in the present embodiment, for the sake of convenience, a sheet that receives heat from the device D is referred to as the above-described lower sheet 110, and a sheet that releases the received heat is referred to as the above-described upper sheet 120. Therefore, the description will be made in a state where the lower sheet 110 is disposed on the lower side and the upper sheet 120 is disposed on the upper side.

Initially, the lower sheet 110 will be described.

As shown in FIG. 36, the lower sheet 110 has the first lower sheet surface 110*a* provided on an opposite side to the wick sheet 130 and a second lower sheet surface 110*b* provided on an opposite side to the first lower sheet surface 110*a* (that is, adjacent to the wick sheet 130). The lower sheet 110 may be formed entirely in a flat shape and may entirely have a constant thickness. The above-described device D is attached to the first lower sheet surface 110*a*.

Figure 37:
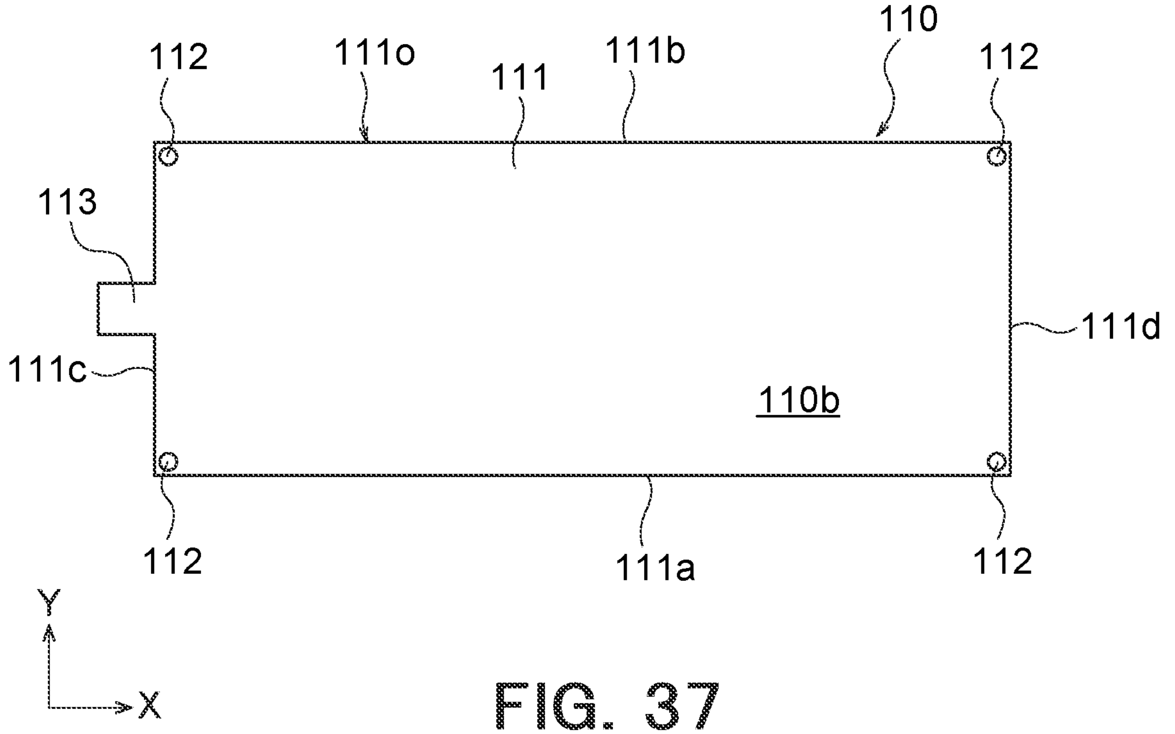
FIG. 37 is a top view of a lower sheet of FIG. 36.

As shown in FIG. 37, the planar shape of the lower sheet 110 may be entirely a rectangular shape. More specifically, the lower sheet 110 may have a pair of long side edges 111*a*, 111*b* (first side edges) extending in the X direction (first direction) and a pair of short side edges 111*c*, 111*d* (second side edges) extending in a Y direction (second direction) orthogonal to the X direction in a plan view. The long side edges 111*a*, 111*b* are respectively provided on both sides in the Y direction. The long side edge 111*a* is provided on one side (lower side in FIG. 37) in the Y direction, and the long side edge 111*b* is provided on the other side (upper side in FIG. 37) in the Y direction. The short side edges 111*c*, 111*d* are respectively provided on both sides in the X direction. The short side edge 111*c* is provided on one side (left side in FIG. 37) in the X direction, and the short side edge 111*d* is provided on the other side (right side in FIG. 37) in the X direction. These pair of long side edges 111*a*, 111*b* and pair of short side edges 111*c*, 111*d* make up the outer periphery 111*o* of the lower sheet 110 in a plan view.

As shown in FIG. 35 and FIG. 36, the lower sheet 110 is formed so as to be entirely smaller than the upper sheet 120 (described later) in a plan view. Therefore, the outer periphery 111*o* of the lower sheet 110 is located inside the outer periphery 121*o* of the upper sheet 120 (adjacent to the vapor channel 150 (described later)) in a plan view. In other words, the long side edges 111*a*, 111*b* and the short side edges 111*c*, 111*d* of the lower sheet 110 are respectively located inside the long side edges 121*a*, 121*b* and the short side edges 121*c*, 121*d* of the upper sheet 120 (described later).

As shown in FIG. 37, the lower sheet 110 may have a rectangular lower sheet main body 111 and a lower sheet filling protrusion 113 protruding outward from the lower sheet main body 111. In the example shown in FIG. 37, the lower sheet filling protrusion 113 is provided at the short side edge 111*c* and protrudes from the short side edge 111*c* toward one side (left side in FIG. 37) in the X direction.

As shown in FIG. 37, alignment holes 112 may be respectively provided at four corners of the lower sheet main body 111 of the lower sheet 110. In the example shown in FIG. 37, the planar shape of each alignment hole 112 is a circular shape; however, the planar shape is not limited thereto. The alignment holes 112 may extend through the lower sheet main body 111.

Next, the upper sheet 120 will be described.

As shown in FIG. 36, the upper sheet 120 has a first upper sheet surface 120*a* provided adjacent to the wick sheet 130 and the second upper sheet surface 120*b* provided on an opposite side to the first upper sheet surface 120*a*. The upper sheet 120 may be formed entirely in a flat shape and may entirely have a constant thickness. A housing member Ha that is part of the housing H of the mobile terminal or the like is attached to the second upper sheet surface 120*b*. The whole of the second upper sheet surface 120*b* may be covered with the housing member Ha.

Figure 38:
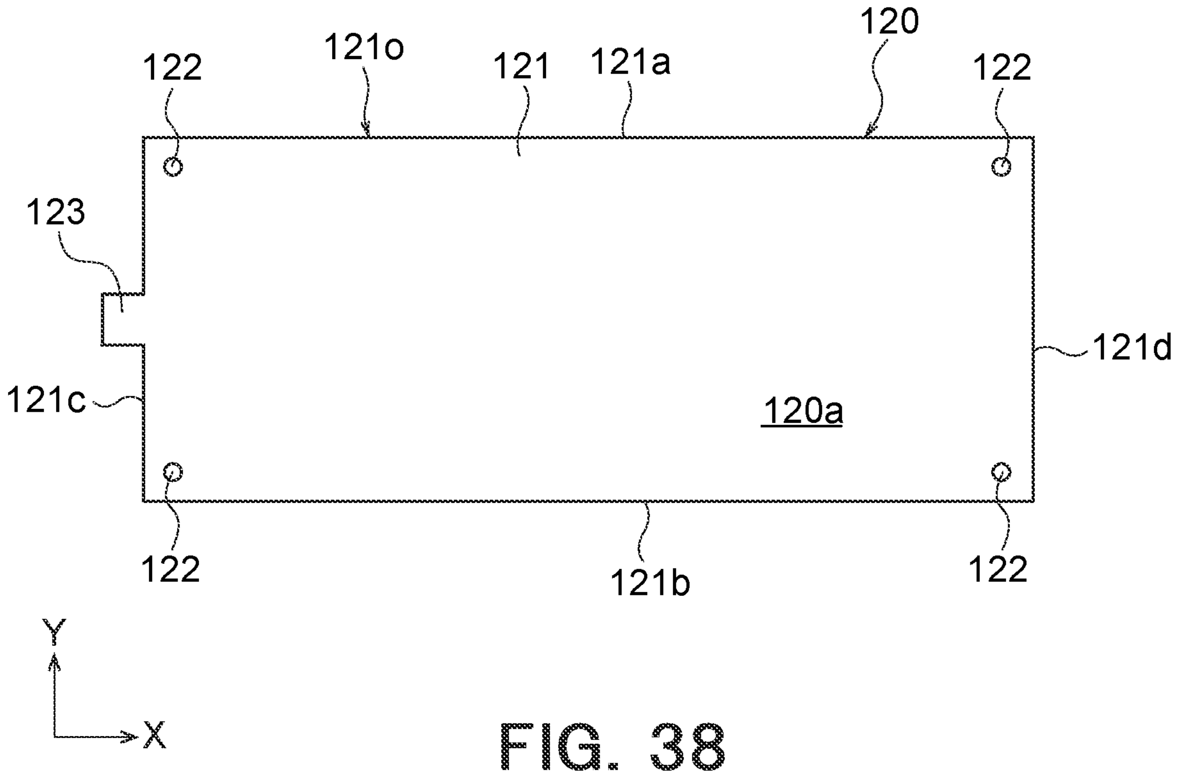
FIG. 38 is a bottom view of an upper sheet of FIG. 36.

As shown in FIG. 38, the planar shape of the upper sheet 120 may be entirely a rectangular shape. More specifically, the upper sheet 120 may have a pair of long side edges 121*a*, 121*b* extending in the X direction and a pair of short side edges 121*c*, 121*d* extending in the Y direction in a plan view. The long side edges 121*a*, 121*b* are respectively provided on both sides in the Y direction. The long side edge 121*a* is provided on one side (lower side in FIG. 38) in the Y direction, and the long side edge 121*b* is provided on the other side (upper side in FIG. 38) in the Y direction. The short side edges 121*c*, 121*d* are respectively provided on both sides in the X direction. The short side edge 121*c* is provided on one side (left side in FIG. 38) in the X direction, and the short side edge 121*d* is provided on the other side (right side in FIG. 38) in the X direction. These pair of long side edges 121*a*, 121*b* and pair of short side edges 121*c*, 121*d* make up the outer periphery 121*o* of the upper sheet 120 in a plan view.

As shown in FIG. 35 and FIG. 36, the upper sheet 120 is formed so as to be entirely larger than the above-described lower sheet 110 in a plan view. Therefore, the outer periphery 121*o* of the upper sheet 120 is located outside the outer periphery 111*o* of the lower sheet 110 (toward an opposite side to the vapor channel 150 (described later)) in a plan view. In other words, the long side edges 121*a*, 121*b* and the short side edges 121*c*, 121*d* of the upper sheet 120 are respectively located outside the long side edges 111*a*, 111*b* and the short side edges 111*c*, 111*d* of the above-described lower sheet 110.

As shown in FIG. 38, the upper sheet 120 may have a rectangular upper sheet main body 121 and an upper sheet filling protrusion 123 protruding outward from the upper sheet main body 121. In the example shown in FIG. 38, the upper sheet filling protrusion 123 is provided at the short side edge 121*c* and protrudes from the short side edge 121*c* toward one side (left side in FIG. 38) in the X direction.

As shown in FIG. 38, alignment holes 122 may be respectively provided at four corners of the upper sheet main body 121 of the upper sheet 120. In the example shown in FIG. 38, the planar shape of each alignment hole 122 is a circular shape; however, the planar shape is not limited thereto. The alignment holes 112 may extend through the upper sheet main body 121.

Next, the wick sheet 130 will be described.

As shown in FIG. 36, the wick sheet 130 includes a sheet main body 131 and the vapor channel 150 (space) provided in the sheet main body 131. The sheet main body 131 has a first main body surface 131*a* and a second main body surface 131*b* provided on an opposite side to the first main body surface 131*a*. The first main body surface 131*a* is disposed adjacent to the lower sheet 110, and the second main body surface 131*b* is disposed adjacent to the upper sheet 120.

The second lower sheet surface 110*b* of the lower sheet 110 and the first main body surface 131*a* of the sheet main body 131 may be permanently joined with each other by thermocompression bonding. Similarly, the first upper sheet surface 120*a* of the upper sheet 120 and the second main body surface 131*b* of the sheet main body 131 may be permanently joined with each other by thermocompression bonding. Examples of joining by thermocompression bonding may include diffusion joining. However, the lower sheet 110, the upper sheet 120, and the wick sheet 130 may be joined not by diffusion joining but by another method, such as brazing, as long as they can be permanently joined. The term "permanently joined" is not limited to a strict meaning and is used as a term meaning that a joint of the lower sheet 110 with the wick sheet 130 can be maintained and a joint of the upper sheet 120 with the wick sheet 130 can be maintained to such an extent that the sealability of the sealed space 3 can be maintained during operation of the vapor chamber 101.

Figure 39:
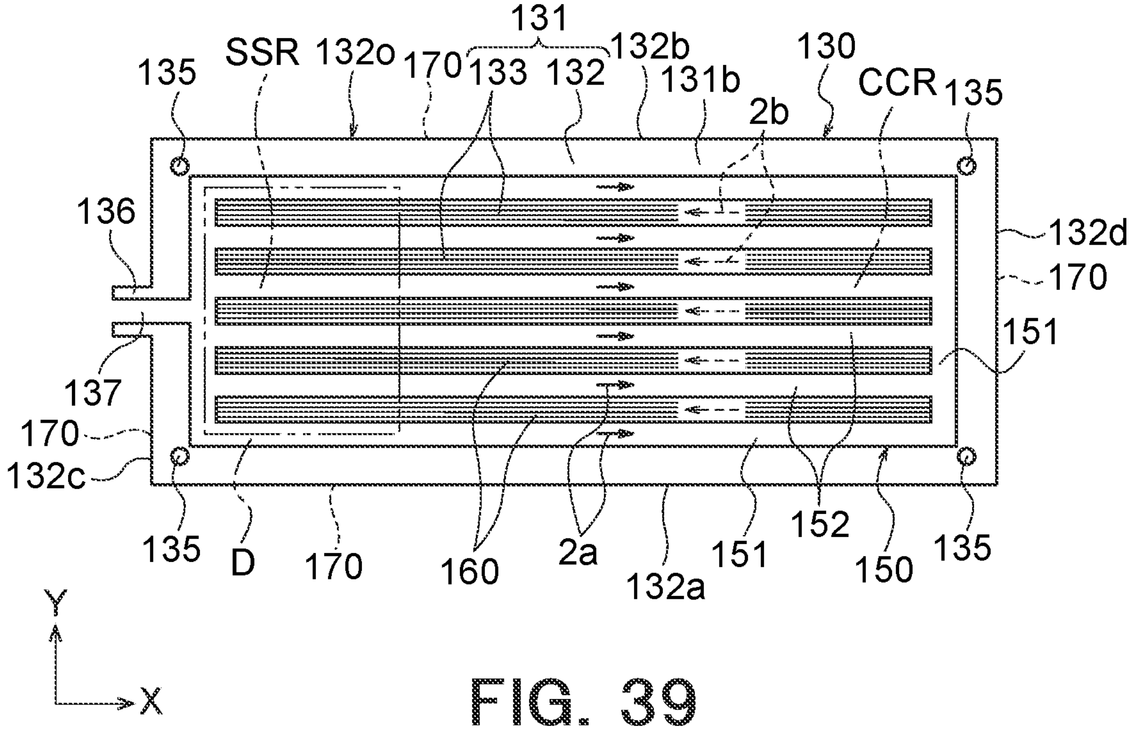
FIG. 39 is a top view of a wick sheet of FIG. 36.

As shown in FIG. 39, the outline shape of the wick sheet 130 may be entirely a rectangular shape in a plan view. More specifically, the wick sheet 130 may have a pair of long side edges 132*a*, 132*b* extending in the X direction and a pair of short side edges 132*c*, 132*d* extending in the Y direction in a plan view. The long side edges 132*a*, 132*b* are respectively provided on both sides in the Y direction. The long side edge 132*a* is provided on one side (lower side in FIG. 39) in the Y direction, and the long side edge 132*b* is provided on the other side (upper side in FIG. 39) in the Y direction. The short side edges 132*c*, 132*d* are respectively provided on both sides in the X direction. The short side edge 132*c* is provided on one side (left side in FIG. 39) in the X direction, and the short side edge 132*d* is provided on the other side (right side in FIG. 39) in the X direction. These pair of long side edges 132*a*, 132*b* and pair of short side edges 132*c*, 132*d* make up the outer periphery 132*o* of the wick sheet 130 in a plan view.

As shown in FIG. 35 and FIG. 36, the outer periphery 132*o* of the wick sheet 130 overlaps the outer periphery 121*o* of the upper sheet 120 in a plan view. In other words, the long side edges 132*a*, 132*b* and the short side edges 132*c*, 132*d* of the wick sheet 130 respectively overlap the long side edges 121*a*, 121*b* and the short side edges 121*c*, 121*d* of the upper sheet 120. The wick sheet 130 includes a retracted portion 170 retracted (toward the vapor channel 150 (described later)) beyond the outer periphery 132*o*. The details of the retracted portion 170 will be described later.

As shown in FIG. 39, the wick sheet 130 may have a wick sheet filling protrusion 136 that protrudes outward from a frame 132 (described later). In the example shown in FIG. 39, the wick sheet filling protrusion 136 is provided at the short side edge 132*c* and protrudes from the short side edge 132*c* toward one side (left side in FIG. 39) in the X direction.

As shown in FIG. 39, alignment holes 135 may be respectively provided at four corners of the sheet main body 131 of the wick sheet 130. In the example shown in FIG. 39, the planar shape of each alignment hole 135 is a circular shape; however, the planar shape is not limited thereto. The alignment holes 135 may extend through the sheet main body 131.

As shown in FIG. 36 and FIG. 39, the sheet main body 131 of the wick sheet 130 according to the present embodiment has the frame 132 formed in a rectangular frame shape in a plan view and a plurality of lands 133 provided inside the frame 132. The frame 132 and the lands 133 are portions where the material of the wick sheet 130 is left without being etched in an etching process (described later).

In the present embodiment, the frame 132 is formed in a rectangular frame shape in a plan view. The vapor channel 150 (space) is provided inside the frame 132. The lands 133 are provided in the vapor channel 150, and the working vapor 2*a* flows around each of the lands 133. In other words, the vapor channel 150 includes the above-described plurality of lands 133 and vapor passages 151, 152 (described later) that are provided around each of the lands 133 and that are passages through which the working vapor 2*a* flows.

In the present embodiment, each of the lands 133 may extend in a long slender shape in the X direction (right and left direction in FIG. 39) as a longitudinal direction in a plan view, and the planar shape of each of the lands 133 may be a long slender rectangular shape. The lands 133 may be disposed parallel to one another at equal intervals in the Y direction (up and down direction in FIG. 39) orthogonal to the X direction. The width ww1 (see FIG. 40) of the land 133 may, for example, range from 100 μm to 1500 μm. Here, the width ww1 of the land 133 is the dimension of the land 133 in the Y direction and means a dimension at a position where a through portion 134 (described later) is present in a Z direction. Here, the Z direction corresponds to the up and down direction in FIG. 36 and FIG. 40 and corresponds to the thickness direction of the wick sheet 130.

The frame 132 and the lands 133 are joined to the lower sheet 110 by thermocompression bonding and are joined to the upper sheet 120 by thermocompression bonding. Wall surfaces 153*a* of lower vapor channel recesses 153 and wall surfaces 154*a* of upper vapor channel recesses 154 (described later) are components of side walls of the lands 133. The first main body surface 131*a* and the second main body surface 131*b* of the sheet main body 131 may be formed in a flat shape over the frame 132 and the lands 133.

Figure 40:
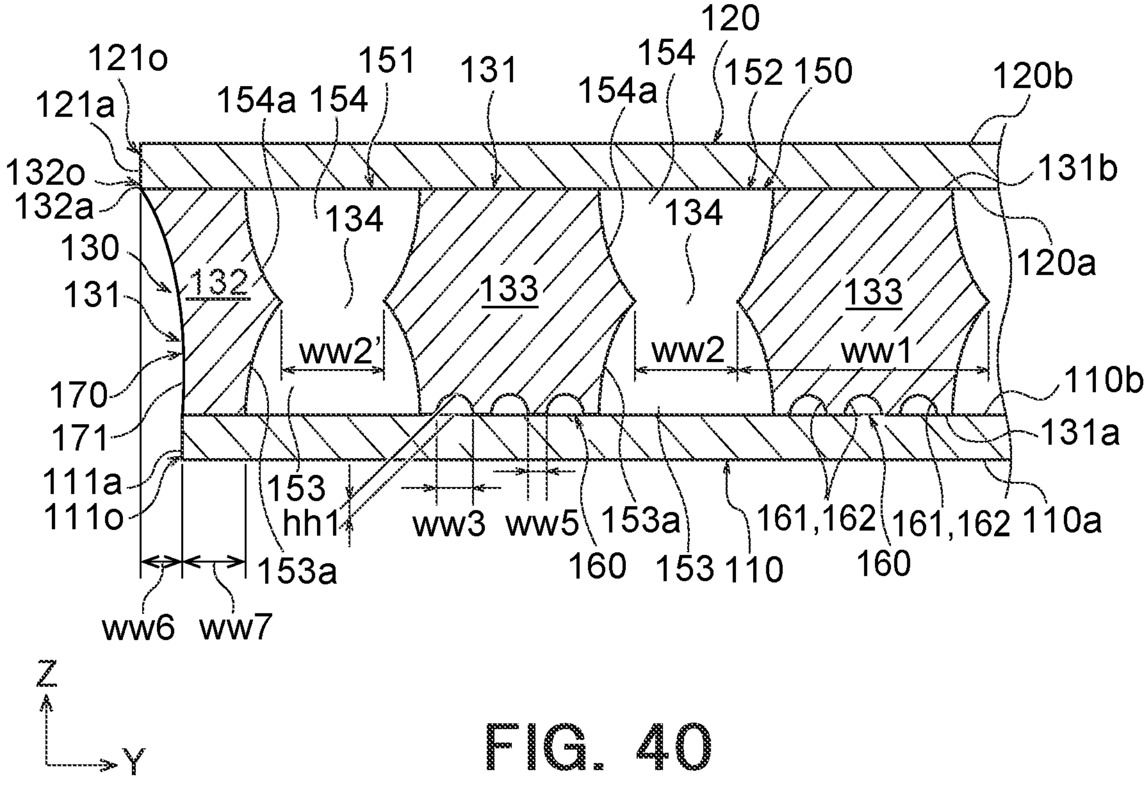
FIG. 40 is a partially enlarged sectional view of FIG. 36.

The vapor channel 150 is mainly a channel through which the working vapor 2*a* passes. The working liquid 2*b* may also pass through the vapor channel 150. As shown in FIG. 36 and FIG. 40, the vapor channel 150 may extend through from the first main body surface 131*a* to the second main body surface 131*b*. In other words, the vapor channel 150 may extend through the sheet main body 131 of the wick sheet 130. The vapor channel 150 may be covered with the lower sheet 110 on the first main body surface 131*a* and may be covered with the upper sheet 120 on the second main body surface 131*b*.

As shown in FIG. 39, the vapor channel 150 according to the present embodiment has a first vapor passage 151 and a plurality of second vapor passages 152. The first vapor passage 151 is formed between the frame 132 and the lands 133. The first vapor passage 151 is formed continuously inside the frame 132 and outside the lands 133. The planar shape of the first vapor passage 151 is a rectangular frame shape. Each of the second vapor passages 152 is formed between any adjacent two of the lands 133. The planar shape of each second vapor passage 152 is a long slender rectangular shape. The vapor channel 150 is partitioned by the plurality of lands 133 into the first vapor passage 151 and the plurality of second vapor passages 152.

As shown in FIG. 36, the first vapor passage 151 and the second vapor passages 152 extend through from the first main body surface 131*a* to the second main body surface 131*b* of the sheet main body 131. In other words, the first vapor passage 151 and the second vapor passages 152 extend through the wick sheet 130 in the Z direction. Each of the first vapor passage 151 and the second vapor passages 152 is made up of the lower vapor channel recess 153 provided on the first main body surface 131*a* and the upper vapor channel recess 154 provided on the second main body surface 131*b*. The lower vapor channel recess 153 and the upper vapor channel recess 154 communicate with each other, so each of the first vapor passage 151 and the second vapor passages 152 of the vapor channel 150 is formed so as to extend from the first main body surface 131*a* to the second main body surface 131*b*.

The lower vapor channel recesses 153 are formed in a concave shape on the first main body surface 131*a* by etching from the first main body surface 131*a* of the wick sheet 130 in the etching process (described later). As a result, each lower vapor channel recess 153 has a wall surface 153*a* formed in a curved shape as shown in FIG. 40. The wall surface 153*a* defines the lower vapor channel recess 153 and is, in a cross section shown in FIG. 40, curved so as to approach the facing wall surface 153*a* as approaching toward the second main body surface 131*b*. The thus configured lower vapor channel recesses 153 are part (lower half) of the first vapor passage 151 and parts (lower halves) of the second vapor passages 152.

The upper vapor channel recesses 154 are formed in a concave shape at the second main body surface 131*b* by etching from the second main body surface 131*b* of the wick sheet 130 in the etching process (described later). As a result, each upper vapor channel recess 154 has a wall surface 154*a* formed in a curved shape as shown in FIG. 40. The wall surface 154*a* defines the upper vapor channel recess 154 and is, in a cross section shown in FIG. 40, curved so as to approach the facing wall surface 154*a* toward the first main body surface 131*a*. The thus configured upper vapor channel recesses 154 are part (upper half) of the first vapor passage 151 and parts (upper halves) of the second vapor passages 152.

As shown in FIG. 40, the wall surface 153*a* of the lower vapor channel recess 153 and the wall surface 154*a* of the upper vapor channel recess 154 are connected to be continuous to form the through portion 134. The wall surface 153*a* and the wall surface 154*a* both are curved toward the through portion 134. As a result, the lower vapor channel recess 153 and the upper vapor channel recess 154 communicate with each other. In the present embodiment, the planar shape of the through portion 134 in the first vapor passage 151 is a rectangular frame shape as in the case of the first vapor passage 151, and the planar shape of the through portion 134 in the second vapor passage 152 is a long slender rectangular shape as in the case of the second vapor passage 152. The through portion 134 may be defined by ridge lines formed such that the wall surface 153*a* of the lower vapor channel recess 153 and the wall surface 154*a* of the upper vapor channel recess 154 merge with each other and project inward. A plane area of the vapor channel 150 is minimum at the through portion 134. The width ww2 and width ww2' (see FIG. 40) of the thus configured through portions 134 may, for example, range from 400 μm to 1600 μm. Here, the width ww2 of the through portion 134 corresponds to a gap between the adjacent lands 133 in the Y direction. The width ww2' of the through portion 134 corresponds to a gap between the frame 132 and the land 133 in the Y direction (or the X direction).

The position of the through portion 134 in the Z direction may be an intermediate position between the first main body surface 131*a* and the second main body surface 131*b* or may be a position shifted downward or upward from the intermediate position. As long as the lower vapor channel recess 153 and the upper vapor channel recess 154 communicate with each other, the position of the through portion 134 is selectable.

In the present embodiment, the sectional shape of each of the first vapor passage 151 and the second vapor passages 152 is formed so as to include the through portion 134 defined by ridge lines formed to extend inward; however, the configuration is not limited thereto. For example, the sectional shape of the first vapor passage 151 and the sectional shape of each second vapor passage 152 may be a trapezoidal shape or a rectangular shape or may be a barrel shape.

The vapor channel 150 including the first vapor passage 151 and the second vapor passages 152 configured in this way is part of the above-described sealed space 103. Each of the vapor passages 151, 152 has a relatively large channel cross-sectional area such that the working vapor 2*a* passes.

Here, FIG. 36 shows the first vapor passage 151, the second vapor passages 152, and the like in a magnified view for clear illustration, and the numbers and layout of these vapor passages 151, 152, and the like differ from those in FIG. 35 or FIG. 39.

Incidentally, although not shown in the drawings, a plurality of supporting portions that support the lands 133 on the frame 132 may be provided in the vapor channel 150. Supporting portions that each support adjacent two of the lands 133 may be provided. These supporting portions may be provided on both sides of the land 133 in the X direction or may be provided on both sides of the land 133 in the Y direction. The supporting portion may be formed so as not to impede flow of the working vapor 2*a* that diffuses in the vapor channel 150. For example, a supporting portion may be disposed on one of the first main body surface 131*a* and the second main body surface 131*b* of the sheet main body 131 of the wick sheet 130, and a space that forms a vapor channel recess may be formed on the other side. As a result, the thickness of the supporting portion can be made less than the thickness of the sheet main body 131, so it is possible to suppress separation of each of the first vapor passage 151 and the second vapor passages 152 in the X direction or in the Y direction.

As shown in FIG. 36, FIG. 39, and FIG. 40, a liquid channel 160 (groove) through which the working liquid 2*b* mainly passes is provided at the first main body surface 131*a* of the sheet main body 131 of the wick sheet 130. More specifically, the liquid channel 160 is provided at the first main body surface 131*a* of each of the lands 133 of the wick sheet 130. The working vapor 2*a* may also pass through the liquid channel 160. The liquid channel 160 is part of the above-described sealed space 103 and communicates with the vapor channel 150. The liquid channel 160 is configured as a capillary structure (wick) for transporting the working liquid 2*b* to the vaporization region SSR. The liquid channel 160 may be formed over the entire first main body surface 131*a* of each land 133. The liquid channel 160 does not need to be provided at the second main body surface 131*b* of each land 133.

Figure 41:
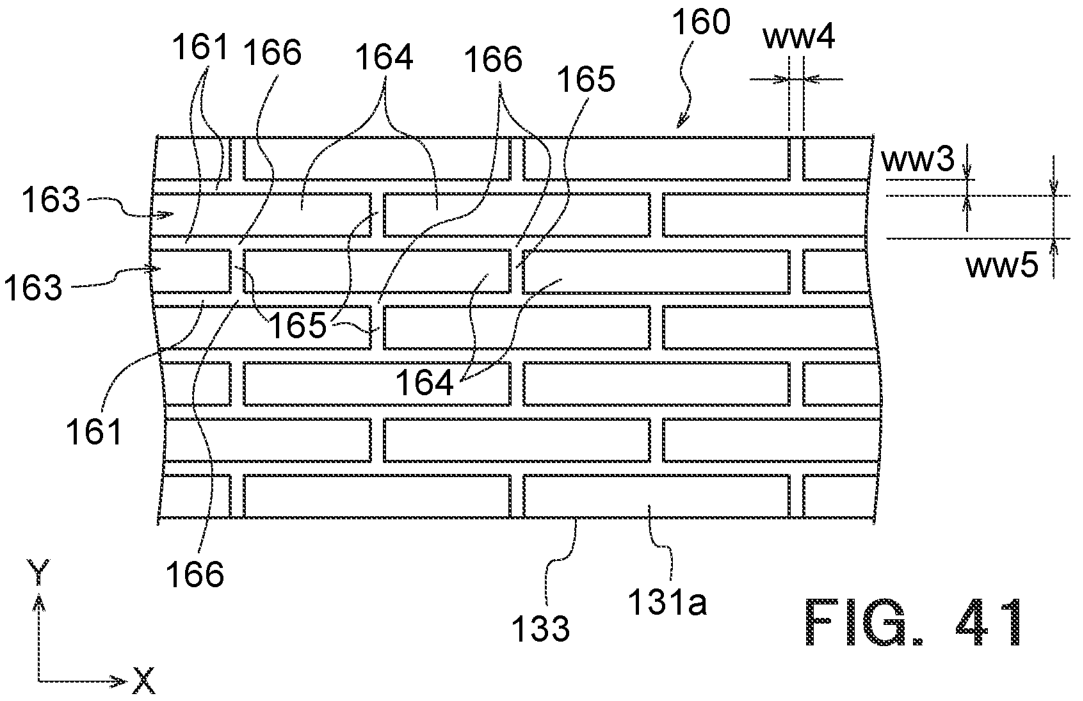
FIG. 41 is a partially enlarged bottom view of a liquid channel shown in FIG. 40.

As shown in FIG. 41, the liquid channel 160 is made up of a plurality of grooves provided on the first main body surface 131*a*. More specifically, the liquid channel 160 has a plurality of liquid channel main stream grooves 161 through which the working liquid 2*b* passes and a plurality of liquid channel communication grooves 165 that communicate with the liquid channel main stream grooves 161.

As shown in FIG. 41, each liquid channel main stream groove 161 is formed so as to extend in the X direction. The liquid channel main stream groove 161 has a channel cross-sectional area smaller than that of the first vapor passage 151 or the second vapor passage 152 of the vapor channel 150 such that the working liquid 2*b* mainly flows by capillary action. As a result, the liquid channel main stream groove 161 is configured to transport the working liquid 2*b* condensed from the working vapor 2*a* to the vaporization region SSR. The liquid channel main stream grooves 161 may be disposed at equal intervals in the Y direction.

The liquid channel main stream grooves 161 are formed by etching from the first main body surface 131*a* of the sheet main body 131 of the wick sheet 130 in the etching process (described later). As a result, each liquid channel main stream groove 161 has a wall surface 162 formed in a curved shape as shown in FIG. 40. The wall surface 162 defines the liquid channel main stream groove 161 and is curved in a concave shape toward the second main body surface 131*b*.

The width ww3 (a dimension in the Y direction) of the liquid channel main stream groove 161 shown in FIG. 40 and FIG. 41 may, for example, range from 5 μm to 150 μm. The width ww3 of the liquid channel main stream groove 61 means a dimension at the first main body surface 131*a*. The width hh1 (a dimension in the Z direction) of the liquid channel main stream groove 161 shown in FIG. 40 may, for example, range from 3 μm to 150 μm.

As shown in FIG. 41, the liquid channel communication grooves 165 extend in a direction different from the X direction. In the present embodiment, the liquid channel communication grooves 165 are formed so as to extend in the Y direction and are formed perpendicularly to the liquid channel main stream grooves 161. Some of the liquid channel communication grooves 165 are disposed so as to communicate adjacent two of the liquid channel main stream grooves 161. The other liquid channel communication grooves 165 each are disposed so as to communicate the vapor channel 150 (the first vapor passage 151 or the second vapor passage 152) with the liquid channel main stream groove 161. In other words, the liquid channel communication groove 165 extends from an end edge of the land 133 in the Y direction to the liquid channel main stream groove 161 adjacent to the end edge. In this way, the first vapor passage 151 or the second vapor passage 152 of the vapor channel 150 communicates with the liquid channel main stream groove 161.

The liquid channel communication groove 165 has a channel cross-sectional area smaller than that of the first vapor passage 151 or the second vapor passage 152 of the vapor channel 150 such that the working liquid 2*b* mainly flows by capillary action. The liquid channel communication grooves 165 may be disposed at equal intervals in the X direction.

Each of the liquid channel communication grooves 165, as well as the liquid channel main stream grooves 161, is formed by etching and has a wall surface (not shown) formed in a curved shape similar to that of the liquid channel main stream groove 161. The width ww4 (a dimension in the X direction) of the liquid channel communication groove 165 shown in FIG. 41 may be equal to the width ww3 of the liquid channel main stream groove 161, may be greater than the width ww3, or may be less than the width ww3. The depth of the liquid channel communication groove 165 may be equal to the depth hh1 of the liquid channel main stream groove 161, may be greater than the depth hh1, or may be less than the depth hh1.

As shown in FIG. 41, the liquid channel 160 has liquid channel protrusion arrays 163 provided at the first main body surface 131*a* of the sheet main body 131. Each of the liquid channel protrusion arrays 163 is provided between adjacent two of the liquid channel main stream grooves 161. Each liquid channel protrusion array 163 includes a plurality of liquid channel protrusions 164 arranged in the X direction. The liquid channel protrusions 164 are provided in the liquid channel 160 and are in contact with the second lower sheet surface 110*b* of the lower sheet 110. Each liquid channel protrusion 164 is formed in a rectangular shape such that the X direction is a longitudinal direction in a plan view. The liquid channel main stream groove 161 is interposed between any adjacent two of the liquid channel protrusions 164 in the Y direction, and the liquid channel communication groove 165 is interposed between any adjacent two of the liquid channel protrusions 164 in the X direction. The liquid channel communication grooves 165 are formed so as to extend in the Y direction and each communicate adjacent two of the liquid channel main stream grooves 161 in the Y direction. As a result, the working liquid 2*b* is allowed to move among these liquid channel main stream grooves 161.

The liquid channel protrusions 164 are portions where the material of the wick sheet 130 is left without being etched in the etching process (described later). In the present embodiment, as shown in FIG. 41, the planar shape of each liquid channel protrusion 164 (the shape at the position of the first main body surface 131*a* of the sheet main body 131 of the wick sheet 130) is a rectangular shape.

In the present embodiment, the liquid channel protrusions 164 are disposed in a staggered manner. More specifically, the liquid channel protrusions 164 of adjacent two of the liquid channel protrusion arrays 163 in the Y direction are disposed so as to be shifted from each other in the X direction. The shift amount may be half the array pitch of the liquid channel protrusions 164 in the X direction. The width ww5 (a dimension in the Y direction) of the liquid channel protrusion 164 shown in FIG. 41 may, for example, range from 5 μm to 500 μm. The width ww5 of the liquid channel protrusion 164 means a dimension at the first main body surface 131*a*. The arrangement of the liquid channel protrusions 164 is not limited to the staggered manner and may be a parallel array. In this case, the liquid channel protrusions 164 of adjacent two of the liquid channel protrusion arrays 163 in the Y direction are aligned in the X direction.

The liquid channel main stream groove 161 includes liquid channel intersections 166 that communicate with the liquid channel communication grooves 165. At each liquid channel intersection 166, the liquid channel main stream groove 161 and the liquid channel communication groove 165 communicate with each other in a T-shape. As a result, at the liquid channel intersection 166 at which one liquid channel main stream groove 161 communicates with the liquid channel communication groove 165 on one side (for example, the upper side in FIG. 41), communication of the liquid channel communication groove 165 on the other side (for example, the lower side in FIG. 41) with the liquid channel main stream groove 161 can be avoided. As a result, at the liquid channel intersection 166, cutting out the wall surface 162 of the liquid channel main stream groove 161 on both sides (the upper side and the lower side in FIG. 41) is suppressed, so one side of the wall surface 162 can be left. Therefore, even at the liquid channel intersection 166, it is possible to impart capillary action to the working liquid in the liquid channel main stream groove 161, so it is possible to suppress a decrease in the propelling force of the working liquid 2*b* toward the vaporization region SSR at the liquid channel intersection 166.

As shown in FIG. 35, the vapor chamber 101 may further include a filling portion 104 at one-side (left-side in FIG. 35) side edge in the X direction. The filling portion 104 is used to fill the working liquid 2*b* into the sealed space 103. In the example shown in FIG. 35, the filling portion 104 is disposed adjacent to the vaporization region SSR and protrudes outward from the side edge adjacent to the vaporization region SSR.

The filling portion 104 is configured such that the lower sheet filling protrusion 113 (see FIG. 37) of the lower sheet 110, the upper sheet filling protrusion 123 (see FIG. 38) of the upper sheet 120, and the wick sheet filling protrusion 136 (see FIG. 39) of the wick sheet 130 overlap one another. In the illustrated example, the lower surface (first main body surface 131*a*) of the wick sheet filling protrusion 136 and the upper surface (second lower sheet surface 110*b*) of the lower sheet filling protrusion 113 overlap each other, and the upper surface (second main body surface 131*b*) of the wick sheet filling protrusion 136 and the lower surface (first upper sheet surface 120*a*) of the upper sheet filling protrusion 123 overlap each other. Of these, a filling channel 137 may be formed in the wick sheet filling protrusion 136. The filling channel 137 may extend through from the first main body surface 131*a* of the sheet main body 131 to the second main body surface 131*b*. In other words, the filling channel 137 may extend through the sheet main body 131 (the wick sheet filling protrusion 136) in the Z direction. The filling channel 137 may communicate with the first vapor passage 151, and the working liquid 2*b* may be filled into the first vapor passage 151 through the filling channel 137. Depending on the arrangement of the liquid channel 160, the filling channel 137 may communicate with the liquid channel 160. The upper surface and the lower surface of the wick sheet filling protrusion 136 may be formed in a flat shape, and the upper surface of the lower sheet filling protrusion 113 and the lower surface of the upper sheet filling protrusion 123 may also be formed in a flat shape. The planar shapes of the filling protrusions 113, 123, 136 may be the same.

In the present embodiment, an example in which the filling portion 104 is provided at one-side side edge of a pair of side edges of the vapor chamber 101 in the X direction is described; however, the configuration is not limited thereto. The filling portion 104 may be provided at a selected position. The filling channel 137 provided in the wick sheet filling protrusion 136 does not need to extend through the sheet main body 131 as long as the filling channel 137 can fill the working liquid 2*b*. In this case, the filling channel 137 that communicates with the vapor channel 150 may be formed by etching from only one of the first main body surface 131*a* and the second main body surface 131*b* of the sheet main body 131. The filling portion 104 may be cut and removed after the working liquid 2*b* is filled during manufacturing of the vapor chamber 101.

Incidentally, as described above, the wick sheet 130 according to the present embodiment includes the retracted portion 170 retracted toward the vapor channel 150 beyond the outer periphery 132*o*. In the present embodiment, the retracted portion 170 is retracted from the pair of long side edges 132*a*, 132*b* and the pair of short side edges 132*c*, 132*d* of the wick sheet 130. In other words, the retracted portion 170 is provided at each of the pair of long side edges 132*a*, 132*b* and the pair of short side edges 132*c*, 132*d*. The retracted portion 170 is formed all around the outer periphery 132*o* of the wick sheet 130 except a portion where the wick sheet filling protrusion 136 is provided.

As described above, the planar shape of the vapor chamber 101 is not limited to a rectangular shape and may be a selected shape, such as a circular shape, an elliptical shape, an L-shape, and a T-shape. In this case, the retracted portion 170 may be formed all around the outer periphery 132*o* of the wick sheet or may be formed at selected positions in the outer periphery 132*o* of the wick sheet.

As shown in FIG. 36 and FIG. 40, in a sectional view along the thickness direction (Z direction) of the wick sheet 130, the retracted portion 170 has a retracted edge 171 extending from the outer periphery 132*o* (the long side edges 132*a*, 132*b* and the short side edges 132*c*, 132*d*) of the wick sheet. Here, the outer periphery 132*o* is the outer periphery of the wick sheet 130 in a plan view as shown in FIG. 39 and is located adjacent to the upper sheet 120. The retracted edge 171 extends from the outer periphery 132*o* to the first main body surface 131*a* and is curved in a concave shape toward the vapor channel 150. The retracted edge 171 may be formed so as to approach the vapor channel 150 as approaching the first main body surface 131*a*. In the illustrated example, the retracted edge 171 extends from the outer periphery 121*o* of the upper sheet 120 toward the outer periphery 111*o* of the lower sheet 110.

The dimension ww6 in the Y direction between the outer periphery 121*o* of the upper sheet 120 and the outer periphery 111*o* of the lower sheet 110, shown in FIG. 40, may, for example, range from 50 μm to 1000 μm. In other words, the retracted portion 170 may be retracted 50 μm or longer and 1000 μm or shorter from the outer periphery 132*o*.

The dimension ww7 in the Y direction between the long side edge 111*a* of the lower sheet 110 and the vapor channel 150 (first vapor passage 151), shown in FIG. 40, may, for example, range from 30 μm to 3000 μm. Here, the dimension ww7 means a dimension at the first main body surface 131*a*. In other words, the retracted portion 170 may be provided at a position 30 am or longer and 3000 am or shorter away from the vapor channel 150 (first vapor passage 151) at the first main body surface 131*a*.

The thus configured retracted portion 170 may be formed by etching from the first main body surface 131*a* of the sheet main body 131 of the wick sheet 130 in the etching process (described later).

Incidentally, the material of the lower sheet 110, the upper sheet 120, and the wick sheet 130 is not limited as long as the material has a good thermal conductivity. The lower sheet 110, the upper sheet 120, and the wick sheet 130 may contain, for example, copper or a copper alloy. In this case, it is possible to enhance the thermal conductivity of each of the sheets 110, 120, 130, and it is possible to enhance the heat dissipation efficiency of the vapor chamber 101.

The thickness tt1 of the vapor chamber 101 shown in FIG. 36 may, for example, range from 100 μm to 1000 μm. When the thickness tt1 of the vapor chamber 101 is greater than or equal to 100 μm, it is possible to appropriately ensure the vapor channel 150, so it is possible to cause the vapor chamber 101 to appropriately function. On the other hand, when the thickness tt1 of the vapor chamber 101 is less than or equal to 1000 μm, it is possible to suppress an increase in the thickness tt1 of the vapor chamber 101.

The thickness tt2 of the lower sheet 110 shown in FIG. 36 may, for example, range from 6 am to 100 μm. When the thickness tt2 of the lower sheet 110 is greater than or equal to 6 μm, it is possible to ensure the mechanical strength of the lower sheet 110. On the other hand, when the thickness tt2 of the lower sheet 110 is less than or equal to 100 μm, it is possible to suppress an increase in the thickness tt1 of the vapor chamber 101. Similarly, the thickness tt3 of the upper sheet 120 shown in FIG. 36 may be set as in the case of the thickness tt2 of the lower sheet 110. The thickness tt3 of the upper sheet 120 and the thickness tt2 of the lower sheet 110 may be different from each other.

The thickness tt4 of the wick sheet 130 shown in FIG. 36 may, for example, range from 50 μm to 400 μm. When the thickness tt4 of the wick sheet 130 is greater than or equal to 50 μm, it is possible to appropriately ensure the vapor channel 150, so it is possible to appropriately operate the vapor chamber 101. On the other hand, when the thickness tt4 of the wick sheet 130 is less than or equal to 400 μm, it is possible to suppress an increase in the thickness tt1 of the vapor chamber 101.

Next, a manufacturing method for the thus configured vapor chamber 101 will be described with reference to FIG. 42 to FIG. 45.

Here, initially, a sheet preparation process of preparing the sheets 110, 120, 130 will be described. The sheet preparation process includes a lower sheet preparation process of preparing the lower sheet 110, an upper sheet preparation process of preparing the upper sheet 120, and a wick sheet preparation process of preparing the wick sheet 130.

In the lower sheet preparation process, initially, a lower sheet base material having a desired thickness is prepared. The lower sheet base material may be a rolled material. Subsequently, the lower sheet 110 having a desired planar shape is formed by etching the lower sheet base material. Alternatively, the lower sheet 110 having a desired planar shape may be formed by press working of the lower sheet base material. As described above, the lower sheet 110 is formed so as to be entirely smaller than the upper sheet 120 in a plan view. In this way, the lower sheet 110 having an outline shape as shown in FIG. 37 can be prepared.

In the upper sheet preparation process as well, as in the case of the lower sheet preparation process, initially, an upper sheet base material having a desired thickness is prepared. The upper sheet base material may be a rolled material. Subsequently, the upper sheet 120 having a desired planar shape is formed by etching the upper sheet base material. Alternatively, the upper sheet 120 having a desired planar shape may be formed by press working of the upper sheet base material. As described above, the upper sheet 120 is formed so as to be entirely larger than the lower sheet 110 in a plan view. In this way, the upper sheet 120 having an outline shape as shown in FIG. 38 can be prepared.

The wick sheet preparation process includes a material sheet preparation process of preparing a metal material sheet MM and an etching process of etching the metal material sheet MM.

Figure 42:
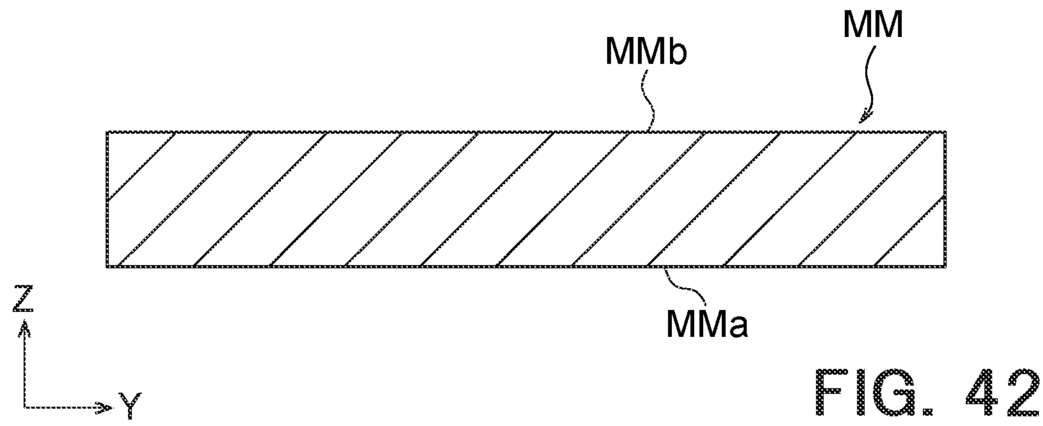
FIG. 42 is a view for illustrating a material sheet preparation process in a manufacturing method for a vapor chamber according to the third embodiment.

Initially, in the material sheet preparation process, as shown in FIG. 42, a sheet-shaped metal material sheet MM including a first material surface MMa and a second material surface MMb is prepared. The metal material sheet MM may be formed from a rolled material having a desired thickness.

Figure 43:
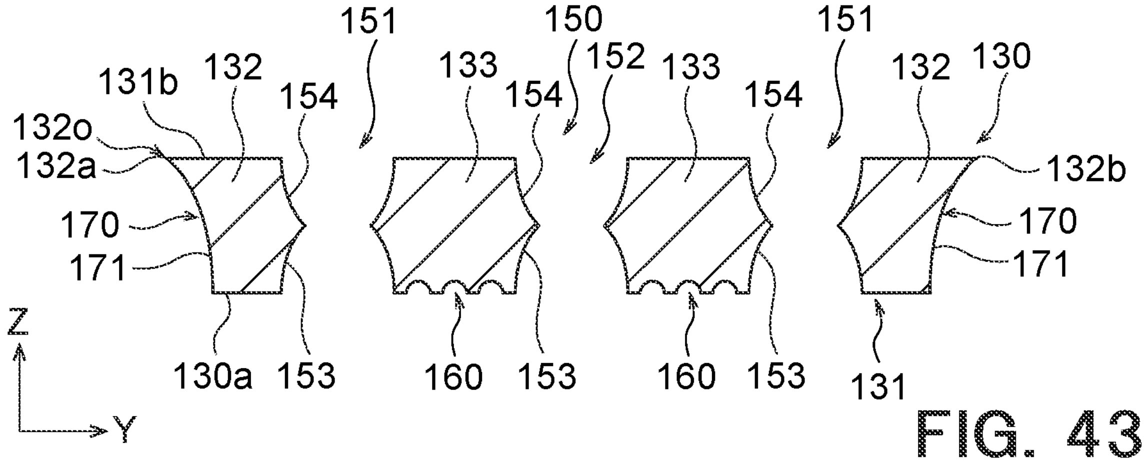
FIG. 43 is a view for illustrating an etching process in the manufacturing method for a vapor chamber according to the third embodiment.

After that, in the etching process, as shown in FIG. 43, the vapor channel 150, the liquid channel 160, and the retracted portion 170 are formed by etching the metal material sheet MM from the first material surface MMa and the second material surface MMb.

More specifically, a patterned resist film (not shown) is formed on the first material surface MMa and the second material surface MMb of the metal material sheet MM by photolithography. The pattern of the resist film includes a pattern for the above-described vapor channel 150, the above-described liquid channel 160, and the above-described retracted portion 170. Subsequently, the first material surface MMa and the second material surface MMb of the metal material sheet MM are etched through the openings of the patterned resist film. As a result, the first material surface MMa and the second material surface MMb of the metal material sheet MM are etched into a patterned shape, and the vapor channel 150 and the liquid channel 160 as shown in FIG. 43 are formed. The retracted portion 170 is also formed through the etching (etching from the first material surface MMa). For example, an iron chloride etchant, such as aqueous ferric chloride, or a copper chloride etchant, such as aqueous copper chloride, may be used as an etchant.

The first material surface MMa and the second material surface MMb of the metal material sheet MM may be etched at the same time. However, not limited to this configuration, etching of the first material surface MMa and etching of the second material surface MMb may be performed in different processes. The vapor channel 150, the liquid channel 160, and the retracted portion 170 may be formed by etching at the same time or may be formed in different processes.

In the etching process, a predetermined outline shape as shown in FIG. 39 can be obtained by etching the first material surface MMa and the second material surface MMb of the metal material sheet MM. In other words, the wick sheet 130 having the above-described outer periphery **132*o*** can be obtained.

The retracted portion 170 is not limited to being formed by etching and may be formed by, for example, cutting or the like of an end edge of the metal material sheet MM after the etching process.

In this way, the wick sheet 130 according to the present embodiment can be prepared.

Figure 44:
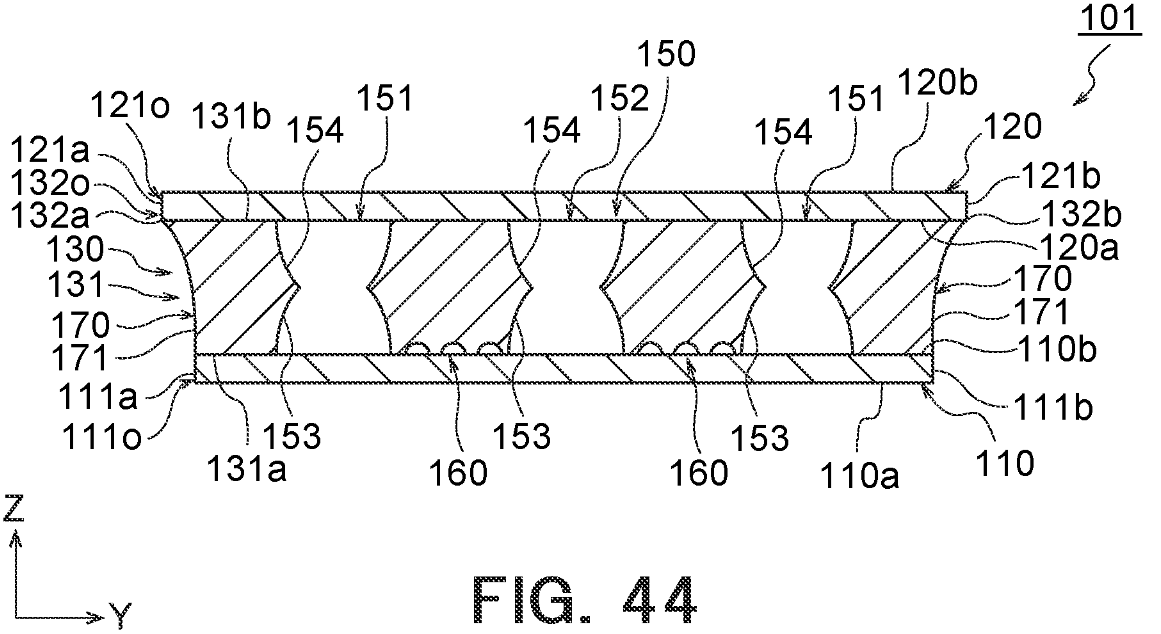
FIG. 44 is a view for illustrating a joining process in the manufacturing method for a vapor chamber according to the third embodiment.

After the preparation process, the lower sheet 110, the upper sheet 120, and the wick sheet 130 are joined together as shown in FIG. 44 in a joining process.

More specifically, initially, the lower sheet 110, the wick sheet 130, and the upper sheet 120 are laminated in this order. In this case, the first main body surface **131*a* of the wick sheet 130 is superimposed on the second lower sheet surface 110*b* of the lower sheet 110, and the first upper sheet surface 120*a* of the upper sheet 120 is superimposed on the second main body surface 131*b* of the wick sheet 130. At this time, the sheets 110, 120, 130 may be aligned by using the alignment holes 112 of the lower sheet 110, the alignment holes 135 of the wick sheet 130, and the alignment holes 122 of the upper sheet 120**.

Subsequently, the lower sheet 110, the wick sheet 130, and the upper sheet 120 are temporarily joined. For example, these sheets 110, 120, 130 may be temporarily joined by spot resistance welding, or these sheets 110, 120, 130 may be temporarily joined by laser welding.

After that, the lower sheet 110, the wick sheet 130, and the upper sheet 120 are permanently joined by thermocompression bonding. For example, these sheets 110, 120, 130 may be permanently joined by diffusion joining. Diffusion joining is a method of joining by pressurizing and heating in a laminated direction to use diffusion of atoms that occurs on a joint surface in a controlled atmosphere, such as vacuum and inert gas, while bringing the lower sheet 110 and the wick sheet 130 to be joined into close contact and bringing the wick sheet 130 and the upper sheet 120 into close contact. Diffusion joining heats the materials of the sheets 110, 120, 130 to a temperature close to a melting point but lower than the melting point, so it is possible to avoid melting and deformation of each of the sheets 110, 120, 130. Thus, the first main body surface 131*a* at each of the frame 132 and the lands 133 of the wick sheet 130 is diffusion-joined with the second lower sheet surface 110*b* of the lower sheet 110. The second main body surface 131*b* at each of the frame 132 and the lands 133 of the wick sheet 130 is diffusion-joined with the first upper sheet surface 120*a* of the upper sheet 120. In this way, the sheets 110, 120, 130 are diffusion-joined, the sealed space 103 having the vapor channel 150 and the liquid channel 160 is formed between the lower sheet 110 and the upper sheet 120. At this stage, the above-described filling channel 137 is not sealed, and the sealed space 103 communicates with an outside via the filling channel 137.

After the joining process, the working liquid 2*b* is injected into the sealed space 103 through the filling channel 137 of the filling portion 104 in a filling process.

After the filling process, the filling channel 137 is sealed in a sealing process. The filling channel 137 may be sealed by partially melting the filling portion 104. As a result, communication between the sealed space 103 and the outside is interrupted, and the sealed space 103 is hermetically sealed. Therefore, the sealed space 103 in which the working liquid 2*b* is filled is obtained, so leakage of the working liquid 2*b* in the sealed space 103 to the outside is suppressed. After the filling channel 137 is sealed, the filling portion 104 may be removed. The whole of the filling portion 104 may be removed. Alternatively, part of the filling portion 104 may be removed, and the remaining part may be left.

In this way, the vapor chamber 101 according to the present embodiment is obtained.

Figure 45:
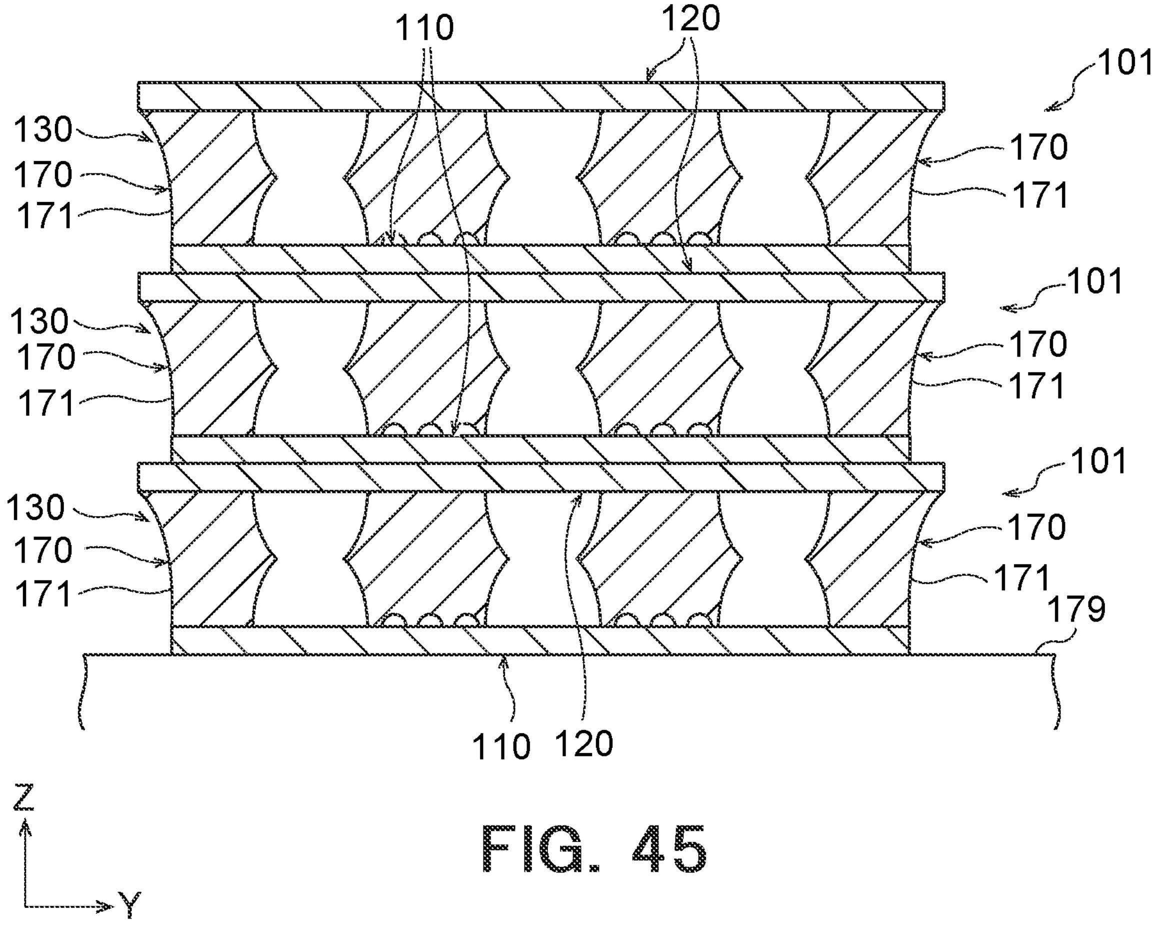
FIG. 45 is a view showing a state where the vapor chambers manufactured by the manufacturing method for a vapor chamber according to the third embodiment are stacked and placed on top of each other.

In this way, the vapor chamber 101 according to the present embodiment can be sequentially manufactured. The manufactured vapor chambers 101 can be placed and stored so as to be stacked on a placement surface 179 provided in a predetermined place as shown in FIG. 45. After that, the vapor chamber 101 is taken out from the placement place and conveyed at the time of shipping or attachment to the device D.

Next, a conveying method for the vapor chambers 101 manufactured in this way will be described with reference to FIG. 46 and FIG. 47. Here, a method of taking out the vapor chamber 101 from a state where the vapor chambers 101 are stacked on top of each other and placed as shown in FIG. 45 and conveyed will be described.

Figure 46:
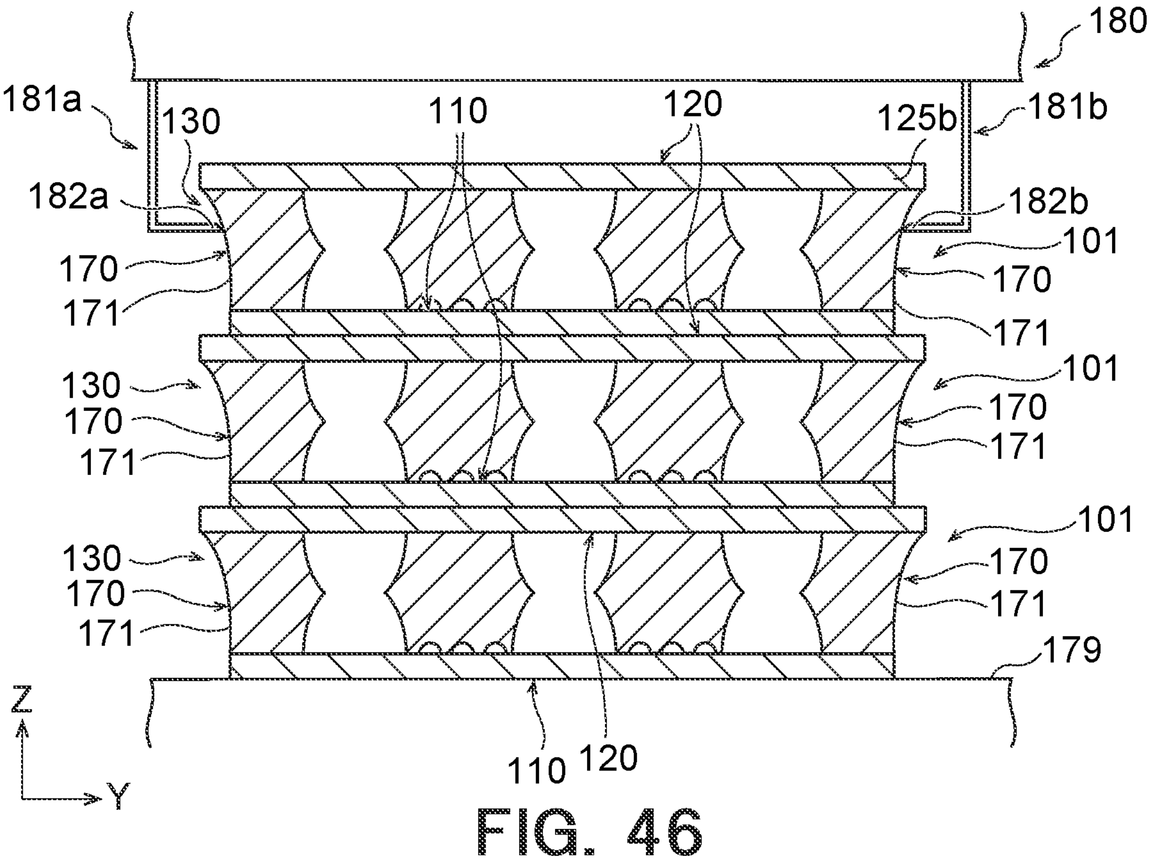
FIG. 46 is a view for illustrating a conveying method for the vapor chambers of FIG. 45 and is a view showing a state where the hooks of the suspending apparatus are engaged with retracted portions.

Initially, as shown in FIG. 46, a hook 182*a* of a first arm 181*a* and a hook 182*b* of a second arm 181*b* of a suspending apparatus 180 each are engaged with the retracted portion 170 of the wick sheet 130.

More specifically, initially, the first arm 181*a* is moved in the vertical direction to position the first hook 182*a* provided at the distal end of the first arm 181*a* to a position where the retracted portion 170 is provided in the Z direction of the vapor chamber 101 placed at the top. The second arm 181*b* is moved in the vertical direction to position the second hook 182*b* provided at the distal end of the second arm 181*b* to a position where the retracted portion 170 is provided in the Z direction of the vapor chamber 101. Subsequently, the first arm 181*a* is moved in the horizontal direction to bring the first hook 182*a* into contact with the retracted edge 171 of the retracted portion 170 provided on one side (left side in FIG. 46) in the Y direction. Similarly, the second arm 181*b* is moved in the horizontal direction to bring the second hook 182*b* into contact with the retracted edge 171 of the retracted portion 170 provided on the other side (right side in FIG. 46) in the Y direction.

Figure 47:
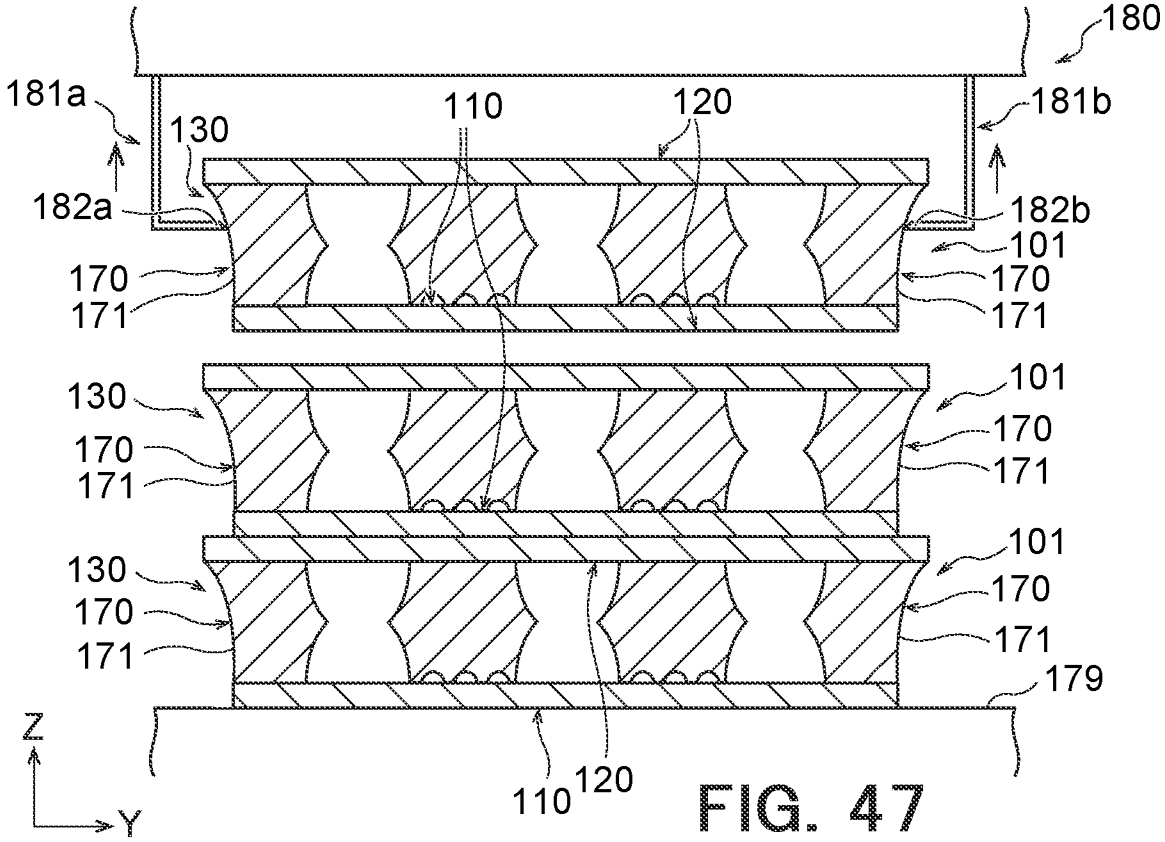
FIG. 47 is a view for illustrating the conveying method for the vapor chambers of FIG. 45 and is a view showing a state where the vapor chamber is suspended by the suspending apparatus.

After that, as shown in FIG. 47, the vapor chamber 101 is suspended by the suspending apparatus 180.

More specifically, in a state where the first hook 182*a* and the second hook 182*b* each are in contact with the retracted edge 171 of the retracted portion 170, the first arm 181*a* and the second arm 181*b* are moved upward. Thus, the wick sheet 130 is supported by the first hook 182*a* and the second hook 182*b*, and the vapor chamber 101 is suspended by the suspending apparatus 180.

Then, in a state where the vapor chamber 101 is suspended by the suspending apparatus 180, the first arm 181*a* and the second arm 181*b* are moved in the horizontal direction to convey the vapor chamber 101 to a desired target position.

In this way, the vapor chamber 101 according to the present embodiment can be conveyed by the suspending apparatus 180.

Here, a method of taking out the vapor chamber 101 from a state where the vapor chambers 101 are stacked on top of each other and placed and conveyed will be described. However, not limited to this configuration, even when the vapor chamber 101 is directly mounted on the placement surface 179 as well, the vapor chamber 101 can be conveyed with the suspending apparatus 180.

Figure 48:
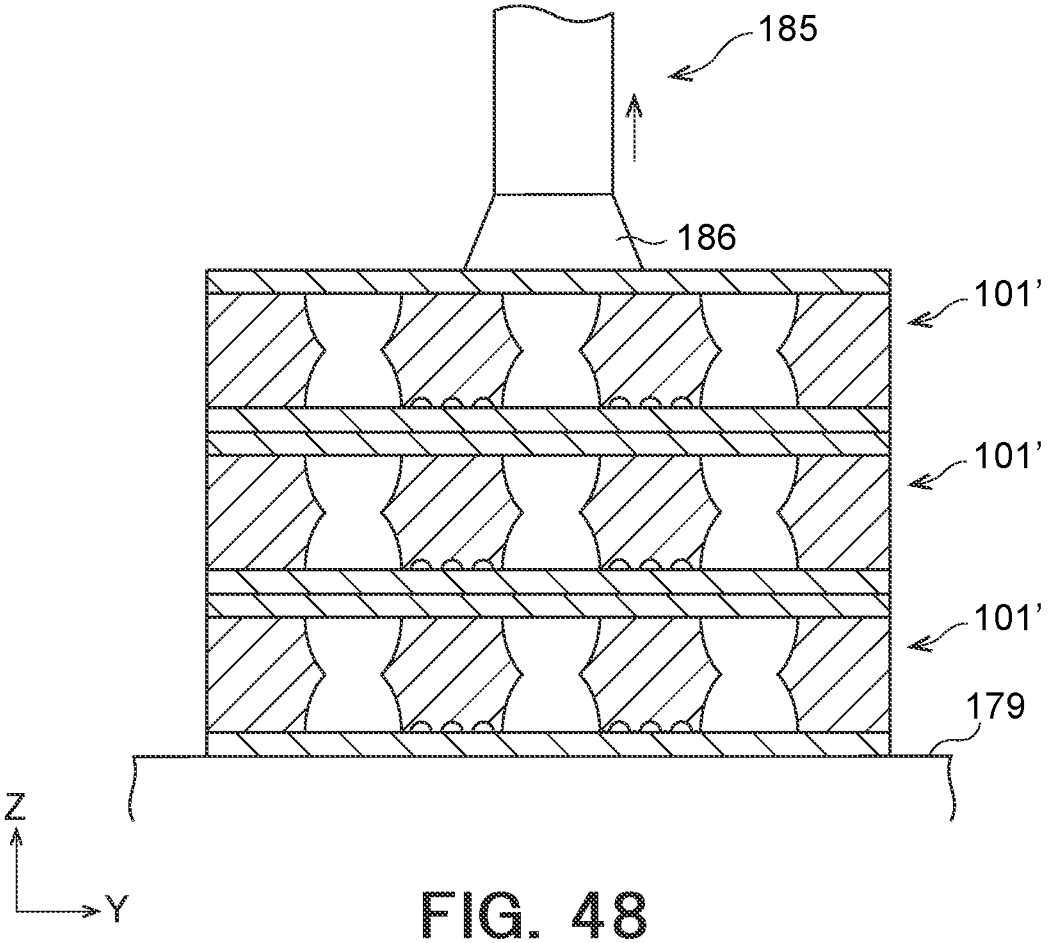
FIG. 48 is a view for illustrating a general conveying method for vapor chambers.

Here, a conveying method for a general vapor chamber 101' will be described. As shown in FIG. 48, the side of the general vapor chamber 101' is formed upright, and the retracted portion 170 is not formed in the wick sheet 30 unlike the vapor chamber 101 according to the present embodiment. Therefore, the hooks 182*a*, 182*b* of the suspending apparatus 180 cannot be engaged with the retracted portion 170, and it is difficult to convey the general vapor chamber 101' with the above-described suspending apparatus 180.

As shown in FIG. 48, the general vapor chamber 101' can be taken out and conveyed with an adsorption apparatus 185. More specifically, the adsorption apparatus 185 has an adsorption pad 186 that generates adsorption force by exerting a negative pressure inside and presses the adsorption pad 186 against the upper surface of the vapor chamber 101' to be adsorbed to the vapor chamber 101'. After that, in a state where the vapor chamber 101' is adsorbed by the adsorption pad 186, the adsorption apparatus 185 is moved upward to suspend the vapor chamber 101'. Then, the adsorption apparatus 185 is moved in the horizontal direction to convey the vapor chamber 101' to a desired target position.

At this time, when the vapor chamber 101' has a thin profile, the vapor chamber 101' may deform due to adsorption force exerted from the adsorption pad 186 on the upper surface of the vapor chamber 101'. Therefore, the thin profile of the vapor chamber 101' may be suppressed to suppress deformation of the vapor chamber 101'.

In contrast, in the present embodiment, the retracted portion 170 is provided in the wick sheet 130 of the vapor chamber 101. As a result, the hooks 182*a*, 182*b*, or the like, of the suspending apparatus 180 can be engaged with the retracted portion 170 of the wick sheet 130 of the vapor chamber 101 placed. Therefore, the vapor chamber 101 can be suspended and conveyed with the suspending apparatus 180, so using the above-described adsorption apparatus 185 is not required. Therefore, it is possible to suppress deformation of the vapor chamber 101. As a result, a further thin-profile vapor chamber 101 can be implemented.

Conveying the vapor chamber 101 with the above-described suspending apparatus 180 is an example, and the vapor chamber 101 may be conveyed with another selected apparatus or the like. For example, the vapor chamber 101 may be conveyed with a tool having a sharp distal end. More specifically, the vapor chamber 101 may be lifted by bringing the distal end of the tool into contact with the retracted edge 171 of the retracted portion 170 and then moving the tool upward. Then, the vapor chamber 101 may be conveyed by holding the lifted vapor chamber 101 with a hand. Alternatively, for example, without using such an apparatus or tool, the finger may be brought into contact with the retracted edge 171 of the retracted portion 170 to lift the vapor chamber 101, and then the vapor chamber 101 may be held and conveyed. In such a case as well, since the wick sheet 130 has the retracted portion 170, it is easy to take out and convey the vapor chamber 101.

Next, an operation method for the vapor chamber 101, that is, a method of cooling the device D, will be described.

The vapor chamber 101 conveyed as described above is installed in the housing H, such as a mobile terminal, at a conveyance destination, and the housing member Ha contacts with the second upper sheet surface 120*b* of the upper sheet 120. The device D, such as a CPU, that is a device to be cooled is attached to the first lower sheet surface 110*a* of the lower sheet 110 (or the vapor chamber 101 is attached to the device D), and the first lower sheet surface 110*a* of the lower sheet 110 contacts with the device D. The working liquid 2*b* in the sealed space 103 adheres, with its surface tension, to the wall surface of the sealed space 103, that is, the wall surfaces 153*a* of the lower vapor channel recesses 153, the wall surfaces 154*a* of the upper vapor channel recesses 154, and the wall surfaces 162 of the liquid channel main stream grooves 161 and the wall surfaces of the liquid channel communication grooves 165 of the liquid channel 160. The working liquid 2*b* can also adhere to portions exposed to the lower vapor channel recesses 153, the liquid channel main stream grooves 161, and the liquid channel communication grooves 165, of the second lower sheet surface 110*b* of the lower sheet 110. The working liquid 2*b* can also adhere to portions exposed to the upper vapor channel recesses 154, of the first upper sheet surface 120*a* of the upper sheet 120.

When the device D generates heat in this state, the working liquid 2*b* present in the vaporization region SSR (see FIG. 39) receives heat from the device D. The working liquid 2*b* absorbs the received heat as latent heat to be vaporized (evaporated) into the working vapor 2*a*. Most of the generated working vapor 2*a* diffuses in the lower vapor channel recesses 153 and the upper vapor channel recesses 154 that are components of the sealed space 103 (see the continuous line arrows in FIG. 39). The working vapor 2*a* in the vapor channel recesses 153, 154 leaves from the vaporization region SSR, and most of the working vapor 2*a* is transferred to the condensation region CCR with a relatively low temperature (a right-side portion in FIG. 39). In the condensation region CCR, the working vapor 2*a* mainly dissipates heat to the upper sheet 120 to be cooled. Heat that the upper sheet 120 has received from the working vapor 2*a* is transmitted to outside air via the housing member Ha (see FIG. 36).

The working vapor 2*a* dissipates heat to the upper sheet 120 in the condensation region CCR and loses the absorbed latent heat in the vaporization region SSR to be condensed into the working liquid 2*b*. The produced working liquid 2*b* adheres to the wall surfaces 153*a*, 154*a* of the vapor channel recesses 153, 154, the second lower sheet surface 110*b* of the lower sheet 110, and the first upper sheet surface 120*a* of the upper sheet 120. Here, since the working liquid 2*b* continues to vaporize in the vaporization region SSR, the working liquid 2*b* in a region other than the vaporization region SSR of the liquid channel 160 (that is, the condensation region CCR) is transferred toward the vaporization region SSR by the capillary action of the liquid channel main stream grooves 161 (see the dashed line arrows in FIG. 39). As a result, the working liquid 2*b* having adhered to the wall surfaces 153*a*, 154*a*, the second lower sheet surface 110*b*, and the first upper sheet surface 120*a* moves to the liquid channel 160, passes through the liquid channel communication grooves 165, and enters the liquid channel main stream grooves 161. In this way, the liquid channel main stream grooves 161 and the liquid channel communication grooves 165 are filled with the working liquid 2*b*. Therefore, the filled working liquid 2*b* gains propelling force toward the vaporization region SSR by the capillary action of the liquid channel main stream grooves 161, and is transferred smoothly toward the vaporization region SSR.

In the liquid channel 160, each liquid channel main stream groove 161 communicates with another adjacent one of the liquid channel main stream grooves 161 via corresponding some of the liquid channel communication grooves 165. As a result, the working liquid 2*b* moves between adjacent two of the liquid channel main stream grooves 161, so occurrence of dryout in the liquid channel main stream grooves 161 is suppressed. Therefore, the capillary action is imparted to the working liquid 2*b* in each liquid channel main stream groove 161, and the working liquid 2*b* is smoothly transferred toward the vaporization region SSR.

The working liquid 2*b* having reached the vaporization region SSR receives heat again from the device D to vaporize. The working vapor 2*a* vaporized from the working liquid 2*b* moves to the lower vapor channel recesses 153 and the upper vapor channel recesses 154 with a greater channel cross-sectional area through the liquid channel communication grooves 165 in the vaporization region SSR and diffuses in the vapor channel recesses 153, 154. In this way, the working fluids 2*a*, 2*b* circulate in the sealed space 103 while repeating a phase change, that is, vaporization and condensation, to transfer and dissipate heat of the device D. As a result, the device D is cooled.

In this way, according to the present embodiment, the wick sheet 130 includes the retracted portion 170 retracted from the outer periphery 132*o* toward the vapor channel 150. As a result, the hooks 182*a*, 182*b*, or the like, of the suspending apparatus 180 can be engaged with the retracted portion 170 of the wick sheet 130 of the vapor chamber 101 placed. Therefore, it is possible to easily lift the vapor chamber 101, so it is possible to make it easy to convey the vapor chamber 101. As a result, it is possible to improve the conveyability of the vapor chamber 101.

According to the present embodiment, using the adsorption apparatus 185 is not required to convey the vapor chamber 101. Therefore, it is possible to suppress deformation of the vapor chamber 101. As a result, a further thin-profile vapor chamber 101 can be implemented.

According to the present embodiment, since the retracted portion 170 is formed at the side of the wick sheet 130, when the plurality of vapor chambers 101 is placed so as to be stacked on top of each other, it is possible to easily identify individual vapor chambers 101 by viewing from the side. As a result, it is possible to easily individually take out and convey the vapor chamber 101. Therefore, it is possible to improve the conveyability of the vapor chamber 101.

According to the present embodiment, since the retracted portion 170 is formed in the wick sheet 130, it is possible to reduce the weight of the vapor chamber 101 and save space for the vapor chamber 101.

According to the present embodiment, the retracted edge 171 of the retracted portion 170 is curved in a concave shape toward the vapor channel 150. As a result, it is possible to firmly support and lift the vapor chamber 101 with the hooks 182*a*, 182*b*, or the like, of the suspending apparatus 180. Therefore, it is possible to further improve the conveyability of the vapor chamber 101.

According to the present embodiment, the retracted edge 171 of the retracted portion 170 is formed so as to approach the vapor channel 150 as approaching the first main body surface 131*a*. As a result, it is possible to further firmly support and lift the vapor chamber 101 with the hooks 182*a*, 182*b*, or the like, of the suspending apparatus 180. Therefore, it is possible to further improve the conveyability of the vapor chamber 101.

According to the present embodiment, the retracted portion 170 is retracted from the pair of long side edges 132*a*, 132*b* and the pair of short side edges 132*c*, 132*d* of the wick sheet 130. As a result, it is possible to engage the hooks 182*a*, 182*b*, or the like, of the suspending apparatus 180 with the retracted portion 170 of the wick sheet 130 in selected directions in a plan view of the vapor chamber 101 placed and lift the vapor chamber 101. Therefore, it is possible to further easily lift the vapor chamber 101. As a result, it is possible to further improve the conveyability of the vapor chamber 101.

According to the present embodiment, the vapor channel 150 extends through from the first main body surface 131*a* to the second main body surface 131*b*, and the upper sheet 120 covers the vapor channel 150 on the second main body surface 131*b*. In this way, when the vapor chamber 101 is made up of the lower sheet 110, the upper sheet 120, and the wick sheet 130, it is possible to dissipate heat, received by the lower sheet 110 from the device D, through the upper sheet 120. Thus, it is possible to effectively cool the device D. Therefore, it is possible to improve the performance of the vapor chamber 101.

The vapor chamber 101 may have a symmetric form to the above-described form in the Z direction. In other words, the lower sheet 110 may be formed so as to be entirely larger than the upper sheet 120 in a plan view, and the retracted edge 171 of the retracted portion 170 may extend from the outer periphery 111*o* of the lower sheet 110 toward the outer periphery 121*o* of the upper sheet 120. In such a case as well, when the hooks 182*a*, 182*b*, or the like, of the suspending apparatus 180 are brought into contact with the retracted edge 171 of the retracted portion 170 and moved upward in a state where the vapor chamber 101 is placed in an opposite orientation, that is, in a state where the second upper sheet surface 120*b* of the upper sheet 120 is placed so as to face the placement surface 179, it is possible to easily lift the vapor chamber 101. Therefore, it is possible to easily convey the vapor chamber 101. As a result, it is possible to improve the conveyability of the vapor chamber 101.

First Modification of Third Embodiment

In the above-described third embodiment, an example in which the retracted edge 171 of the retracted portion 170 is curved in a concave shape toward the vapor channel 150 has been described (see FIG. 36). However, not limited to this configuration, as shown in FIG. 49, the retracted edge 171 of the retracted portion 170 may be inclined with respect to the Z direction.

Figure 49:
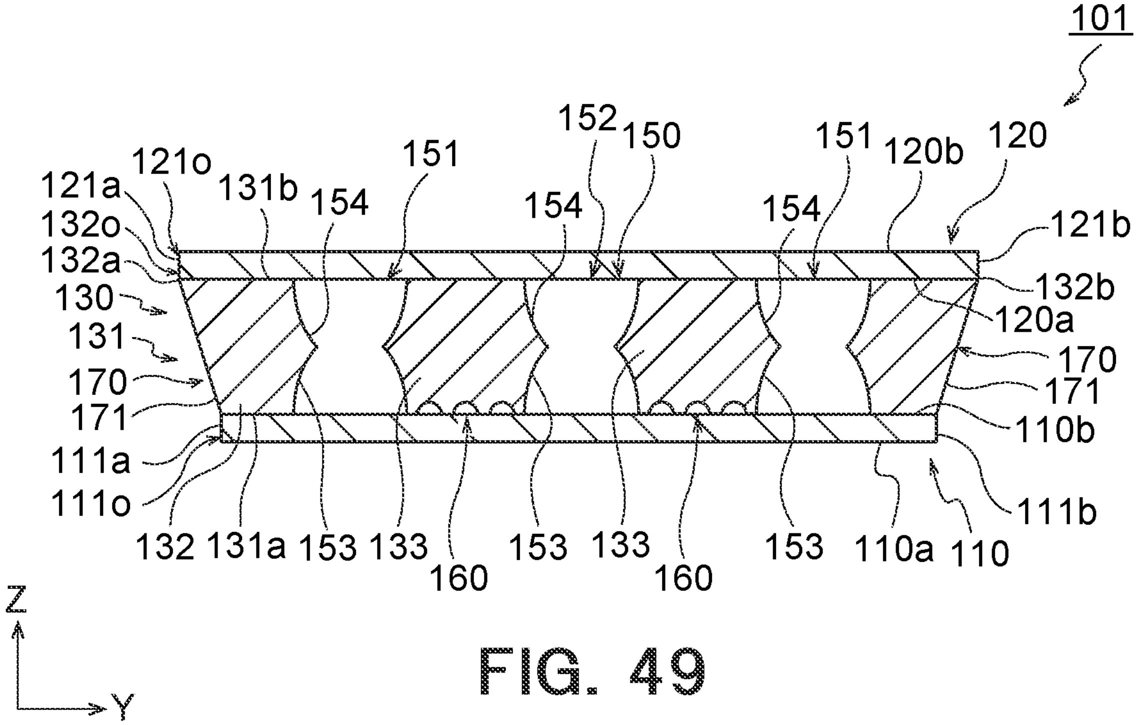
FIG. 49 is a modification (first modification) of FIG. 36.

In the example shown in FIG. 49, the retracted edge 171 extends from the outer periphery 132*o* to the first main body surface 131*a* and is inclined with respect to the Z direction. The retracted edge 171 is formed so as to approach the vapor channel 150 as approaching the first main body surface 131*a*. The retracted edge 171 linearly extends from the outer periphery 121*o* of the upper sheet 120 toward the outer periphery 111*o* of the lower sheet 110. Therefore, in a sectional view along the Z direction, the outer shape of the wick sheet 130 is an inverted trapezoidal shape as shown in FIG. 49.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

Since the retracted edge 171 is inclined with respect to the Z direction, when the hooks 182*a*, 182*b*, or the like, of the suspending apparatus 180 are brought into contact with the retracted edge 171 of the retracted portion 170 and moved upward, it is possible to easily lift the vapor chamber 101. Therefore, it is possible to further improve the conveyability of the vapor chamber 101.

Second Modification of Third Embodiment

In the above-described third embodiment, an example in which the retracted edge 171 of the retracted portion 170 is curved in a concave shape toward the vapor channel 150 has been described (see FIG. 36). However, not limited to this configuration, as shown in FIG. 50, the retracted edge 171 of the retracted portion 170 may be curved in a convex shape toward an opposite side to the vapor channel 150.

Figure 50:
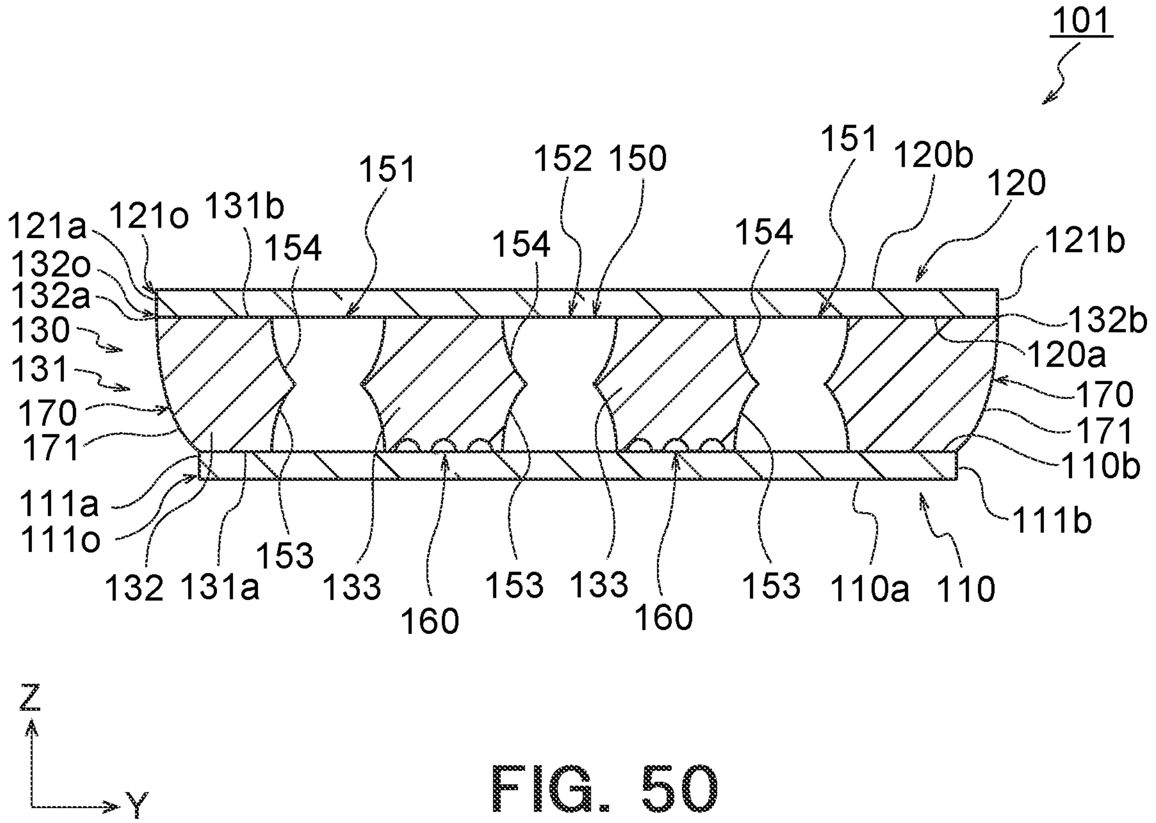
FIG. 50 is a modification (second modification) of FIG. 36.

In the example shown in FIG. 50, the retracted edge 171 extends from the outer periphery 132*o* to the first main body surface 131*a* and is curved in a convex shape toward an opposite side to the vapor channel 150. The retracted edge 171 is formed so as to approach the vapor channel 150 as approaching the first main body surface 131*a*. The retracted edge 171 extends from the outer periphery 121*o* of the upper sheet 120 toward the outer periphery 111*o* of the lower sheet 110.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

Third Modification of Third Embodiment

In the above-described third embodiment, an example in which the retracted edge 171 of the retracted portion 170 is curved in a concave shape toward the vapor channel 150 has been described (see FIG. 36). However, not limited to this configuration, as shown in FIG. 51, the retracted edge 171 of the retracted portion 170 may include a first retracted edge 171*a* extending from the first main body surface 131*a* toward the second main body surface 131*b*, a second retracted edge 171*b* extending from the second main body surface 131*b* toward the first main body surface 131*a*, and a step connection edge 171*c* connecting the first retracted edge 171*a* with the second retracted edge 171*b*.

Figure 51:
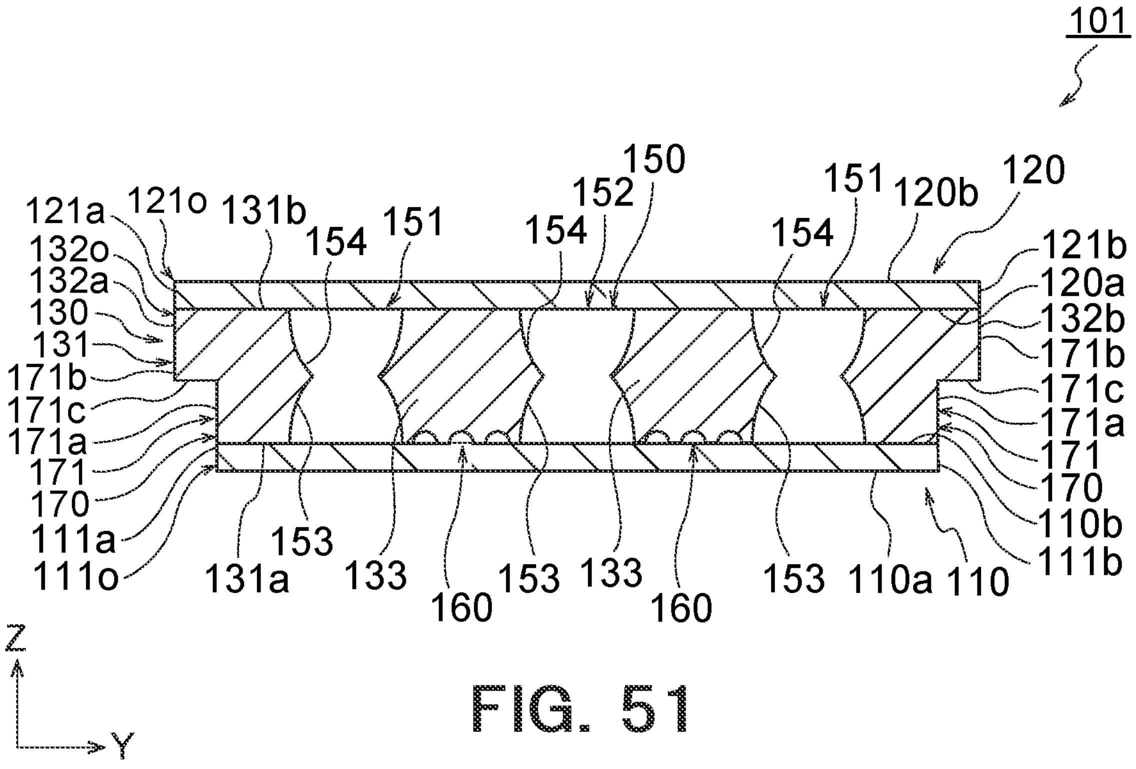
FIG. 51 is a modification (third modification) of FIG. 36.

In the example shown in FIG. 51, the retracted edge 171 includes the first retracted edge 171*a*, the second retracted edge 171*b*, and the step connection edge 171*c* connecting the first retracted edge 171*a* with the second retracted edge 171*b*. The first retracted edge 171*a* is provided adjacent to the first main body surface 131*a*. The second retracted edge 171*b* is provided adjacent to the second main body surface 131*b*. The first retracted edge 171*a* is located closer to the vapor channel 150 than the second retracted edge 171*b*. The first retracted edge 171*a* linearly extends in the Z direction from the first main body surface 131*a* toward the second main body surface 131*b*. The first retracted edge 171*a* may, for example, extend to an intermediate position between the first main body surface 131*a* and the second main body surface 131*b*. The second retracted edge 171*b* linearly extends in the Z direction from the second main body surface 131*b* toward the first main body surface 131*a*. The second retracted edge 171*b* may, for example, extend to an intermediate position between the first main body surface 131*a* and the second main body surface 131*b*. The step connection edge 171*c* linearly extends from the first retracted edge 171*a* toward the second retracted edge 171*b* so as to connect the first retracted edge 171*a* with the second retracted edge 171*b*. In this way, in a sectional view along the Z direction, the retracted edge 171 of the retracted portion 170 is formed in a stepped shape.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

Since the step connection edge 171*c* connecting the first retracted edge 171*a* with the second retracted edge 171*b* is provided, it is possible to firmly support and lift the vapor chamber 101 with the hooks 182*a*, 182*b*, or the like, of the suspending apparatus 180. Therefore, it is possible to further improve the conveyability of the vapor chamber 101.

Fourth Modification of Third Embodiment

In the above-described third embodiment, an example in which the retracted edge 171 of the retracted portion 170 is formed so as to approach the vapor channel 150 as approaching the first main body surface 131*a* has been described (see FIG. 36). However, not limited to this configuration, as shown in FIG. 52, the retracted edge 171 of the retracted portion 170 may be formed so as to approach the vapor channel 150 as approaching a relay point 172 from the outer periphery 132*o* and may be formed so as to get away from the vapor channel 150 as approaching the first main body surface 131*a* from the relay point 172.

Figure 52:
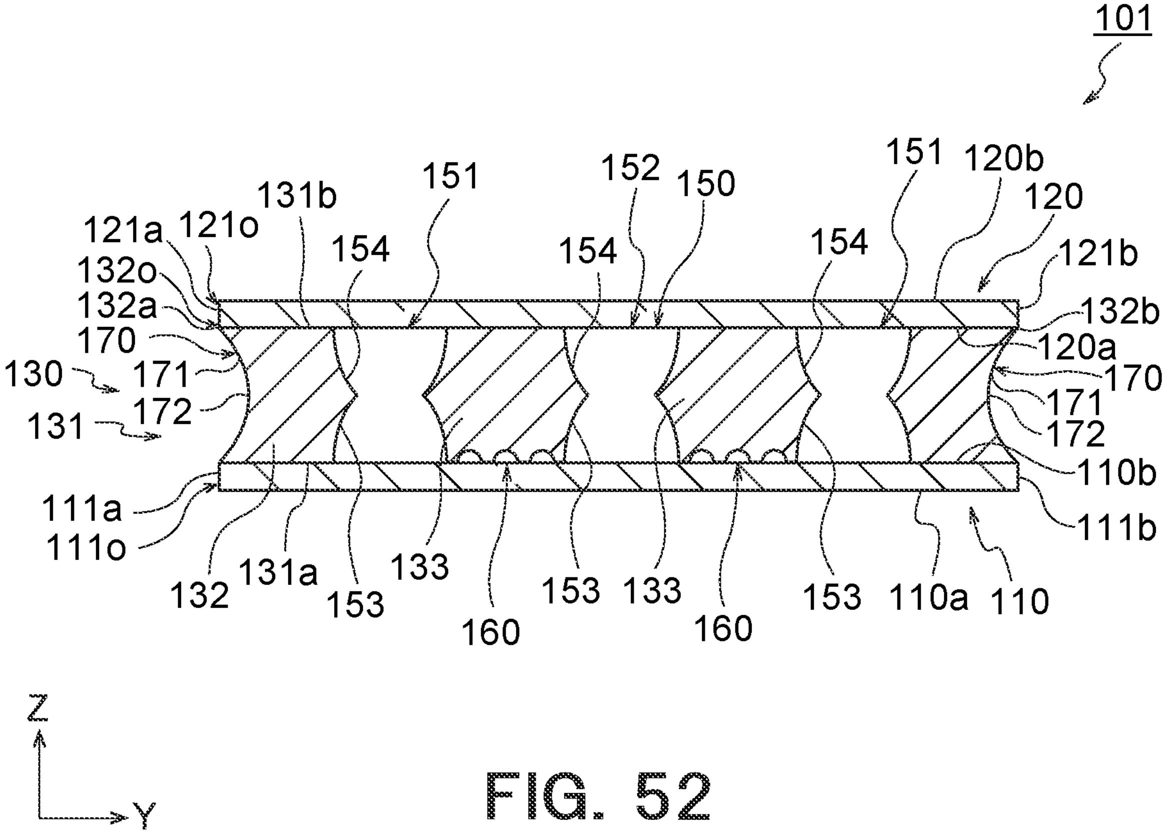
FIG. 52 is a modification (fourth modification) of FIG. 36.

In the example shown in FIG. 52, different from the above-described embodiments, the lower sheet 110 and the upper sheet 120 are formed with the same size in a plan view. The outer periphery 111*o* of the lower sheet 110 and the outer periphery 121*o* of the upper sheet 120 overlap in a plan view. In other words, the long side edges 111*a*, 111*b* and the short side edges 111*c*, 111*d* of the lower sheet 110 respectively overlap the long side edges 121*a*, 121*b* and the short side edges 121*c*, 121*d* of the upper sheet 120 in a plan view.

In the example shown in FIG. 52, the outer periphery 132*o* of the wick sheet 130 is located adjacent to the second main body surface 131*b* in a plan view. In this case, the retracted edge 171 of the retracted portion 170 extends from the outer periphery 132*o* to the first main body surface 131*a* through the relay point 172. The relay point 172 may be located at an intermediate position in the Z direction between the first main body surface 131*a* and the second main body surface 131*b*. The retracted edge 171 is curved in a concave shape toward the vapor channel 150. The retracted edge 171 may be formed so as to approach the vapor channel 150 as approaching the relay point 172 from the outer periphery 132*o* and may be formed so as to get away from the vapor channel 150 as approaching the first main body surface 131*a* from the relay point 172. With the thus configured retracted edge 171, the retracted portion 170 has such a shape as to be recessed toward the vapor channel 150 at the center of the wick sheet 130.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

Since the retracted edge 171 of the retracted portion 170 is curved in a concave shape toward the vapor channel 150, it is possible to firmly support and lift the vapor chamber 101 with the hooks 182*a*, 182*b*, or the like, of the suspending apparatus 180. Therefore, it is possible to further improve the conveyability of the vapor chamber 101.

Even when the vapor chamber 101 is placed in an opposite orientation, that is, even when the second upper sheet surface 120*b* of the upper sheet 120 is placed so as to face the placement surface 179, it is possible to easily lift the vapor chamber 101 by bringing the hooks 182*a*, 182*b*, or the like, of the suspending apparatus 180 into contact with the retracted edge 171 of the retracted portion 170 and moving the hooks 182*a*, 182*b*, or the like, of the suspending apparatus 180 upward. Therefore, even when the vapor chamber 101 is placed in an opposite orientation, it is possible to easily convey the vapor chamber 101. As a result, it is possible to further improve the conveyability of the vapor chamber 101.

Fifth Modification of Third Embodiment

In the above-described third embodiment, an example in which the retracted edge 171 of the retracted portion 170 has the retracted edge 171 extending from the outer periphery 132*o* in a sectional view along the Z direction has been described (see FIG. 36). However, not limited to this configuration, as shown in FIG. 53, the retracted portion 170 may include a first main body surface-side retracted portion 174 and a second main body surface-side retracted portion 175, and the first main body surface-side retracted portion 174 may have a first main body surface-side retracted edge 176 and the second main body surface-side retracted portion 175 may have a second main body surface-side retracted edge 177 in a sectional view along the Z direction.

Figure 53:
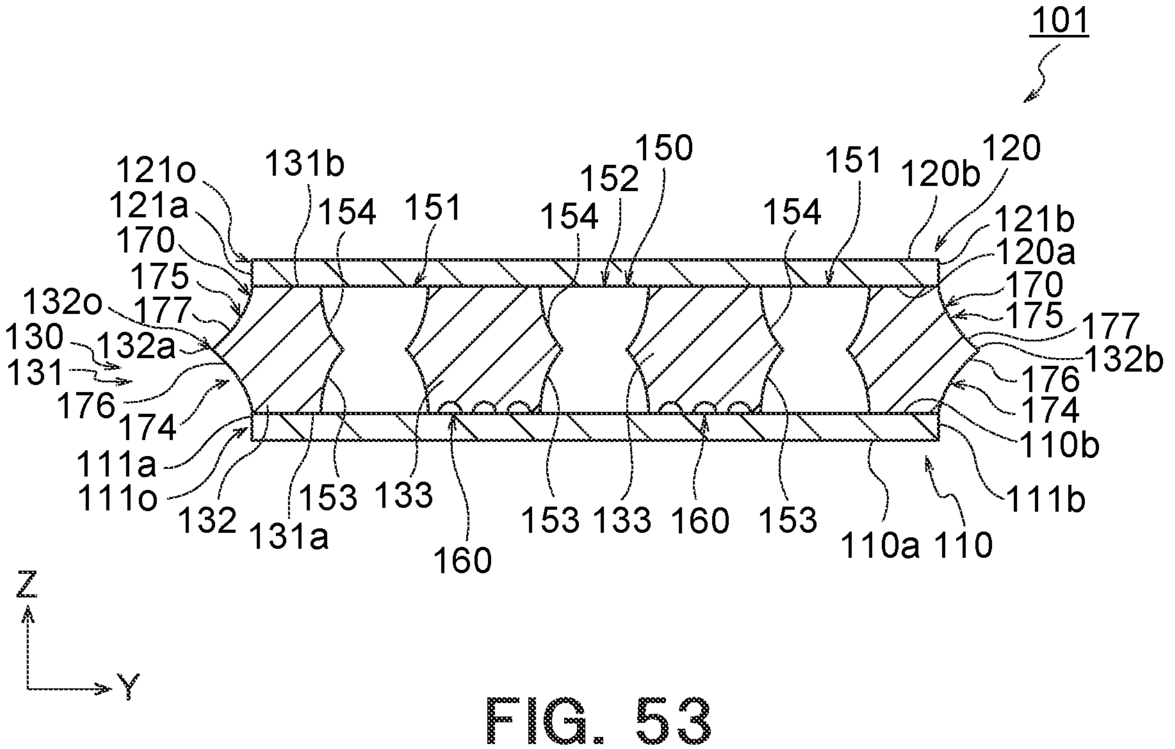
FIG. 53 is a modification (fifth modification) of FIG. 36.

In the example shown in FIG. 53, different from the above-described embodiments, the lower sheet 110 and the upper sheet 120 are formed with the same size in a plan view. The outer periphery 111*o* of the lower sheet 110 and the outer periphery 121*o* of the upper sheet 120 overlap in a plan view. In other words, the long side edges 111*a*, 111*b* and the short side edges 111*c*, 111*d* of the lower sheet 110 respectively overlap the long side edges 121*a*, 121*b* and the short side edges 121*c*, 121*d* of the upper sheet 120 in a plan view.

In the example shown in FIG. 53, the retracted portion 170 includes the first main body surface-side retracted portion 174 provided adjacent to the first main body surface 131*a* and the second main body surface-side retracted portion 175 provided adjacent to the second main body surface 131*b*. The outer periphery 132*o* of the wick sheet 130 in a plan view is located between the first main body surface 131*a* and the second main body surface 131*b*. The outer periphery 132*o* may be located at an intermediate position between the first main body surface 131*a* and the second main body surface 131*b*. The outer periphery 132*o* of the wick sheet 130 is formed so as to protrude outward from the outer periphery 111*o* of the lower sheet 110 and the outer periphery 121*o* of the upper sheet 120. The first main body surface-side retracted portion 174 is formed adjacent to the first main body surface 131*a* with respect to the outer periphery 132*o*, and the second main body surface-side retracted portion 175 is formed adjacent to the second main body surface 131*b* with respect to the outer periphery 132*o*.

In a sectional view along the Z direction, the first main body surface-side retracted portion 174 has the first main body surface-side retracted edge 176 extending from the outer periphery 132*o* to the first main body surface 131*a*. The first main body surface-side retracted edge 176 is curved in a concave shape toward the vapor channel 150 so as to approach the vapor channel 150 as approaching the first main body surface 131*a*. Thus, the first main body surface-side retracted portion 174 has such a shape as to be recessed toward the vapor channel 150 on the side adjacent to the first main body surface 131*a*.

In a sectional view along the Z direction, the second main body surface-side retracted portion 175 has the second main body surface-side retracted edge 177 extending from the outer periphery 132*o* to the second main body surface 131*b*. The second main body surface-side retracted edge 177 is curved in a concave shape toward the vapor channel 150 so as to approach the vapor channel 150 as approaching the second main body surface 131*b*. Thus, the second main body surface-side retracted portion 175 has such a shape as to be recessed toward the vapor channel 150 on the side adjacent to the second main body surface 131*b*.

In such a case as well, the hooks 182*a*, 182*b*, or the like, of the suspending apparatus 180 can be engaged with the first main body surface-side retracted portion 174. Therefore, it is possible to easily lift the vapor chamber 101, so it is possible to make it easy to convey the vapor chamber 101. As a result, it is possible to improve the conveyability of the vapor chamber 101.

Since the first main body surface-side retracted edge 176 of the first main body surface-side retracted portion 174 is curved in a concave shape toward the vapor channel 150, it is possible to firmly support and lift the vapor chamber 101 with the hooks 182*a*, 182*b*, or the like, of the suspending apparatus 180. Therefore, it is possible to further improve the conveyability of the vapor chamber 101.

Even when the vapor chamber 101 is placed in an opposite orientation, that is, even when the second upper sheet surface 120*b* of the upper sheet 120 is placed so as to face the placement surface 179, it is possible to easily lift the vapor chamber 101 by bringing the hooks 182*a*, 182*b*, or the like, of the suspending apparatus 180 into contact with the second main body surface-side retracted edge 177 of the second main body surface-side retracted portion 175 and moving the hooks 182*a*, 182*b*, or the like, of the suspending apparatus 180 upward. Therefore, even when the vapor chamber 101 is placed in an opposite orientation, it is possible to easily convey the vapor chamber 101. As a result, it is possible to further improve the conveyability of the vapor chamber 101.

Sixth Modification of Third Embodiment

In the above-described third embodiment, an example in which the retracted portion 170 is retracted from the pair of long side edges 132*a*, 132*b* and the pair of short side edges 132*c*, 132*d* of the wick sheet 130 has been described (see FIG. 35). However, not limited to this configuration, the retracted portion 170 may be retracted from at least one of the pair of long side edges 132*a*, 132*b* of the wick sheet 130.

Figure 54:
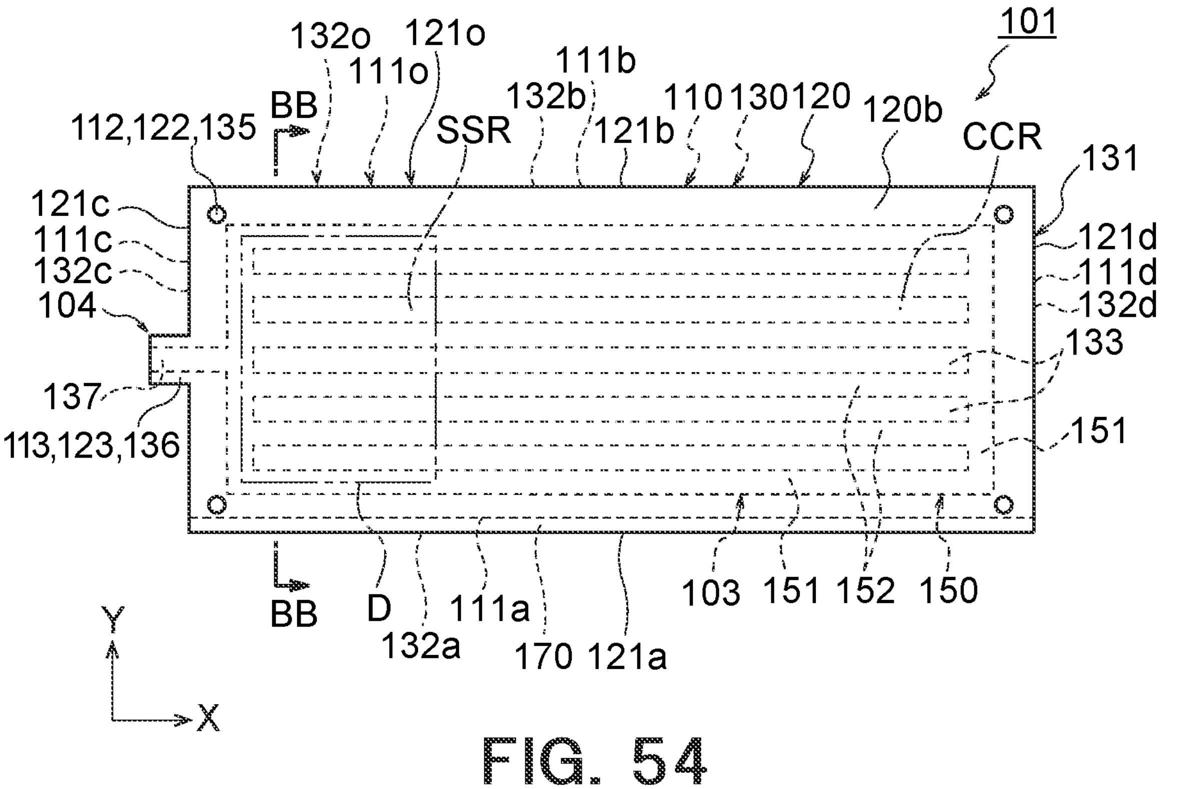
FIG. 54 is a modification (sixth modification) of FIG. 35.
Figure 55:
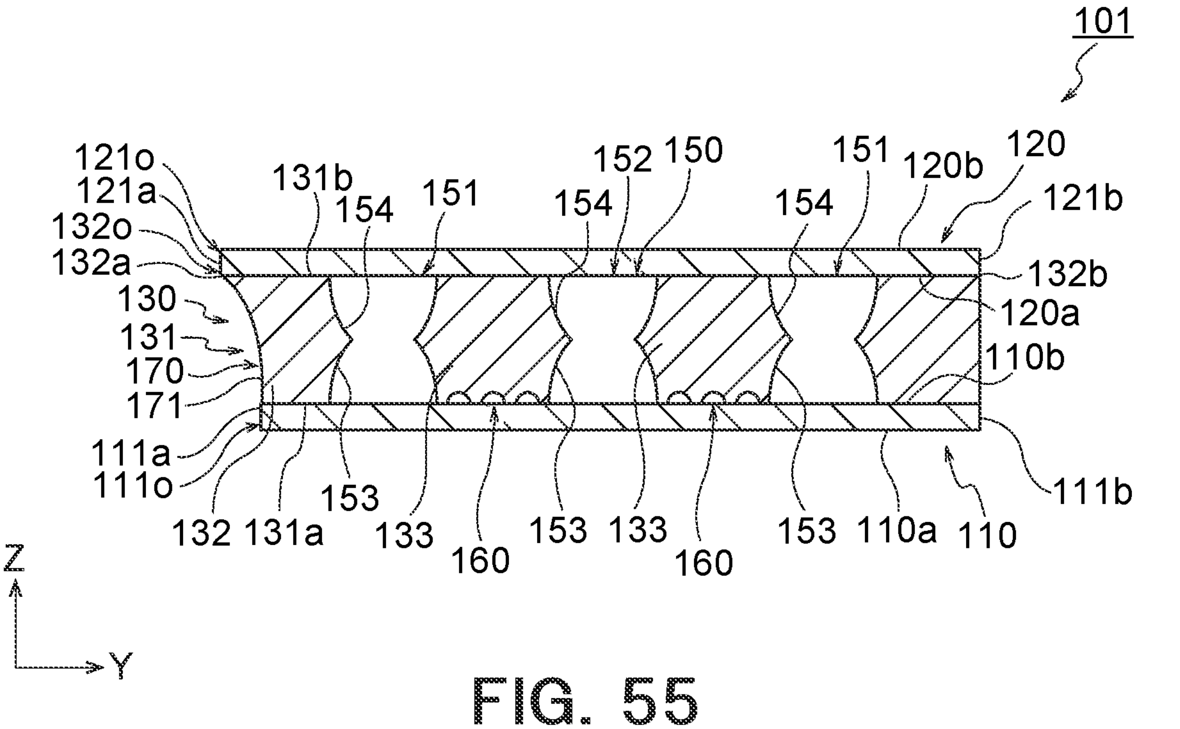
FIG. 55 is a sectional view taken along the line BB-BB of FIG. 54.

In the example shown in FIG. 54 and FIG. 55, the retracted portion 170 is retracted from the long side edge 132*a* (lower side in FIG. 54) of the wick sheet 130. In other words, the retracted portion 170 is provided at the side of the long side edge 132*a* of the wick sheet 130. On the other hand, the retracted portion 170 is not retracted from the long side edge 132*b* (upper side in FIG. 54), the short side edge 132*c*, or the short side edge 132*d* of the wick sheet 130.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

When the region in which the retracted portion 170 is provided is limited, it is possible to effectively use the region of the vapor chamber 101. In other words, it is possible to provide the vapor channel 150 and the liquid channel 160 in a further wide region of the wick sheet 130, so it is possible to improve the performance of the vapor chamber 101.

Seventh Modification of Third Embodiment

The retracted portion 170 may be retracted from one of the pair of long side edges 132*a*, 132*b* of the wick sheet 130, and may also be retracted from one of the pair of short side edges 132*c*, 132*d* of the wick sheet 130.

Figure 56:
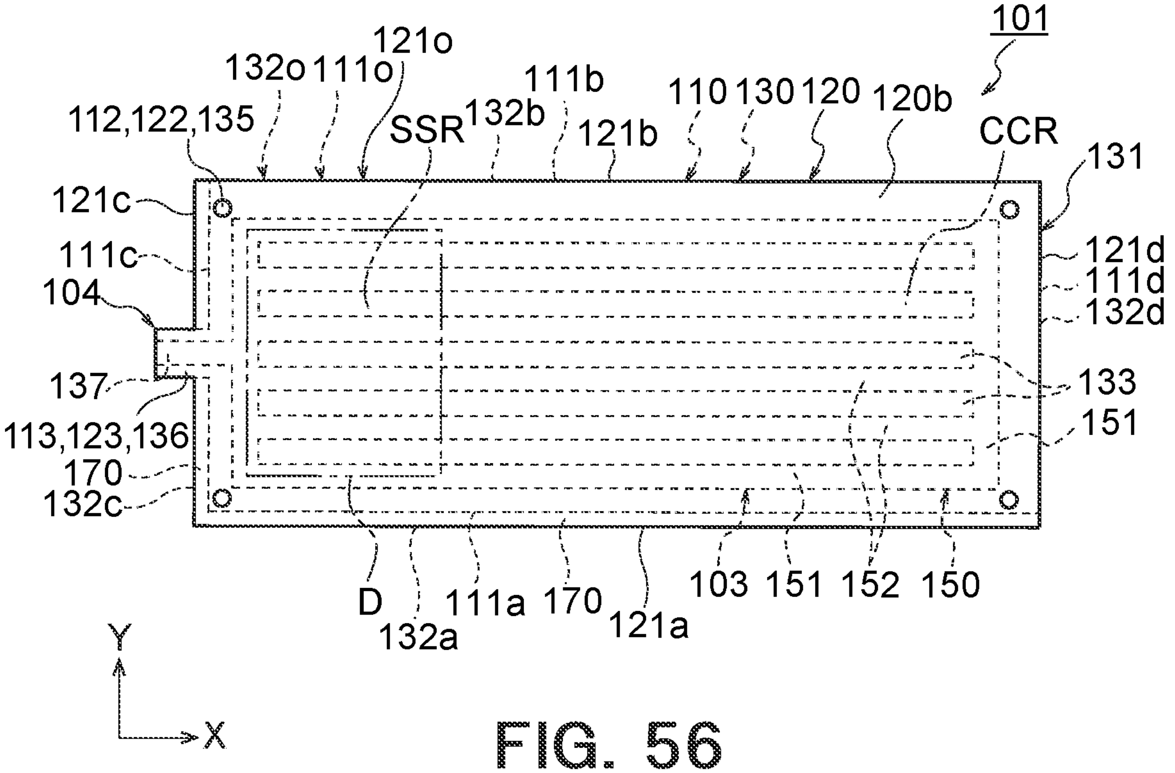
FIG. 56 is a modification (seventh modification) of FIG. 35.

In the example shown in FIG. 56, the retracted portion 170 is retracted from the long side edge 132*a* (lower side in FIG. 56) of the wick sheet 130 and is also retracted from the short side edge 132*c* (left side in FIG. 56) of the wick sheet 130. In other words, the retracted portion 170 is provided at the side of the long side edge 132*a* of the wick sheet 130, and the retracted portion 170 is also provided at the side of the short side edge 132*c* of the wick sheet 130. On the other hand, the retracted portion 170 is not retracted from the long side edge 132*b* (upper side in FIG. 56) or the short side edge 132*d* of the wick sheet 130.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

When the region in which the retracted portion 170 is provided is limited, it is possible to effectively use the region of the vapor chamber 101. In other words, it is possible to provide the vapor channel 150 and the liquid channel 160 in a further wide region of the wick sheet 130, so it is possible to improve the performance of the vapor chamber 101.

Furthermore, in the example shown in FIG. 56, the sides where the retracted portion 170 of the vapor chamber 101 is provided (the sides of the long side edge 132*a* and the short side edge 132*c*) can be lifted and conveyed, and the sides where the retracted portion 170 of the vapor chamber 101 is not provided (the sides of the long side edge 132*b* and the short side edge 132*d*) can be respectively pushed against predetermined wall surfaces. As a result, it is easy to align the vapor chamber 101 with respect to the wall surfaces. Therefore, when, for example, manufacturing information or the like is printed by applying laser beam to a predetermined position of the vapor chamber 101, it is possible to print the manufacturing information or the like at an accurate position. After the vapor chamber 101 is pushed against the wall surfaces as well, the vapor chamber 101 can be easily lifted from the sides where the retracted portion 170 is provided. Therefore, it is possible to improve the conveyability of the vapor chamber 101.

Eighth Modification of Third Embodiment

The retracted portion 170 may be retracted from parts of the pair of long side edges 132*a*, 132*b* of the wick sheet 130.

Figure 57:
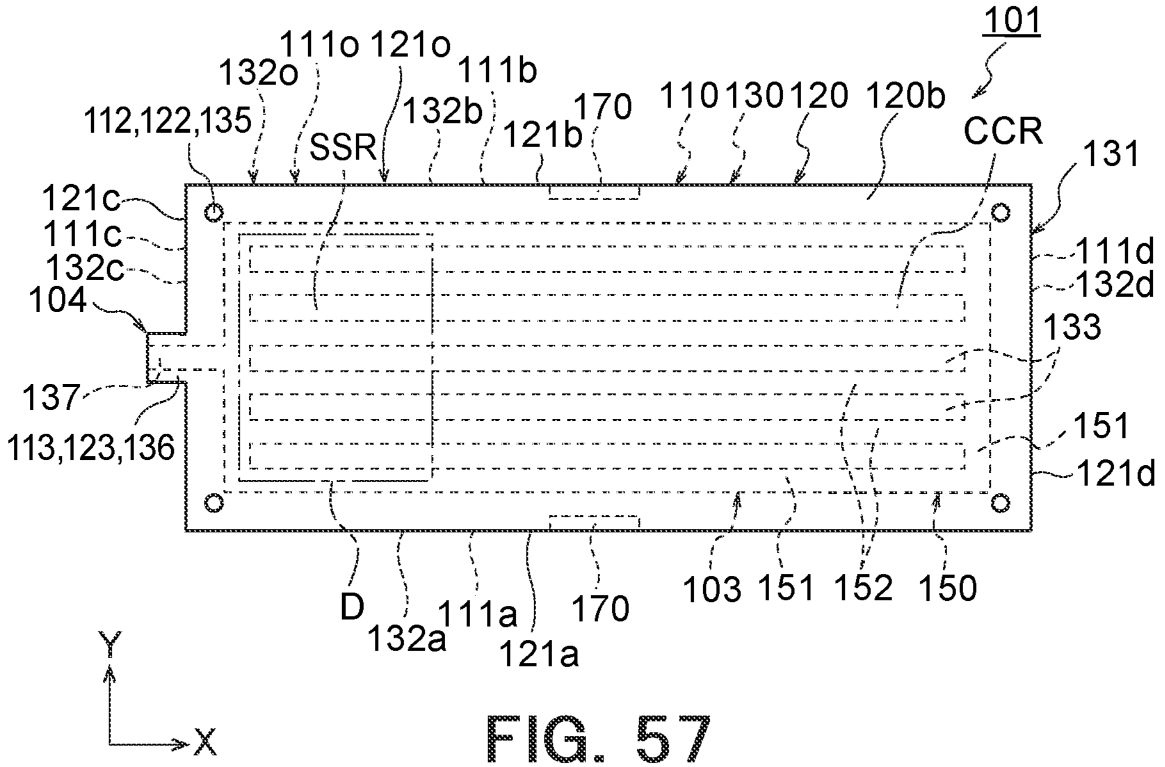
FIG. 57 is a modification (eighth modification) of FIG. 35.

In the example shown in FIG. 57, the retracted portion 170 is retracted from each of the pair of long side edges 132*a*, 132*b* of the wick sheet 130. In other words, the retracted portion 170 is provided at each of the sides of the long side edges 132*a*, 132*b* of the wick sheet 130. Each retracted portion 170 may be retracted from part of a corresponding one of the long side edges 132*a*, 132*b* of the wick sheet 130.

Each retracted portion 170 may be retracted from the center of each of the long side edges 132*a*, 132*b*. The retracted portions 170 may be disposed at positions symmetric with respect to the center of gravity of the vapor chamber 101 in a plan view.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

When the region in which the retracted portion 170 is provided is further limited, it is possible to further effectively use the region of the vapor chamber 101. In other words, it is possible to provide the vapor channel 150 and the liquid channel 160 in a further wide region of the wick sheet 130, so it is possible to further improve the performance of the vapor chamber 101.

When the retracted portions 170 are disposed at positions symmetric with respect to the center of gravity of the vapor chamber 101 in a plan view, it is possible to stabilize the attitude of the vapor chamber 101 at the time of suspending the vapor chamber 101 with the suspending apparatus 180 or the like. Therefore, it is possible to easily convey the vapor chamber 101.

Ninth Modification of Third Embodiment

In the above-described third embodiment, an example in which the vapor chamber 101 includes one wick sheet 130 has been described (see FIG. 36). However, not limited to this configuration, the vapor chamber 101 may include a plurality of the wick sheets 130.

The number of wick sheets 130 may be selectable. The wick sheets 130 may have the same shape and dimensions to each other or the wick sheets 130 may have different shapes and dimensions to each other. For example, the wick sheets 130 each may be formed with the same size in a plan view. For example, one of the wick sheets 130 may be formed so as to be entirely smaller than the other wick sheets 130 in a plan view.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

Tenth Modification of Third Embodiment

In the above-described third embodiment, an example in which the vapor chamber 101 is made up of the lower sheet 110, the upper sheet 120, and the wick sheet 130 has been described (see FIG. 36). However, not limited to this configuration, the vapor chamber 101 may be made up of the lower sheet 110 and the wick sheet 130.

Figure 58:
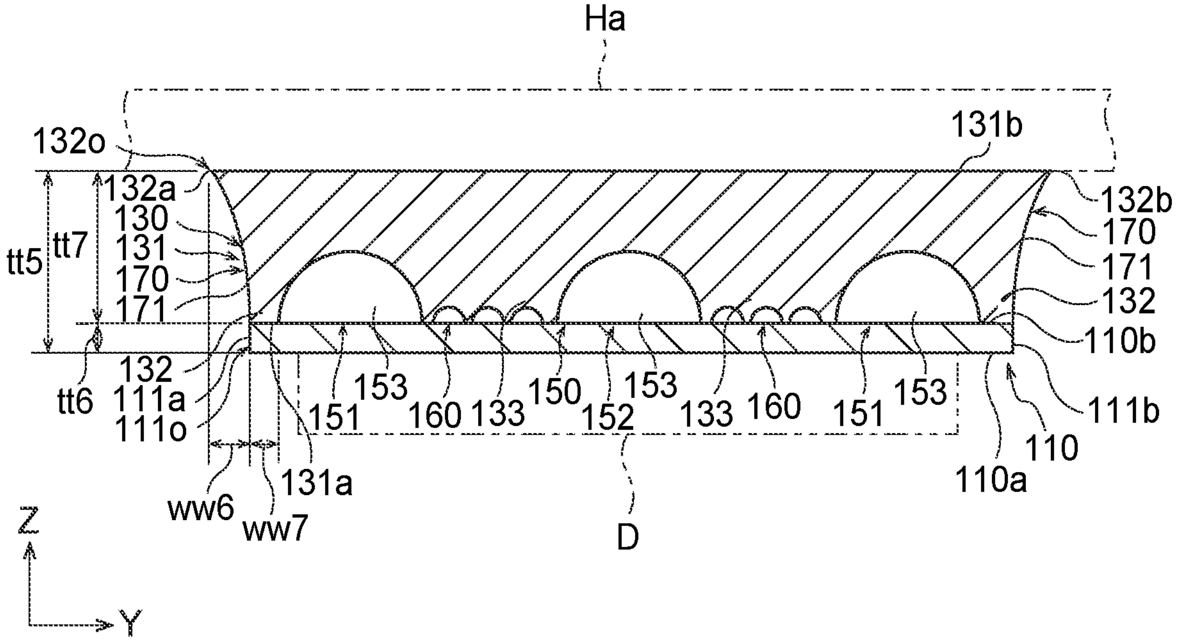
FIG. 58 is a modification (tenth modification) of FIG. 36.

In the example shown in FIG. 58, the vapor chamber 101 includes the lower sheet 110 and the wick sheet 130 and does not include the upper sheet 120. The housing member Ha may be attached to the second main body surface 131*b* of the wick sheet 130. Heat of the working vapor 2*a* is transferred from the wick sheet 130 to the housing member Ha.

In the example shown in FIG. 58, the vapor channel 150 is provided on the first main body surface 131*a*, but the vapor channel 150 does not extend to the second main body surface 131*b* or extend through the wick sheet 130. In other words, the first vapor passage 151 and the second vapor passages 152 of the vapor channel 150 are the lower vapor channel recesses 153, and the upper vapor channel recesses 154 are not provided in the wick sheet 130.

The thickness tt5 of the vapor chamber 101 shown in FIG. 58 may, for example, range from 100 μm to 1000 μm. The thickness tt6 of the lower sheet 110 shown in FIG. 58 may, for example, range from 6 μm to 200 μm. The thickness tt7 of the wick sheet 130 shown in FIG. 58 may, for example, range from 50 μm to 800 μm.

Not limited to the example shown in FIG. 58, the vapor channel 150 may be provided on the second lower sheet surface 110*b* of the lower sheet 110. In this case, the vapor channel 150 of the lower sheet 110 may be provided at a position facing the vapor channel 150 of the wick sheet 130. The liquid channel 160 may be provided on the second lower sheet surface 110*b* of the lower sheet 110.

In this way, the vapor chamber 101 may be made up of the lower sheet 110 and the wick sheet 130.

In such a case as well, the hooks 182*a*, 182*b*, or the like, of the suspending apparatus 180 can be engaged with the retracted portion 170 of the wick sheet 130. Therefore, it is possible to easily lift the vapor chamber 101, so it is possible to make it easy to convey the vapor chamber 101. As a result, it is possible to improve the conveyability of the vapor chamber 101.

According to the above-described embodiments, it is possible to improve the conveyability of a vapor chamber.

The present invention is not limited to the embodiments and the modifications, and component elements may be modified without departing from the purport of the present invention. Various inventions may be provided by appropriate combinations of the plurality of component elements described in the embodiments and the modifications. Some component elements may be deleted from all the component elements described in the embodiments and the modifications.

The invention claimed is:

1. A main body sheet for a vapor chamber in which a working fluid is filled, the main body sheet comprising:
- a first main body surface;
- a second main body surface provided on an opposite side to the first main body surface;
- a frame of the main body sheet;
- a space that is provided on the first main body surface and between the first and second main body surfaces, is provided inside the frame, and is filled with the working fluid, wherein:
  - a lower sheet is laminated on an opposite surface of the first main body surface,
  - an outermost edge of the lower sheet and an outermost edge of the first main body surface are positioned inward toward the space from an outermost edge of the main body sheet in a sectional view along a thickness direction, so as to form a retracted portion in an outer peripheral contour defined by the outermost edge of the lower sheet, the outermost edge of the first main body surface and the outermost edge of the main body sheet, such that the retracted portion is a portion retracted by the outermost edge of the lower sheet and the outermost edge of the first main body surface from the outermost edge of the main body sheet, and
- the retracted portion is positioned to not overlap with any space provided on the first main body surface and filled with the working fluid, along the thickness direction.

2. The main body sheet for a vapor chamber according to claim 1, wherein
- the retracted portion has a retracted edge, and
- the retracted edge is curved in a concave shape toward the space.

3. The main body sheet for a vapor chamber according to claim 1, wherein
- the retracted portion has a retracted edge, and
- the retracted edge is inclined with respect to the thickness direction.

4. The main body sheet for a vapor chamber according to claim 1, wherein
- the retracted portion has a retracted edge, and
- the retracted edge is curved in a convex shape toward an opposite side to the space.

5. The main body sheet for a vapor chamber according to claim 1, wherein
- the retracted portion has a retracted edge, and
- the retracted edge includes a first retracted edge extending from the first main body surface toward the second main body surface, a second retracted edge extending from
- the second main body surface toward the first main body surface, and a step connection edge connecting the first retracted edge with the second retracted edge.

6. The main body sheet for a vapor chamber according to claim 1, wherein
- the retracted portion includes a first main body surface-side retracted portion provided adjacent to the first main body surface and a second main body surface-side retracted portion provided adjacent to the second main body surface.

7. The main body sheet for a vapor chamber according to claim 1, wherein
- the outer peripheral contour has a pair of first side edges extending in a first direction and a pair of second side edges extending in a second direction orthogonal to the first direction in the plan view, and
- the retracted portion is retracted from each of the pair of first side edges and the pair of second side edges.

8. The main body sheet for a vapor chamber according to claim 7, wherein the retracted portion is retracted from a part of the pair of first side edges.

9. The main body sheet for a vapor chamber according to claim 1, wherein
- the outer peripheral contour has a pair of first side edges extending in a first direction and a pair of second side edges extending in a second direction orthogonal to the first direction in the plan view, and
- the retracted portion is retracted from at least one of the pair of first side edges.

10. The main body sheet for a vapor chamber according to claim 9, wherein the retracted portion is retracted from one of the pair of first side edges and is also retracted from one of the pair of second side edges.

11. The main body sheet for a vapor chamber according to claim 1, wherein
- the space includes every space that is provided on the first main body surface inside the frame and is filled with the working fluid; and
- an innermost edge of the retracted portion that is most retracted toward the space is on an outer side of an outermost edge of the space, so that the innermost edge of the retracted portion is closer to the outer peripheral contour than the outermost edge of the space is.

12. The main body sheet for a vapor chamber according to claim 1, wherein a part of the outermost edge of the main body sheet closer to the second main body surface than to the first main body surface is farther away from the space than another part of the outermost edge of the main body sheet closer to the first main body surface than to the second main body surface.

13. A vapor chamber comprising:
- the main body sheet for the vapor chamber according to claim 1; and
- the lower sheet laminated on the opposite surface of the first main body surface and covering the space.

14. The vapor chamber according to claim 13, further comprising an upper sheet laminated on an opposite surface of the second main body surface, wherein
- the space extends through from the first main body surface to the second main body surface, and the second sheet covers the space on the second main body surface.

15. An electronic apparatus comprising:

a housing;

a device accommodated in the housing; and the vapor chamber according to claim 13 in thermal contact with the device.

16. A vapor chamber in which a working fluid is filled, the vapor chamber comprising:

a main body sheet having a first main body surface and a second main body surface provided on an opposite side to the first main body surface;

a space that is provided on the first main body surface of the main body sheet and between the first and second main body surfaces, and is filled with the working fluid, wherein:

a lower sheet is laminated on an opposite surface of the first main body surface of the main body sheet and covering the space; and an outermost edge of the lower sheet and an outermost edge of the first main body surface are positioned inward toward the space from an outermost edge of the main body sheet in a sectional view along a thickness direction, so as to form a retracted portion in an outer peripheral contour defined by the outermost edge of the lower sheet, the outermost edge of the first main body surface and the outermost edge of the main body sheet, such that the retracted portion is a p of tion retracted by the outermost edge of the lower sheet and the outermost edge of the first main body surface from the outermost edge of the main body sheet, and wherein the retracted portion includes a main body sheet retracted portion provided in the main body sheet and retracted toward the space beyond the outermost edge of the lower sheet in the sectional view, and the retracted portion does not overlap with any space that is provided on the first main body surface and is filled with the working fluid, in the thickness direction.

17. The vapor chamber according to claim 16, wherein the main body sheet has a pair of first side edges extending in a first direction and a pair of second side edges extending in a second direction orthogonal to the first direction in a plan view, and the main body sheet retracted portion is provided at each of the pair of first side edges and the pair of second side edges.

18. The vapor chamber according to claim 16, wherein the main body sheet has a pair of first side edges extending in a first direction and a pair of second side edges extending in a second direction orthogonal to the first direction in a plan view, and the main body sheet retracted portion is provided at at least one of the pair of first side edges.

19. The vapor chamber according to claim 18, wherein the main body sheet retracted portion is provided at each of the pair of first side edges.

20. The vapor chamber according to claim 18, wherein the main body sheet retracted portion is provided at part of the first side edge.

21. The vapor chamber according to claim 18, wherein the main body sheet retracted portion is provided at one of the pair of first side edges and is provided at one of the pair of second side edges.

22. The vapor chamber according to claim 16, further comprising an upper sheet laminated on an opposite surface of the second main body surface of the main body sheet, wherein the space extends through from the first main body surface to the second main body surface, the upper sheet covers the space on the second main body surface, and the retracted portion includes a second retracted portion provided in the upper sheet and retracted toward the space beyond the outermost edge of the main body sheet in a plan view.

23. An electronic apparatus comprising:

a housing;

a device accommodated in the housing; and the vapor chamber according to claim 16 in thermal contact with the device.

* * * * *